(12) United States Patent
Motoyoshi

(10) Patent No.: US 12,327,742 B2
(45) Date of Patent: Jun. 10, 2025

(54) ALIGNMENT-ASSISTING TRAY, ALIGNMENT-CONTROL APPARATUS AND ALIGNMENT METHOD

(71) Applicant: TOHOKU-MICROTEC CO., LTD., Sendai (JP)

(72) Inventor: Makoto Motoyoshi, Sendai (JP)

(73) Assignee: TOHOKU-MICROTEC CO., LTD., Sendai (JP)

( * ) Notice: Subject to any disclaimer, the term of this patent is extended or adjusted under 35 U.S.C. 154(b) by 393 days.

(21) Appl. No.: 17/848,910

(22) Filed: Jun. 24, 2022

(65) Prior Publication Data
US 2022/0384225 A1 Dec. 1, 2022

Related U.S. Application Data

(63) Continuation of application No. PCT/JP2021/020322, filed on May 28, 2021.

(51) Int. Cl.
*H01L 21/673* (2006.01)
*H01L 21/68* (2006.01)

(52) U.S. Cl.
CPC ........ *H01L 21/67333* (2013.01); *H01L 21/68* (2013.01)

(58) Field of Classification Search
CPC ............... H01L 21/67333; H01L 21/68; H01L 2224/81; H01L 2224/95001; H01L 21/67144
See application file for complete search history.

(56) References Cited

U.S. PATENT DOCUMENTS

| 5,103,976 | A | 4/1992 | Murphy |
| 5,890,599 | A | 4/1999 | Murphy |
| 6,139,243 | A * | 10/2000 | Jackson ............ H01L 21/67333 414/811 |
| 6,527,998 | B1 | 3/2003 | McCann |
| 8,104,911 | B2 * | 1/2012 | Hillman ............ G02F 1/133608 362/555 |
| 2001/0011772 | A1 | 8/2001 | Fukasawa et al. |

(Continued)

FOREIGN PATENT DOCUMENTS

| JP | 04199900 A * | 7/1992 | ............. H01L 21/52 |
| JP | H04 199900 A | 7/1992 | |

(Continued)

OTHER PUBLICATIONS

Extended European Search Report mailed Feb. 5, 2024, in EP 21899281.6, 7 pgs.

(Continued)

*Primary Examiner* — Mohammed Shamsuzzaman
(74) *Attorney, Agent, or Firm* — Polsinelli PC

(57) ABSTRACT

An alignment-control apparatus encompasses an alignment-assisting tray for aligning a plurality of elements in a batch with highly minute-and-precise configuration, a first transferring unit for collectively transporting the plurality of elements to the alignment-assisting tray, a driving unit for reallocating a convex-ridge of each of the elements toward an concave-ridge assigned to each of the concave cells defined in the alignment-assisting tray, and a second transferring unit for picking up the plurality of elements from the alignment-assisting tray and collectively transporting the plurality of elements.

2 Claims, 21 Drawing Sheets

(56) References Cited

U.S. PATENT DOCUMENTS

2009/0023243 A1    1/2009    Koyanagi
2012/0291950 A1    11/2012    Sugiyama et al.

FOREIGN PATENT DOCUMENTS

| | | | |
|---|---|---|---|
| JP | H41992-199900 A | 8/1993 | |
| JP | H11-1992-251493 A | 9/1993 | |
| JP | 2011-138902 A | 7/2011 | |
| JP | 5007127 B2 | 8/2012 | |
| JP | 2015-038957 A | 2/2015 | |
| JP | 2019043697 A * | 3/2019 | ............ H01L 21/52 |
| JP | 2020-42247 A2 | 3/2020 | |
| JP | 2020042247 A * | 3/2020 | ............ H01L 21/68 |
| JP | 2020-514817 A | 5/2020 | |
| WO | 2015008870 A | 1/2015 | |
| WO | 2018170352 A1 | 9/2018 | |

OTHER PUBLICATIONS

Yifan Wu; Jianshe Ma; Ping Su; Lijun Zhang; and Bizhong Xia; "Full-Color Realization of Micro-LED Displays"; Nanomaterials 2020, 10, 2482; 33 pages.
English translation of Japanese Application No. JP-2020-042247A, 39 pages.
English translation of Japanese Application No. JP-5007127A, 39 pages.
English translation of Japanese Application No. JP-2020-514817A, 39 pages.
English translation of Japanese Application No. JP-2019-043697A, 39 pages.
English translation of Japanese Application No. JP-H4-1992-199900A, 39 pages.
English translation of Japanese Application No. JP-2011-138902A, 39 pages.
English translation of Japanese Application No. JP-H11-1992-251493A, 39 pages.
English translation of Japanese Application No. JP-2015-038957A, 39 pages.

* cited by examiner

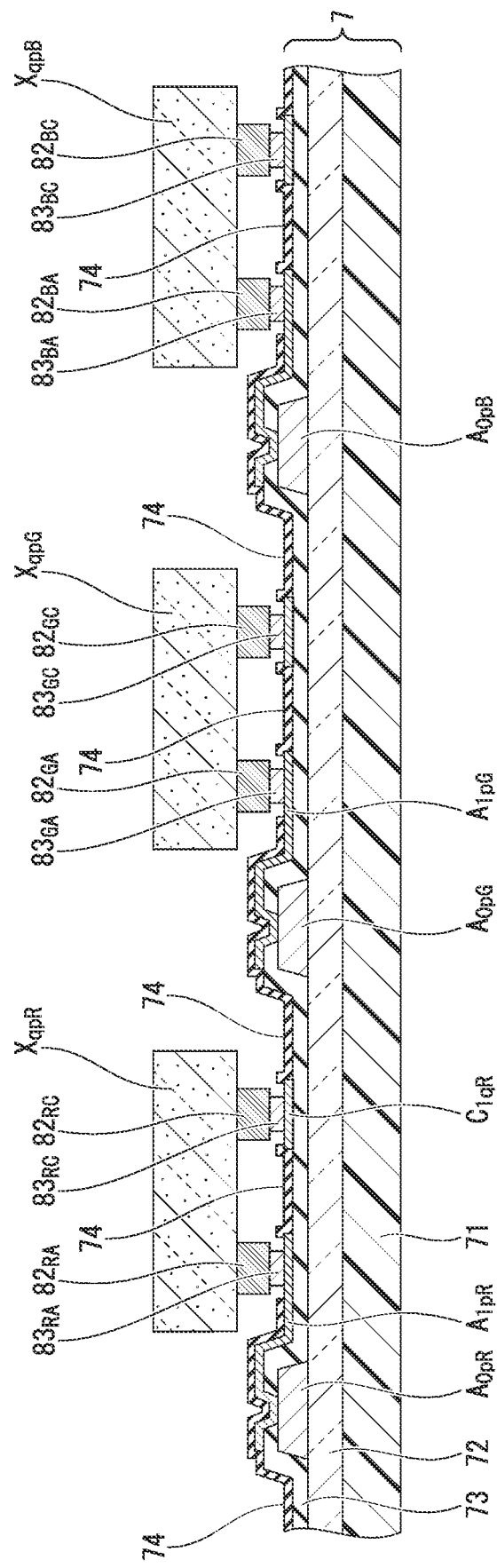

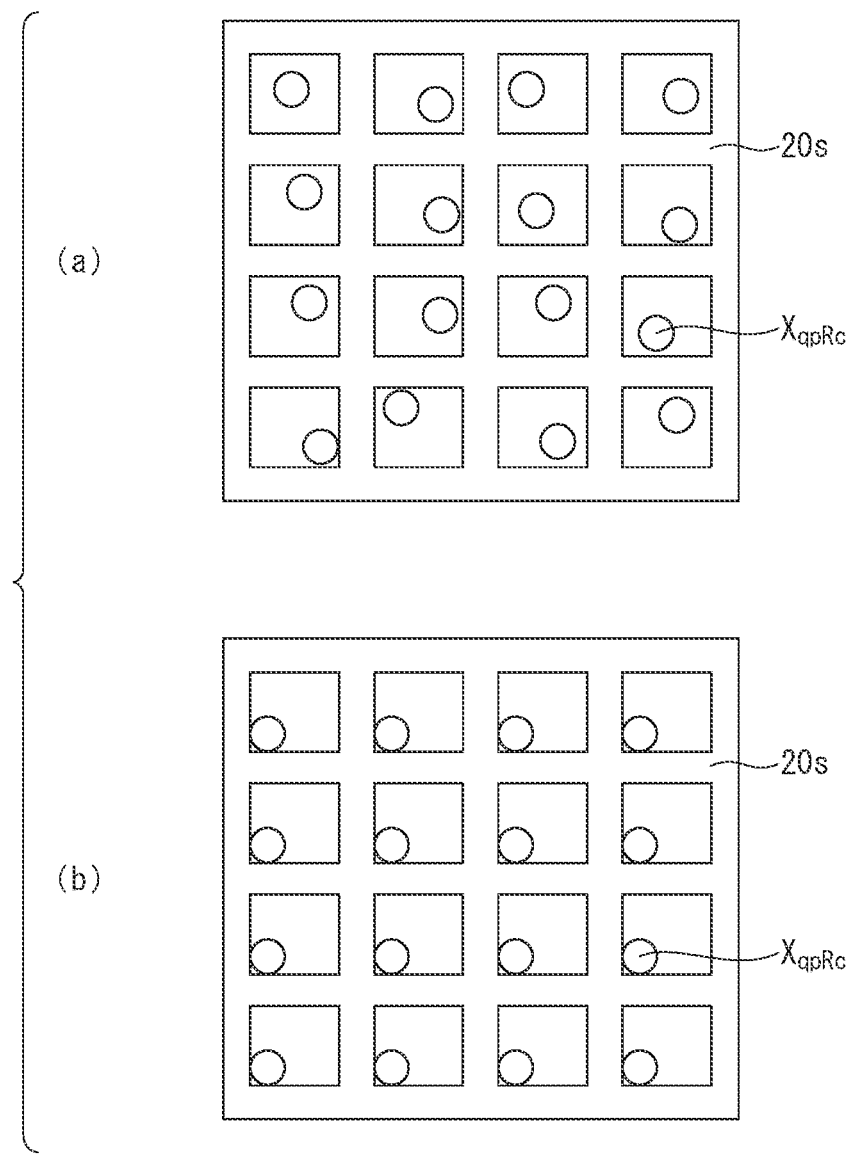

ions proposed such as a pick & place scheme, an elastomer-stamp transfer scheme, a method of combining convex concave cells in fluid, a method of using static electricity/magnetism, a selection lift-off scheme based on laser, a roll-to-roll transfer method of using a roller and other. However, real situation lies in a fact that neither of the above methods has yet achieved sufficient precision and throughput for practical use.

ALIGNMENT-ASSISTING TRAY, ALIGNMENT-CONTROL APPARATUS AND ALIGNMENT METHOD

CROSS-REFERENCE TO RELATED APPLICATION

This application is a continuation of copending International Application No. PCT/JP2021/20322, filed on May 28, 2021, which designated the United States, which is hereby incorporated by reference in entirety.

BACKGROUND

Field of the Disclosure

The present invention relates to an alignment-assisting tray, an alignment-control apparatus, and an alignment method of minute elements, in each of minute elements mainly has a side length or a baseline length of about 150 micrometers or less, and particularly relates to alignment-assisting trays, alignment-control apparatuses and alignment methods, which are used as highly minute-and-precise assembling technologies for mounting and assembling a great many minute elements with high precision.

Description of the Background

Minute elements, such as mini-LEDs, micro-LEDs, and the like, are attracting a great deal of attentions as next-generation displays suitable for applications, such as large display equipment used as outdoor display equipment and others, augmented reality (AR) glasses and display devices of portable telephones, due to the features of high brightness, high contrast and the like. For example, as recited in W. Yifan et al., "Full-Color Realization of Micro-LED Displays", Nano-materials, October 2020, Vol. 2482, p. 1 to 33, because micro-LED displays for portable telephones are self-light-emitting displays whose one pixel is implemented by triple LED chips of R (Red), G (Green) and B (Blue), in which one side length of the chips is about 50 micrometers or less, there is a merit that it is possible to achieve a display which has a faster response speed, a higher definition, a higher viewing angle and a lower electric power consumption, by driving each of the pixels, as compared with a conventional liquid crystal display.

Here, since the LED chips of R, G and B are made of semiconductor materials differing from each other, it is difficult to monolithically integrate the LED elements of R, G and B. Thus, when the LED chips of R, G and B are individually manufactured and used for the pixels and the display is constructed, the pixels are required to be integrated in hybrid integration scheme on a mounting board. A problem when the hybrid integration scheme is performed lies in the establishment of the technology/device for mounting many microelement chips each of which is, for example, about several tens of micrometers or less, with high precision. The highly minute-and-precise assembling technologies referred as "the mass-transfer technology", recited in JP 5007127B and JP 2020-514817A, for example, may be considered as most close schemes to the practical technology for transferring the large number of above minute elements. The mass-transfer technology is directed to a batch flip chip (FC) bonding of the great many minute elements. However, so far, as the highly minute-and-precise assembling technology, various methods have been proposed such as a pick & place scheme, an elastomer-stamp transfer scheme, a method of combining convex concave cells in fluid, a method of using static electricity/magnetism, a selection lift-off scheme based on laser, a roll-to-roll transfer method of using a roller and other. However, real situation lies in a fact that neither of the above methods has yet achieved sufficient precision and throughput for practical use.

For example, when a case is assumed in which a great many minute elements, one side length of each of the minute elements is about 15 micrometers, are transported in target backplane, ±1.5 micrometers or less is required for alignment margin of respective minute elements, under a condition that each of the minute elements has an electrode width of three micrometers. However, the nominal technical requirement specification for the alignment margin of the conventional transferring apparatus (pick & place scheme) is far below the above requirement, for example, a precision is within in a range of about 35 micrometers at a throughput of 20,000 chips/hour. On the other hand, under a circumstance in which the number of pixels in a liquid crystal display is increased and a larger screen is progressed, the improvements of yield and throughput must be achieved. Thus, it is desired to develop the highly minute-and-precise assembling technology for massively transferring a great many minute elements with high precision, without dropping the fabrication yield and the throughput.

SUMMARY

A "minute element" in the present invention means a specific element, which represent a particular function, having a so minute size that it is difficult to collectively mount simultaneously many elements. For example, a semiconductor chip having a dimension in which a diagonal length of the semiconductor chip is 150 micrometers or less shall correspond to the "minute element". However, 150 micrometers is merely an example, and the chip size is not limited to 150 micrometers or less. The present invention is intended to solve the above problem. Thus, an objective of the present invention is to provide an alignment-assisting tray, an alignment-control apparatus and an alignment method, as a highly minute-and-precise assembling technology wherein in a case that a plurality of minute elements are collectively mounted simultaneously, it is possible to perform positional alignment with high precision, under simple configuration of apparatus, or execute collective alignment that is excellent in two-dimensional pitch precision and high in spatial definition, without dropping yield and the throughput.

A first aspect of the present invention inheres in an alignment-assisting tray encompassing a plurality of concave cells for storing a plurality of elements, respectively and individually. In the alignment-assisting tray pertaining to the first aspect of the present invention, the concave cells are arrayed in accordance with a layout of locations where the plurality of elements are scheduled to be mounted on a mounting board, respectively, and a space is provided in each of the concave cells for installing each of the elements, such that each of the elements is surrounded by quadruple sidewall-planes of each of the concave cells, each of quadruple sidewall-planes faces to a side surface of the element. Furthermore, in the alignment-assisting tray pertaining to the first aspect of the present invention, each of the diagonal lengths of the concave cells viewed on a planar pattern is longer by 50 percent or more than 50 percent of a diagonal length of each of the elements in a corresponding direction of the diagonal lengths of the concave cells, and sidewall-planes adjacent to each other are orthogonal to each other.

A second aspect of the present invention inheres in an alignment-assisting tray encompassing a plurality of concave cells for storing a plurality of elements, respectively and individually. In the alignment-assisting tray pertaining to the second aspect of the present invention, the concave cells are arrayed in accordance with a layout of locations where the plurality of elements are scheduled to be mounted on a mounting board, respectively, each of the elements includes an electrode provided on a bottom surface of each of the elements, the electrode has quadruple side planes implementing convex-ridges by the side planes adjacent to each other, and the side planes implementing each of the convex-ridges mutually intersect at a right angle, and each of the concave cells has an inner volume larger than an outer volume of each of the element, such that each of the concave cells can store an entire volume of each of the element. Furthermore, in the alignment-assisting tray pertaining to the second aspect of the present invention, a recess is cut at a bottom of each of the concave cells, the recess has inner-walls implementing a concave-ridge, configured to be interfaced with one of the convex-ridges of the electrode in each of the elements, and a distance between one of sidewall-planes and the recess is larger than a distance between a side surface of each of the elements and the electrode.

A third aspect of the present invention inheres in an alignment-control apparatus, encompassing (a) an alignment-assisting tray including a plurality of concave cells for storing a plurality of elements, respectively and individually, the concave cells are arrayed in accordance with a layout of locations where the plurality of elements are scheduled to be mounted on a mounting board, respectively, (b) a first transferring unit for collectively transporting the plurality of elements to the concave cells of the alignment-assisting tray, (c) a driving unit for driving a motion of the alignment-assisting tray in such a way that a force for reallocating a moving ridge-to-be-mated of each of the elements toward an interfacing ridge assigned to each of the concave cells, and (d) a second transferring unit for picking up the plurality of elements from the alignment-assisting tray and collectively transporting the plurality of elements to an external of the alignment-assisting tray. In the alignment-control apparatus pertaining to the third aspect of the present invention, the interfacing ridge is elected from quadruple convex-ridges implemented by sidewall-planes of each of the concave cells, and the moving ridge-to-be-mated is a convex-ridge selected from quadruple convex-ridges, each of quadruple convex-ridges is created by adjacent side planes defining a solid shape of each of the elements, as a closest convex-ridge to the interfacing ridge, and each of the diagonal lengths of the concave cell viewed on a planar pattern is longer by 50 percent or more than 50 percent of each of the diagonal lengths of each of the element in a corresponding direction.

A fourth aspect of the present invention inheres in an alignment method including (p) collectively transporting a plurality of elements, which is roughly-arrayed, to an upper portion of an alignment-assisting tray, in which a plurality of concave cells for storing the plurality of elements, respectively and individually, the concave cells are arrayed in accordance with a layout of locations where the plurality of elements are scheduled to be mounted on a mounting board, respectively, (q) collectively storing the plurality of elements in each of the concave cells, (r) reallocating a moving ridge-to-be-mated of each of the element toward an interfacing ridge assigned to each of the concave cells, and (s) picking up the plurality of elements from the alignment-assisting tray and collectively transporting the plurality of elements to an external of the alignment-assisting tray. In the alignment method pertaining to the fourth aspect of the present invention, the interfacing ridge is elected from quadruple convex-ridges implemented by sidewall-planes of each of the concave cells, and the moving ridge-to-be-mated is a convex-ridge selected from quadruple convex-ridges, each of quadruple convex-ridges is created by adjacent side planes defining a solid shape of each of the elements, as a closest convex-ridge to the interfacing ridge.

BRIEF DESCRIPTION OF THE DRAWINGS

FIG. 1C is a cross-sectional view schematically explaining a rough sketch of a configuration of the pixel illustrated in FIG. 1B;

FIG. 5N(b) is a cross-sectional view taken along Y-Y line in FIG. 3A, representing a configuration of the rectangular minute elements being interfaced with one of the corners in each of the concave cells through the operations in FIGS. 5K to 5M;

FIG. 13 is a simplified schematic view explaining a highly minute-and-precise assembling technology in which many circular LEDs illustrated in FIG. 12 are collectively mounted simultaneously with a highly minute-and-precise configuration.

DETAILED DESCRIPTION

Figure 1A:
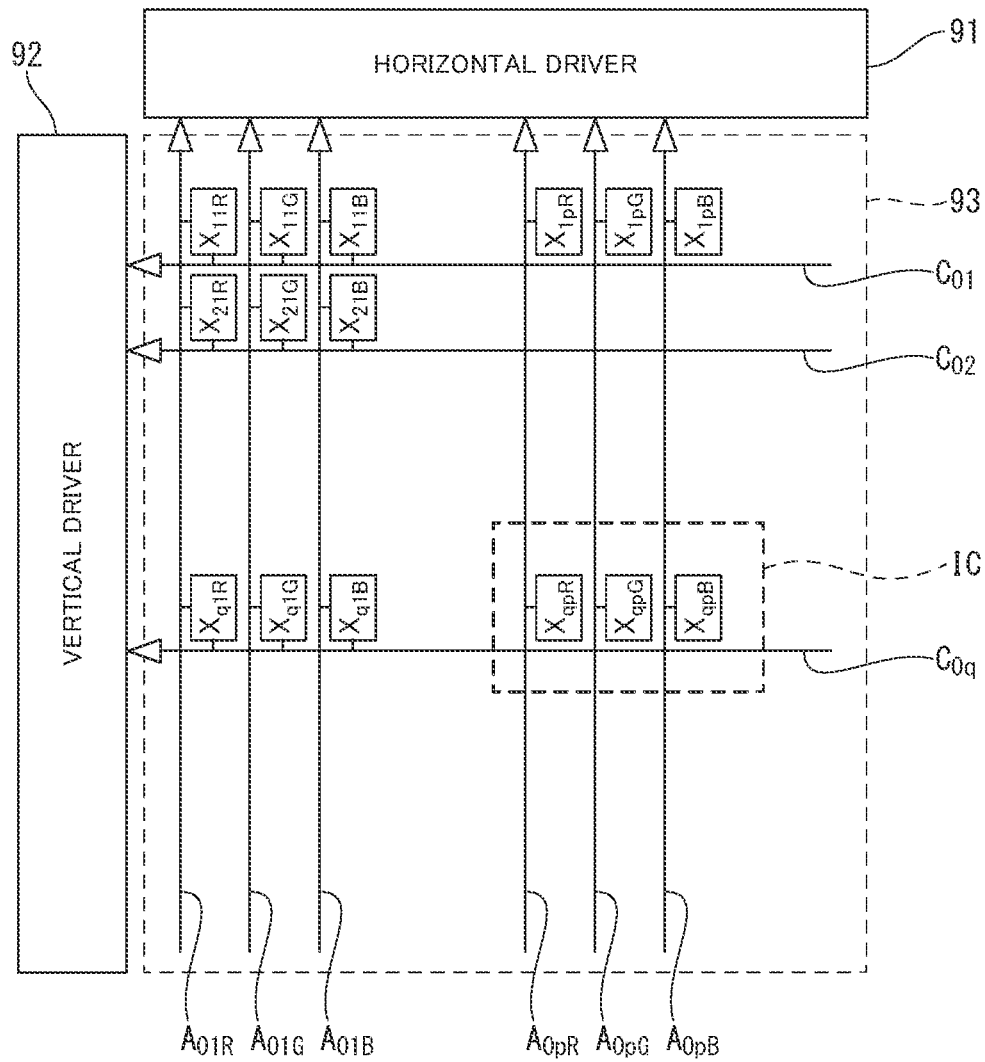
FIG. 1A is a plan view explaining a rough sketch of a pixel-array area and peripheral circuits of an LED display as one example of an applicable target of an alignment-assisting tray, an alignment-control apparatus and an alignment method pertaining to first to fourth embodiments of the present invention.

Hereinafter, first to fourth second embodiments of the present invention will be described with reference to the drawings. In the explanations of the first, third and fourth embodiments, the term of "a rectangular element" is mainly used, and in the explanations of the second embodiment and other embodiments, the terms of "an element" and "a non-rectangular element" are used. However, these terms are merely a classification for the explanatory convenience, in order to clarify the subject matters of the respective embodiments. The inclusive expression as a generic concept including the whole of "the rectangular element" and "the non-rectangular element" is "the element". The term of "the element" corresponds to "the minute element" described at the beginning of the present Specification. In the description of the drawings, the identical or similar parts are denoted by the identical or similar reference numerals, and redundant descriptions thereof will be omitted. However, the drawings are schematic, and the relation between the thickness and the plane dimensions, the ratio of the thickness of each layer, etc., may be different from the actual one. In addition, dimensional relations and ratios may also differ between the drawings. Further, the first to fourth embodiments illustrated below exemplify the apparatus and methods for embodying the technical idea of the present invention, and the technical idea of the present invention does not specify the material, shape, structure, arrangement, or the like of the components as follows.

Further, the definition of the orientation such as "upper", "lower", and the like, in the following description is merely a definition of the direction for convenience of explanation, and is not intended to limit the technical scope of the present invention. For example, the upper and lower are converted to right and left if observed by rotating the object by 90°, and the upper and lower are inverted if observed by rotating 180°, of course.

Led Display

Prior to the explanations of alignment-assisting trays, alignment-control apparatuses and alignment methods pertaining to the first to fourth embodiments of the present invention, a brief epitome of a LED display manufactured by a highly minute-and-precise assembling technology—mass-transfer technology—using the alignment-assisting trays, the alignment-control apparatuses, and the alignment methods of the first to fourth embodiments will be explained, by referring to FIGS. 1A to 1D. In addition, the LED display illustrated in FIGS. 1A to 1D is merely an example for the sake of easily understanding the technical ideas about the alignment-assisting trays, the alignment-control apparatuses, and the alignment methods of the first to fourth embodiments. Thus, the applicable technical scopes of the alignment-assisting trays, the alignment-control apparatuses, and the alignment methods of the first to fourth embodiments is not limited to the LED display illustrated in FIGS. 1A to 1D. Each of the LED displays pertaining to the first to fourth embodiments is the self-light-emitting display in which one pixel is implemented by triple chips of a red LED chip $X_{qpR}$, a green LED chip $X_{qpG}$ and a blue LED chip $X_{qpB}$, wherein one side length of each of the triple chips is about 30 micrometers or less, as illustrated in FIG. 1B. Instead of the triple chips, a black chip may be added, thereby forming one pixel implemented by quadruple chips.

Figure 1B:
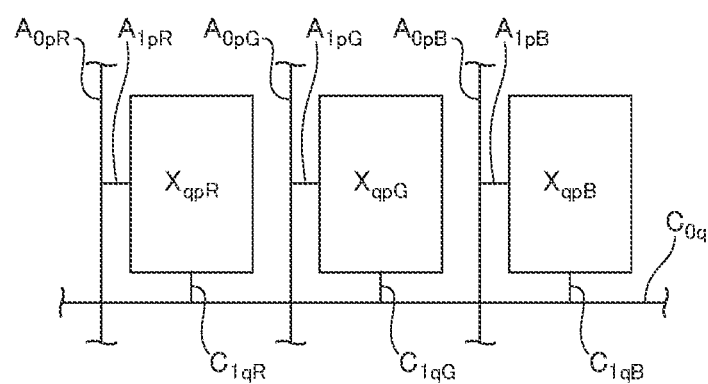
FIG. 1B is a block diagram explaining a structure of one pixel in the pixel-array area, which shall be allocated in the pixel-array area of the LED display illustrated in FIG. 1A.

For the LED displays of the first to fourth embodiments, as illustrated in FIG. 1A, the LED display is exemplified which has a pixel-array area ($X_{11R}$, $X_{11G}$, $X_{11B}$ to $X_{1pR}$, $X_{1pG}$, $X_{1pB}$; $X_{21R}$, $X_{21G}$, $X_{21B}$ to $X_{2pR}$, $X_{2pG}$, $X_{2pB}$; - - - ; $X_{q1R}$, $X_{q1G}$, $X_{q1B}$ to $X_{qpR}$, $X_{qpG}$, $X_{qpB}$) and a peripheral circuit area (91 and 92). As illustrated in FIG. 1A, the pixel-array area ($X_{11R}$, $X_{11G}$, $X_{11B}$ to $X_{1pR}$, $X_{1pG}$, $X_{1pB}$; $X_{21R}$, $X_{21G}$, $X_{21B}$ to $X_{2pR}$, $X_{2pG}$, $X_{2pB}$; - - - ; $X_{q1R}$, $X_{q1G}$, $X_{q1B}$ to $X_{qpR}$, $X_{qpG}$, $X_{qpB}$) is constructed so that the red LED chips $X_{qpR}$, the green LED chips $X_{qpG}$ and the blue LED chips $X_{qpB}$ are arrayed on a mounting board 7 illustrated in FIGS. 1C and 1D, with a positional alignment margin as one micrometer or less.

That is, according to the LED displays of the first to fourth embodiments, a large number of 10,000 to 20,000 or more pixels ($X_{qpR}$, $X_{qpG}$ and $X_{qpB}$) (p=1 to m, q=1 to n; each of m and n are positive integers of two or more) are arrayed in a shape of two-dimensional matrix, in the pixel-array area ($X_{11R}$, $X_{11G}$, $X_{11B}$ to $X_{1pR}$, $X_{1pG}$, $X_{1pB}$; $X_{21R}$, $X_{21G}$, $X_{21B}$ to $X_{2pR}$, $X_{2pG}$, $X_{2pB}$; - - - ; $X_{q1R}$, $X_{q1G}$, $X_{q1B}$ to $X_{qpR}$, $X_{qpG}$, $X_{qpB}$), and a rectangular display area 93 is constructed. However, since the matrix illustrated in FIG. 1A is merely an example, row and column directions may be swapped. The alignment-assisting trays, the alignment-control apparatuses, and the alignment methods, which will be explained in the first to fourth embodiments, are necessary architectures as the highly minute-and-precise assembling technology. The highly minute-and-precise assembling technology will be employed for assembling required 10,000 to 20,000 pieces, or more than 20,000 pieces of red LED chips $X_{qpR}$, green LED chips $X_{qpG}$ and blue LED chips $X_{qpB}$ on the mounting board 7, configured to establish the LED display. In FIG. 1A, one pixel is built by a red LED chip $X_{qpR}$, a green LED chip $X_{qpG}$, and a blue LED chip $X_{qpB}$, which are arrayed in the row direction. However, FIG. 1A is merely an example. For example, one pixel may be implemented by triple chips arrayed in the column direction, and each of the triple chips may be arranged at each of the vertices of a triangle, respectively.

And, on an upper side portion of the pixel-array area ($X_{11R}$, $X_{11G}$, $X_{11B}$ to $X_{1pR}$, $X_{1pG}$, $X_{1pB}$; $X_{21R}$, $X_{21G}$, $X_{21B}$ to $X_{2pR}$, $X_{2pG}$, $X_{2pB}$; - - - ; $X_{q1R}$, $X_{q1G}$, $X_{q1B}$ to $X_{qpR}$, $X_{qpG}$, $X_{qpB}$), a horizontal driver 91 is provided along directions of pixel rows $X_{11R}$, $X_{11G}$, $X_{11B}$ to $X_{1pR}$, $X_{1pG}$, $X_{1pB}$; $X_{21R}$, $X_{21G}$, $X_{21B}$ to $X_{2pR}$, $X_{2pG}$, $X_{2pB}$; - - - ; $X_{q1R}$, $X_{q1G}$, $X_{q1B}$ to $X_{qpR}$, $X_{qpG}$, $X_{qpB}$. On the other hand, on a left side portion of the pixel-array area, a vertical driver 92 is provided along directions of pixel columns $X_{11R}$, $X_{21R}$ to $X_{q1R}$; $X_{11G}$, $X_{21G}$ to $X_{q1G}$; $X_{11B}$, $X_{21B}$ to $X_{q1B}$; - - - ; $X_{1pR}$ to $X_{qpR}$; $X_{1pG}$ to $X_{qpG}$; $X_{1pB}$ to $X_{qpB}$.

From the horizontal driver 91, as illustrated in FIG. 1A, a red column signal-line $A_{01R}$ is deployed along the pixel columns $X_{11R}$, $X_{21R}$ to $X_{q1R}$, a green column signal-line $A_{01G}$ is deployed along the pixel columns $X_{11G}$, $X_{21G}$ to $X_{q1G}$, and a blue column signal-line $A_{01B}$ is deployed along the pixel columns $X_{11B}$, $X_{21B}$ to $X_{q1B}$. Moreover, from the horizontal driver 91, a red column signal-line $A_{0pR}$ is deployed along the pixel columns $X_{1pR}$ to $X_{qpR}$, a green column signal-line $A_{0pG}$ is deployed along the pixel columns $X_{1pG}$ to $X_{qpG}$, and a blue column signal-line $A_{0pB}$ is deployed along the pixel columns $X_{1pB}$ to $X_{qpB}$. On the other hand, from the vertical driver 92, as illustrated in FIG. 1A, a row signal-line $C_{01}$ is deployed along the pixel rows $X_{11R}$, $X_{11G}$, $X_{11B}$ to $X_{1pR}$, $X_{1pG}$, $X_{1pB}$, and a row signal-line $C_{02}$ is deployed along the pixel rows $X_{21R}$, $X_{21G}$, $X_{21B}$ to $X_{2pR}$, $X_{2pG}$, $X_{2pB}$. Moreover, from the vertical driver 92, a row signal-line $C_{0q}$ is deployed along the pixel rows $X_{q1R}$, $X_{q1G}$, $X_{q1B}$ to $X_{qpR}$, $X_{qpG}$, $X_{qpB}$.

The horizontal driver 91 and the vertical driver 92 sequentially scan driving voltages of the pixels ($X_{qpR}$, $X_{qpG}$ and $X_{qpB}$) within the pixel-array area, and light emission intensities of the respective red LED chips $X_{qpR}$, green LED chips $X_{qpG}$ and blue LED chips $X_{qpB}$ in the respective pixels ($X_{qpR}$, $X_{qpG}$ and $X_{qpB}$) are controlled. As illustrated in FIG. 1B, to a red column signal-line $A_{0pR}$ delivered from the horizontal driver 91, a red minute element $X_{qpR}$ is connected through an intermediate column wiring $A_{1pR}$. Also, to a green column signal-line $A_{0pG}$ delivered from the horizontal driver 91, a green minute element $X_{qpG}$ is connected through an intermediate column wiring $A_{1pG}$. Moreover, to a blue column signal-line $A_{0pB}$ delivered from the horizontal driver 91, a blue minute element $X_{qpB}$ is connected through an intermediate column wiring $A_{1pB}$.

On the other hand, to a row signal-line $C_{0q}$ delivered from the vertical driver 92, a red minute element $X_{qpR}$ is connected through an intermediate row wiring $A_{1qR}$. Moreover, to the row signal-line $C_{0q}$, a green minute element $X_{qpG}$ is connected through an intermediate row wiring $C_{1qG}$, and a blue minute element $X_{qpB}$ is connected through an intermediate row wiring $C_{1qB}$. In FIGS. 1A and 1B, positive voltages for driving the red LED chips $X_{qpR}$, the green LED chips $X_{qpG}$ and the blue LED chips $X_{qpB}$ are supplied to each of a red column signal-line $A_{0pR}$, a green column signal-line $A_{0pG}$ and a blue column signal-line $A_{0pB}$. On the other hand, a case is exemplified in which to the row signal-line $C_{0q}$, a cathode voltage for driving the red LED chips $X_{qpR}$, the green LED chips $X_{qpG}$ and the blue LED chips $X_{qpB}$ is supplied. However, a case is allowed in which a cathode voltage for driving the minute elements $X_{qpR}$, $X_{qpG}$ and $X_{qpB}$ is supplied to each of the red column signal-line $A_{0pR}$, the green column signal-line $A_{0pG}$ and the blue column signal-line $A_{0pB}$, and positive voltages for driving the minute elements $X_{qpR}$, $X_{qpG}$ and $X_{qpB}$ are supplied to the row signal-line $C_{0q}$ (hereinafter, the red LED chips $X_{qpR}$, the green LED chips $X_{qpG}$ and the blue LED chips $X_{qpB}$ are abbreviated as "the minute elements $X_{qpR}$, $X_{qpG}$ and $X_{qpB}$").

That is, the LED displays of the first to fourth embodiments are constructed in such a way that the cathode voltage is supplied from the row signal-lines $C_{01}$, $C_{02}$, - - -, $C_{0q}$, to each of the respective pixel rows $X_{11R}$, $X_{11G}$, $X_{11B}$ to $X_{1pR}$, $X_{1pG}$, $X_{1pB}$; $X_{21R}$, $X_{21G}$, $X_{21B}$ to $X_{2pR}$, $X_{2pG}$, $X_{2pB}$; - - -; $X_{q1R}$, $X_{q1G}$, $X_{q1B}$ to $X_{qpR}$, $X_{qpG}$, $X_{qpB}$, and the positive voltages are supplied from the column signal-lines $A_{01R}$, $A_{01G}$, $A_{01B}$, - - -, $A_{0pR}$, $A_{0pG}$, $A_{0pB}$, to each of the respective pixel columns $X_{11R}$, $X_{21R}$ to $X_{q1R}$; $X_{11G}$, $X_{21G}$ to $X_{q1G}$; $X_{11B}$, $X_{21B}$ to $X_{q1B}$; - - -; $X_{1pR}$ to $X_{qpR}$; $X_{1pG}$ to $X_{qpG}$, $X_{1pB}$ to $X_{qpB}$, and accordingly, multi-valued voltages of sixteen gradation-levels are individually supplied to each of the respective pixels ($X_{qpR}$, $X_{qpG}$ and $X_{qpB}$), and accordingly, it is possible to control the light-emission intensity.

FIG. 1C is a schematic cross-sectional view explaining the rough sketch of the assembled structure of the LED display pertaining to the first to fourth embodiments, focusing to the pixel ($X_{qpR}$, $X_{qpG}$ and $X_{qpB}$) illustrated in FIG. 1B. However, care should be paid to a fact that FIG. 1C is merely an example. The main members of the mounting board 7 are composed of a base substrate 71, an under-coat layer 72 laminated on the base substrate 71, an interlayer insulating film 73 laminated on the under-coat layer 72 and a passivation film 74 laminated on the interlayer insulating film 73. For the base substrate 71, it is possible to employ, for example, quartz, non-alkali glass, and resin such as polyimide. For the under-coat layer 72, the interlayer insulating film 73 and the passivation film 74, it is possible to preferably use the thin film of insulator (dielectric) of silicon oxide film ($SiO_2$ film). In addition, for the passivation film 74, it is available to use the resin film of polyimide. As illustrated in FIG. 1C, the red column signal-line $A_{0pR}$, the green column signal-line $A_{0pG}$ and the blue column signal-line $A_{0p}$ run along a vertical direction to a paper surface, at an equal interval on the under-coat layer 72. The interlayer insulating film 73 is laminated on the under-coat layer 72 to coat the red column signal-line $A_{0pR}$, the green column signal-line $A_{0pG}$ and the blue column signal-line $A_{0p}$.

Figure 1D:
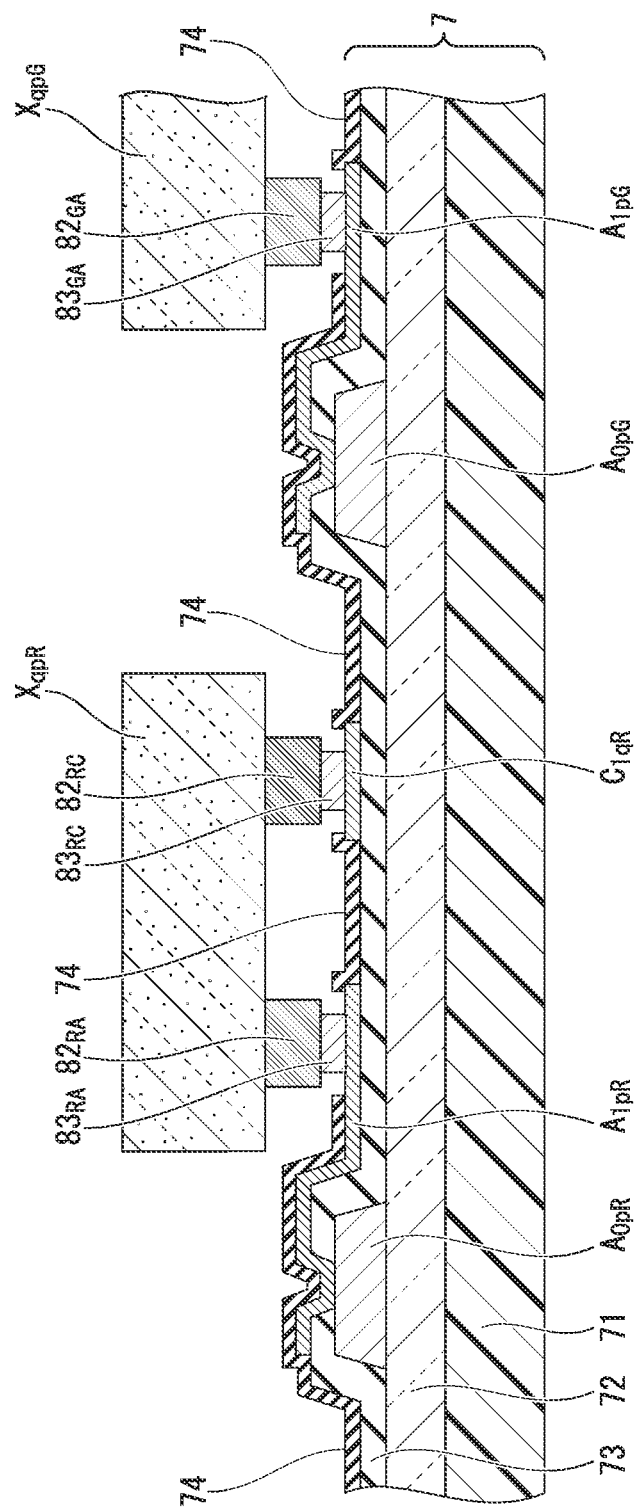
FIG. 1D is an enlarged cross-sectional view in which a red LED chip illustrated in FIG. 1C is illustrated.

FIG. 1D is an enlarged cross-sectional view, focusing to the minute element $X_{qpR}$ illustrated in FIG. 1C. Through a window of the interlayer insulating film 73 on the red column signal-line $A_{0pR}$, the intermediate column wiring $A_{1pR}$ is connected to the red column signal-line $A_{0pR}$, and the intermediate column wiring $A_{1pR}$ runs on the interlayer insulating film 73. Similarly, through the window of the interlayer insulating film 73 on the green column signal-line $A_{0pG}$, the intermediate column wiring $A_{1pG}$ is connected to the red column signal-line $A_{0pG}$, and the intermediate column wiring $A_{0pG}$ runs on the interlayer insulating film 73. Moreover, as can be understood from FIG. 1B, an intermediate row wiring $C_{1qR}$ connected to the row signal-line $C_{0q}$ at a location that does not appear on the cross-sectional view runs in a direction vertical to a paper surface j on the interlayer insulating film 73.

On the intermediate column wiring $A_{1pR}$, an anode bump $83_{RA}$ is arranged, and an anode electrode $82_{RA}$ of the minute element $X_{qpR}$ is bump-connected to the anode bump $83_{RA}$. On the intermediate row wiring $C_{1qR}$, a cathode bump $83_{RC}$ is arranged, and a cathode electrode $82_{RC}$ of the minute element $X_{qpR}$ is bump-connected to the cathode bump $83_{RC}$. On the intermediate column wiring $A_{1pG}$, an anode bump $83_{RG}$ is arranged, and an anode electrode $82_{RG}$ of the minute element $X_{qpG}$ is similarly bump-connected to the anode bump $83_{RG}$. As mentioned already, the structure of the mounting board 7 illustrated in FIG. 1C is merely an example. For example, each of the anode bump $83_{RA}$, the cathode bump $83_{RC}$ and the anode bump $83_{RG}$ can be electrically connected to the intermediate column wiring $A_{1pR}$, the intermediate row wiring $C_{1qR}$ and the intermediate column wiring $A_{1pG}$, which are arranged on a bottom surface of the mounting board 7, through via-holes penetrating through the mounting board 7.

An in-pixel circuit implemented by transistors for amplification and others can be independently allocated in each of the red column signal-line $A_{0pR}$, the green column signal-line $A_{0pG}$ and the blue column signal-line $A_{0pB}$. The in-pixel circuit may be arranged on the bottom surface of the mounting board 7. Moreover, it is allowed to assign color mixing circuits in each of the pixels ($X_{qpR}$, $X_{qpG}$ and $X_{qpB}$), respectively, so that miscellaneous colors can be generated individually from each of the pixels. The in-pixel circuits and color mixing circuits can be merged in different semiconductor chips located under the mounting board 7, and a stacked structure may be achieved by electrical connections through bump-connections between the different semiconductor chips and the mounting board 7.

In any case, as illustrated in FIG. 1D, patterns of the anode bump $83_{RA}$ and the anode electrode $82_{RA}$ are required to be bump-connected to each other with an alignment margin of one micrometer or less, achieving high reliability connections. Similarly, patterns of the cathode bump $83_{RC}$ and the cathode electrode $82_{RC}$ are required to be bump-connected to each other, and patterns of the anode bump $83_{RG}$ and the anode electrode $82_{RG}$ are required to be bump-connected to each other. Therefore, the alignment-assisting trays, alignment-control apparatuses and alignment methods pertaining to the first to fourth embodiments, which are supposed to be explained below are used as the highly minute-and-precise assembling technology having the high reliability in which 10,000 to 20,000 or more than 20,000 of minute elements $X_{qpR}$, $X_{qpG}$ and $X_{qpB}$ are collectively aligned and arranged with high-precision pitch.

First Embodiment

An alignment-control apparatus pertaining to a first embodiment of the present invention relates a highly minute-and-precise assembling technology in which 10,000 to 20,000 pieces, or more than 20,000 pieces of rectangular minute elements $X_{qpR}$, $X_{qpG}$ and $X_{qpB}$ (hereafter, the rectangular minute elements $X_{qpR}$, $X_{qpG}$ and $X_{qpB}$ are merely abbreviated as "rectangular elements $X_{qpR}$, $X_{qpG}$ and $X_{qpB}$") are collectively arrayed with high precision pitch and highly-minute integration density, and after that, the above rectangular elements are integrated in hybrid integration scheme on the mounting board 7. "The rectangular element" defined by the abbreviation means a minute chip or a microchip having a solid shape, in which main surfaces parallel to each other are rectangular or square. Therefore, "the rectangular element" represent a generic concept of shapes which include a rectangular parallelepiped and a cube. "The main surfaces" mean a pair of opposite surfaces which are larger in area than the quadruple side planes defining a thickness of the minute chip, wherein the quadruple side planes implement a side surface of the minute chip. Important feature lies in the geometrical shape in which, among the quadruple side planes of the rectangular element, the side planes adjacent to each other intersect at a right angle.

Figure 2:
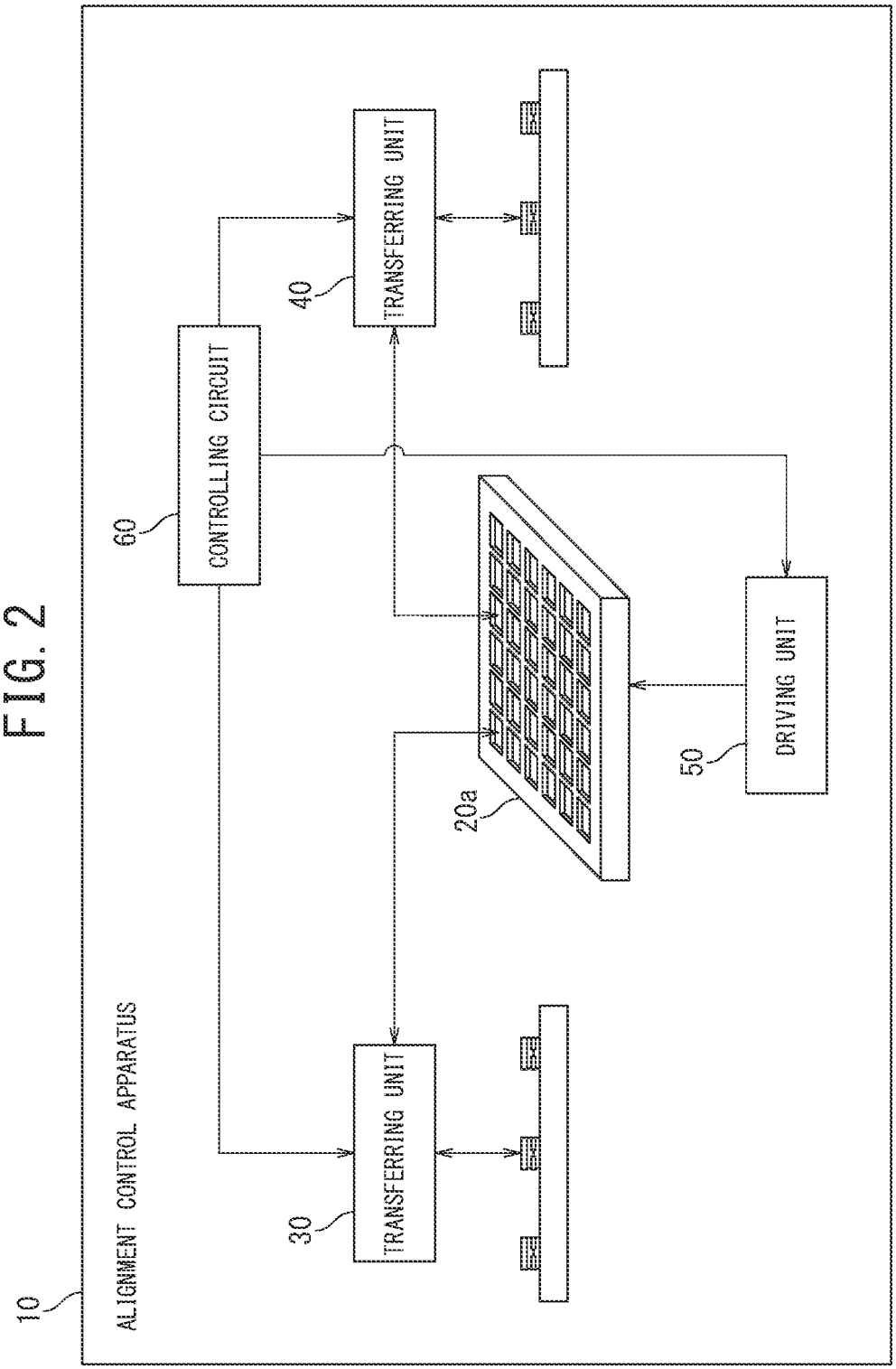
FIG. 2 is a block diagram illustrating an alignment-control apparatus of minute elements pertaining to the first embodiment of the present invention.

As illustrated in FIG. 2, the alignment-control apparatus pertaining to the first embodiment encompasses an alignment-assisting tray 20a used to collectively align a large number of rectangular elements $X_{qpR}$, $X_{qpG}$ and $X_{qpB}$ with a highly minute-and-precise configuration, a first transferring unit 30 for collectively transporting the large number of roughly-aligned rectangular elements $X_{qpR}$, $X_{qpG}$ and $X_{qpB}$ to the concave cells of the alignment-assisting tray 20a, a second transferring unit 40 for collectively transporting the large number of rectangular elements $X_{qpR}$, $X_{qpG}$, $X_{qpB}$, which are precisely aligned as a batch with a highly-minute configuration, from the alignment-assisting tray 20a, a driving unit 50, configured to drive the alignment-assisting tray 20a so that the large number of rectangular elements $X_{qpR}$, $X_{qpG}$ and $X_{qpB}$ can be precisely aligned as a batch, with a high-precision highly-minute pitch, and a controlling circuit 60 for controlling the operations of the first transferring unit 30, the second transferring unit 40 and the driving unit 50.

Figure 3A:
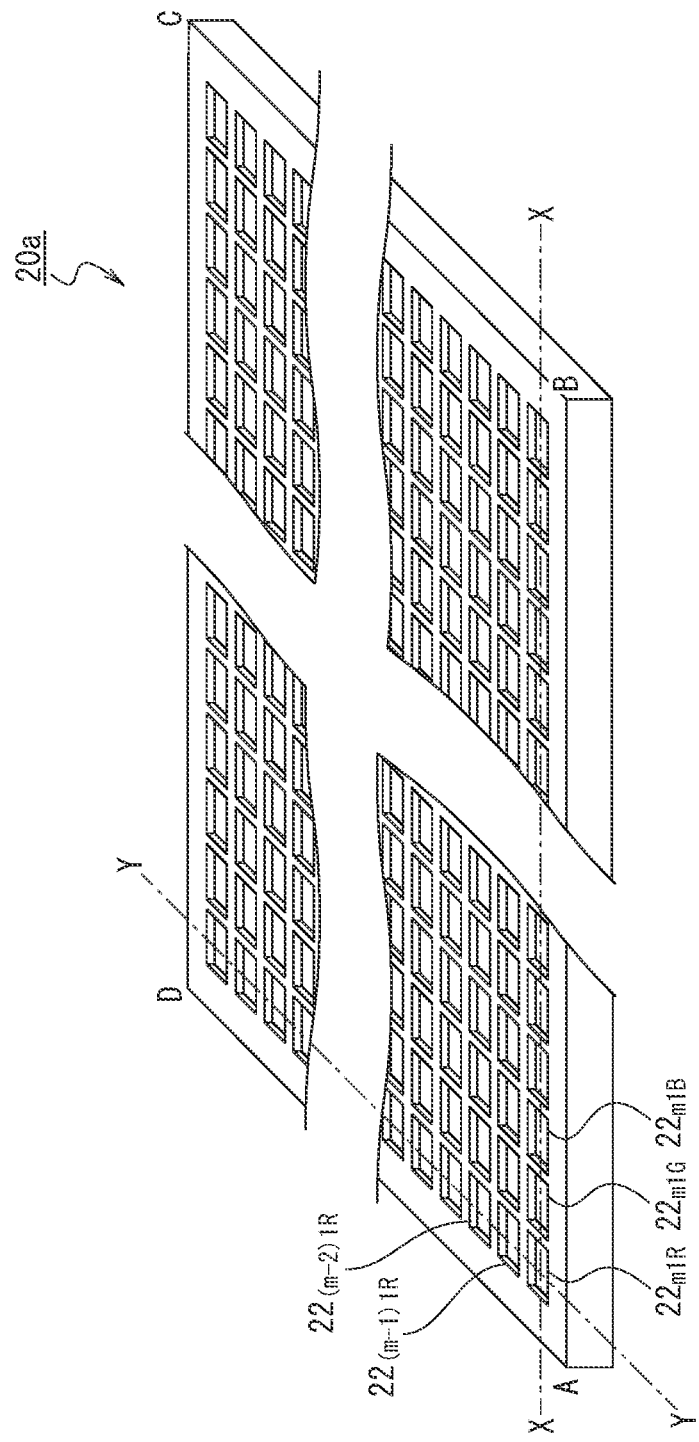
FIG. 3A is a perspective view illustrating the detail of an alignment-assisting tray pertaining to the first embodiment.
Figure 3B:
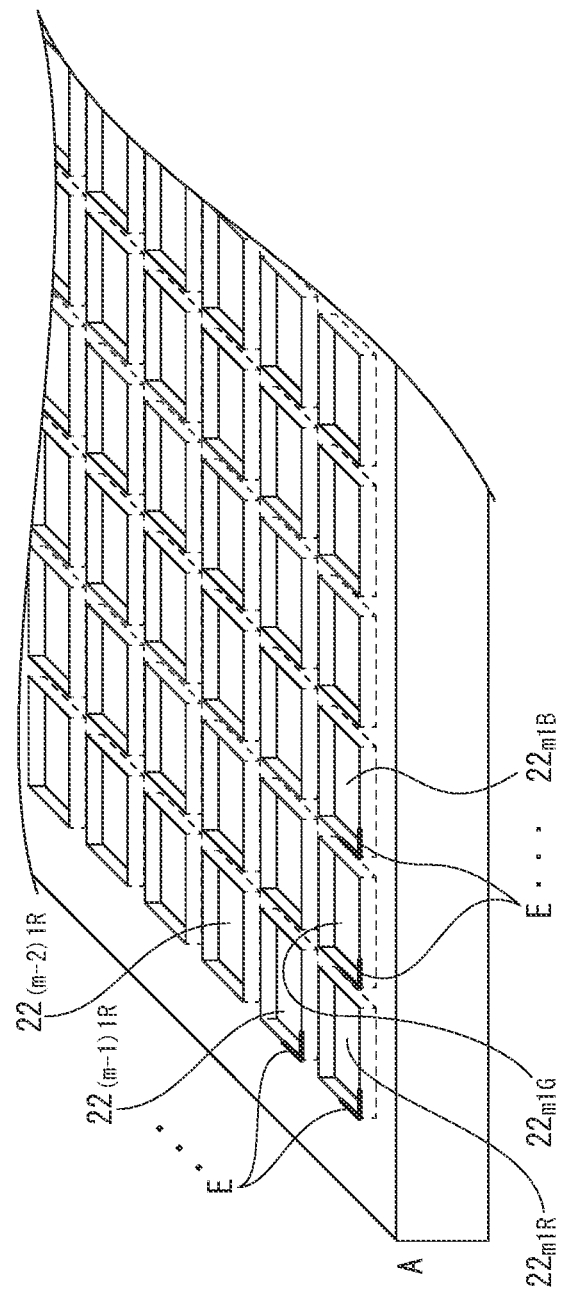
FIG. 3B is a view in which a part of the alignment-assisting tray in FIG. 3A is enlarged.

In the alignment-assisting tray 20a, as illustrated in FIGS. 3A and 3B, a plurality of concave cells is allocated in accordance with positions defined by layout sites of rectangular minute elements $X_{qpR}$, $X_{qpG}$ and $X_{qpB}$ on the mounting board 7, because each of the concave cells in the alignment-assisting tray 20a is supposed to store individually the rectangular minute elements $X_{qpR}$, $X_{qpG}$ and $X_{qpB}$. Each of the rectangular minute elements $X_{qpR}$, $X_{qpG}$ and $X_{qpB}$ has quadruple side planes, the quadruple side planes implementing a side surface of the rectangular minute elements $X_{qpR}$, $X_{qpG}$ and $X_{qpB}$, and the adjacent side planes of the rectangular minute elements $X_{qpR}$, $X_{qpG}$ and $X_{qpB}$ intersect each other at a right angle. The plurality of rectangular minute elements $X_{qpR}$, $X_{qpG}$ and $X_{qpB}$ are scheduled to be mounted on the mounting board 7, as exemplified in FIG. 1C. In addition, since the layout of the rectangular minute elements $X_{qpR}$, $X_{qpG}$ and $X_{qpB}$ in periodic matrix on the mounting board 7 is assumed, the array of the matrix-shaped concave cells has been represented in FIGS. 3A and 3B, the topology of the matrix-shaped concave cells is a mere example. According to a technical requirement specification in which non-periodic layout is delineated on the mounting board 7, the array of the respective concave cells in the alignment-assisting tray 20a shall be determined to have a pattern to which the non-periodic layout of the supposed requirement specification is projected. Thus, the array pattern of the respective concave cells in the alignment-assisting tray 20a of the present invention is not limited to the periodic layout illustrated in FIGS. 3A and 3B. In the alignment-control apparatus pertaining to the first embodiment, one of the quadruple concave-ridges, each of the concave-ridges is defined by quadruple sidewall-planes of each concave cell in the alignment-assisting tray 20a, is selected as an interfacing ridge for alignment. Moreover, to each of the plurality of rectangular minute elements $X_{qpR}$, $X_{qpG}$ and $X_{qpB}$, one convex-ridge is assigned as "a moving ridge-to-be-mated (MRTBM)", respectively, which is a convex-ridge closest to a counterpart interfacing ridge among quadruple convex-ridges of the rectangular minute elements $X_{qpR}$, $X_{qpG}$ and $X_{qpB}$. Here, the counterpart interfacing ridge is defined in each of the concave cells of the alignment-assisting tray 20a, and each of the convex-ridges is defined by a couple of adjacent side planes, the couple of adjacent side planes is elected from the quadruple side planes in each of the plurality of rectangular minute elements $X_{qpR}$, $X_{qpG}$ and $X_{qpB}$. The driving unit 50 drives the alignment-assisting tray 20a so that reallocating forces shall act on each of the rectangular elements $X_{qpR}$, $X_{qpG}$ and $X_{qpB}$, and thereby, the MRTBMs assigned to each of the rectangular elements $X_{qpR}$, $X_{qpG}$ and $X_{qpB}$ move toward the counterpart interfacing ridges defined in each of the concave cells of the alignment-assisting tray 20a, respectively.

The first transferring unit 30 for collectively transporting the large number of roughly-aligned rectangular elements $X_{qpR}$, $X_{qpG}$ and $X_{qpB}$ as a batch to the concave cells of the alignment-assisting tray 20a, and the second transferring unit 40 for collectively transporting the large number of rectangular elements $X_{qpR}$, $X_{qpG}$ and $X_{qpB}$ as a batch from the alignment-assisting tray 20a, after the rectangular elements $X_{qpR}$, $X_{qpG}$ and $X_{qpB}$ have been precisely aligned as a batch with a highly-minute configuration in the alignment-assisting tray 20a, can be integrated into one unit. In a case that the first transferring unit 30 and the second transferring unit 40 are integrated into one unit, it is possible to achieve a technical advantage of the simplification of an assembling apparatus and a reduction of device manufacturing costs. In a scheme that the above two units are used as the different units, it is possible to achieve a technical advantage of throughput improvement caused by parallel processing operations in which, while a large number of rectangular elements $X_{qpR}$, $X_{qpG}$ and $X_{qpB}$ are being collectively transported as a batch from the alignment-assisting tray 20a, a different large number of rectangular elements $X_{qpR}$, $X_{qpG}$ and $X_{qpB}$ are collectively transported as a batch to the concave cells of the alignment-assisting tray 20a.

The alignment-assisting tray 20a is a tool adapted for facilitating the large number of rectangular elements $X_{qpR}$, $X_{qpG}$ and $X_{qpB}$, which are roughly aligned at randomly varying pitches, can be precisely aligned as a batch, with highly minute-and-precise configuration, by which two-dimensional precision is improved. As illustrated in FIGS. 3A and 3B, the alignment-assisting tray 20a encompasses a plate-shaped body substrate and a plurality of concave cells $22_{(m-2)1R}$, - - - , $22_{(m-1)1R}$, - - - , $22_{m1R}$, $22_{m1G}$, $22_{m1B}$, which are arranged in a shape of matrix at and in one surface side of the body substrate. In each of the plurality of concave cells $22_{(m-2)1R}$, - - - , $22_{(m-1)1R}$, - - - , $22_{m1R}$, $22_{m1G}$, $22_{m1B}$, the large number of rectangular elements $X_{qpR}$, $X_{qpG}$ and $X_{qpB}$ are supposed to be allocated, respectively. As an entire structure, the alignment-assisting tray 20a is shaped like a geometry of waffle, which is a kind of baked confectionary. As illustrated in FIG. 3A, the alignment-assisting tray 20a is a rectangle having quadruple vertices A, B, C and D. Sizes and inner volumes of the concave cells $22_{(m-2)1R}$, - - - , $22_{(m-1)1R}$, - - - , $22_{m1R}$, $22_{m1G}$, $22_{m1B}$ are assumed to be larger than sizes and outer volumes of the rectangular elements $X_{qpR}$, $X_{qpG}$ and $X_{qpB}$.

For example, a size of each of the concave cells $22_{(m-2)1R}$, - - - , $22_{(m-1)1R}$, - - - , $22_{m1R}$, $22_{m1G}$, $22_{m1B}$ is preferable in such a way that each diagonal lengths defined in each of the concave cells $22_{(m-2)1R}$, - - - , $22_{(m-1)1R}$, - - - , $22_{m1R}$, $22_{m1G}$, $22_{m1B}$, viewed on a planar pattern, is designed to be longer by 50 percent or more than 50 percent of each diagonal lengths defined in each of the rectangular elements $X_{(m-2)1R}$, - - - , $X_{(m-1)1R}$, - - - , $X_{m1R}$, $X_{m1G}$, $X_{m1B}$ in a corresponding direction. More concretely, in a case that a size of the rectangular elements $X_{qpR}$, $X_{qpG}$ and $X_{qpB}$ is 55 micrometers (longitudinal: X-direction)×30 micrometers (lateral: Y-direction)×15 micrometers (depth), the size of the concave cells $22_{(m-1)1R}$, - - - , $22_{(m-1)1R}$, - - - , $22_{m1R}$, $22_{m1G}$, $22_{m1B}$ may be set to a dimension of 100 micrometers (longitudinal: X-direction)× 55 micrometers (lateral: Y-direction)×20 micrometers (depth), in such a way that lengths along the longitudinal and lateral directions are about two times with respect to the lengths of the rectangular elements $X_{qpR}$, $X_{qpG}$ and $X_{qpB}$ along the longitudinal and lateral directions, and depth is larger than the thickness of the rectangular elements $X_{qpR}$, $X_{qpG}$ and $X_{qpB}$.

The alignment-assisting tray 20a is made of rigid materials, such as silicon, ceramics, and metal, which are easy to apply fabrication processes. As illustrated in FIG. 3B, each of the concave cells $22_{(m-2)1R}$, - - - , $22_{(m-1)1R}$, - - - , $22_{m1R}$, $22_{m1G}$, $22_{m1B}$ has an interfacing corner E in a direction toward a vertex A, and each of the convex-ridges of the corresponding rectangular elements $X_{qpR}$, $X_{qpG}$ and $X_{qpB}$ is scheduled to be mated to both side-planes of the counterpart interfacing corner E. Here, "the interfacing corner E" is one of "the interfacing ridges" selected as a representative among quadruple concave-ridges in each of the concave cells $22_{(m-2)1R}$, - - - , $22_{(m-1)1R}$, - - - , $22_{m1R}$, $22_{m1G}$, $22_{m1B}$. In "the interfacing corner E", a vertical sidewall-plane extending along X-axis direction and a vertical sidewall-plane extending along Y-direction intersect with each other at a right angle, as one of the concave-ridges assigned to each of the concave cells $22_{(m-2)1R}$, - - - , $22_{(m-1)1R}$, - - - , $22_{m1R}$, $22_{m1G}$, $22_{m1B}$. Although a case that the interfacing corners E are respectively assigned to nearest corners toward the vertex A in each of the concave cells $22_{(m-2)1R}$, - - - , $22_{(m-1)1R}$, - - - , $22_{m1R}$, $22_{m1G}$, $22_{m1B}$, is explained hereafter, the assignment of the interfacing corner E to which a specific one of convex-ridges assigned to each of the rectangular elements $X_{qpR}$, $X_{qpG}$ and $X_{qpB}$ is scheduled to be mated with both side-planes in the interfacing corner E is mere example. Therefore, it is possible to assign the interfacing corner E to other orientations toward one of vertices B, C and D, and not to the vertex A, so that the specific one of the convex-ridges, or the MRTBM of each of the rectangular elements $X_{qpR}$, $X_{qpG}$ and $X_{qpB}$ can be mated to both side-planes of the interfacing corners E. "The MRTBM" is selected from the quadruple convex-ridges defined respectively by the quadruple side planes of the rectangular elements $X_{qpR}$, $X_{qpG}$ and $X_{qpB}$. That is, the MRTBM is one of the convex-ridges that lies closest to the interfacing ridge, which is assigned to the interfacing corner E.

By the driving unit 50, the alignment-assisting tray 20a is driven to swing in upper and lower, or left and right directions, keeping orientations such that a horizontal level of the interfacing corner E in each of the concave cells $22_{(m-2)1R}$, - - - , $22_{(m-1)1R}$, - - - , $22_{m1R}$, $22_{m1G}$, $22_{m1B}$ is positioned gravitationally downside. Thus, the MRTBM, which serves as one of the convex-ridges in each of the large number of rectangular elements $X_{qpR}$, $X_{qpG}$ and $X_{qpB}$, is displaced to be interfaced with the corresponding interfacing ridge of the interfacing corner E defined in the concave cells $22_{(m-2)1R}$, - - - , $22_{(m-1)1R}$, - - - , $22_{m1R}$, $22_{m1G}$, $22_{m1B}$, and therefore, the rectangular elements $X_{qpR}$, $X_{qpG}$ and $X_{qpB}$ are aligned toward the interfacing corners E. Accordingly, it is possible to easily align the positions of the large number of the minute elements, the numbers are 10,000 to 20,000 or more than 20,000, to the pattern of the mounting board 7. And, it is possible to easily execute the batch alignment that is high in spatial definition and excellent in two-dimensional pitch precision. Since the alignment-assisting tray 20a pertaining to the first embodiment has a presumption that the shape of each of the great many minute elements is typical rectangular, each of the shapes of the concave cells $22_{(m-1)1R}$, - - - , $22_{(m-1)1R}$, - - - , $22_{m1R}$, $22_{m1G}$, $22_{m1B}$ is rectangular, corresponding to the shape under presumed.

Figure 4A:
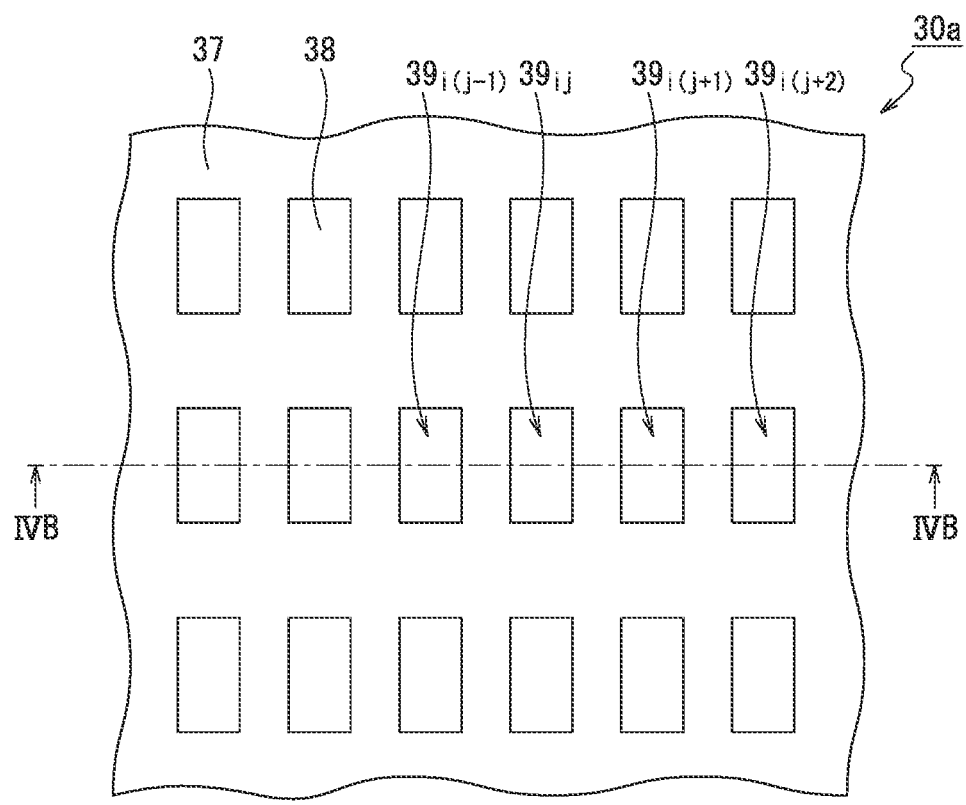
FIG. 4A is a view illustrating a partial example of adsorbing cells of a transferring unit used in the alignment-control apparatus pertaining to the first embodiment.
Figure 4B:
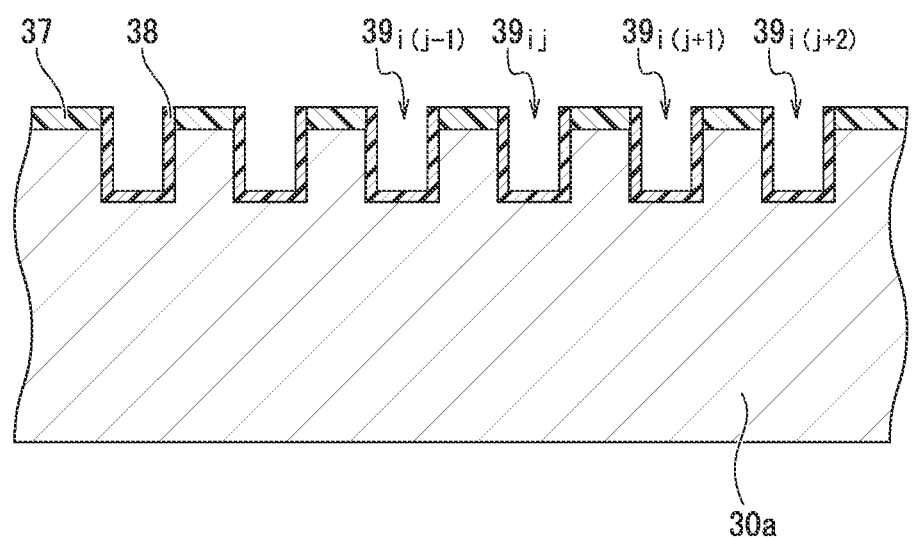
FIG. 4B is a cross-sectional view illustrating a part of the transferring unit illustrated in FIG. 4A.

The architectures of first transferring unit 30 and the second transferring unit 40 are not especially limited, as far as the great many minute elements can be collectively transported as a batch, keeping the positional relations and the pitch precisions in the great many minute elements. For example, an electrostatic wafer, or an electrostatic chuck, is available for the first transferring unit 30 and the second transferring unit 40, because a great many minute elements, such as 10,000 to 20,000 elements or more than 20,000 elements, can be picked up, by attraction forces due to the static electricity. Also, it is possible to use self-assembled chuck as represented by a plan view illustrated in FIG. 4A, the cross-sectional view taken from IVB-IVB direction in FIG. 4A is illustrated in FIG. 4B. The self-assembled chuck illustrated in FIGS. 4A and 4B is referred to as "a picker". And, the self-assembled chuck illustrated in FIGS. 4A and 4B encompasses a plate-shaped substrate (body substrate) implemented by, for example, a plastic substrate, and the plate-shaped substrate embraces a plurality of areas of hydrophilic layer (picking cells) 38 and a hydrophobic area 37 surrounding the array of the picking cells, and the structure of the picker is simpler than the electrostatic chuck. The hydrophilic film 38 can be made, for example, by a silicon dioxide ($SiO_2$) film that is hydrophilic. In addition to the $SiO_2$ film, it is possible to use a silicon nitride film ($Si_3N_4$), a double-layer film of aluminum and alumina ($Al/Al_2O_3$), and a double-layer film of tantalum and tantalum oxide ($Ta/Ta_2O_5$) as the hydrophilic film 38. The hydrophobic area 37 can be made of single crystalline silicon (Si), silicon resin, fluorocarbon-resin, polyimide resin, photo resist, wax, benzo cyclobutene (BCB) and others.

Figure 4C:
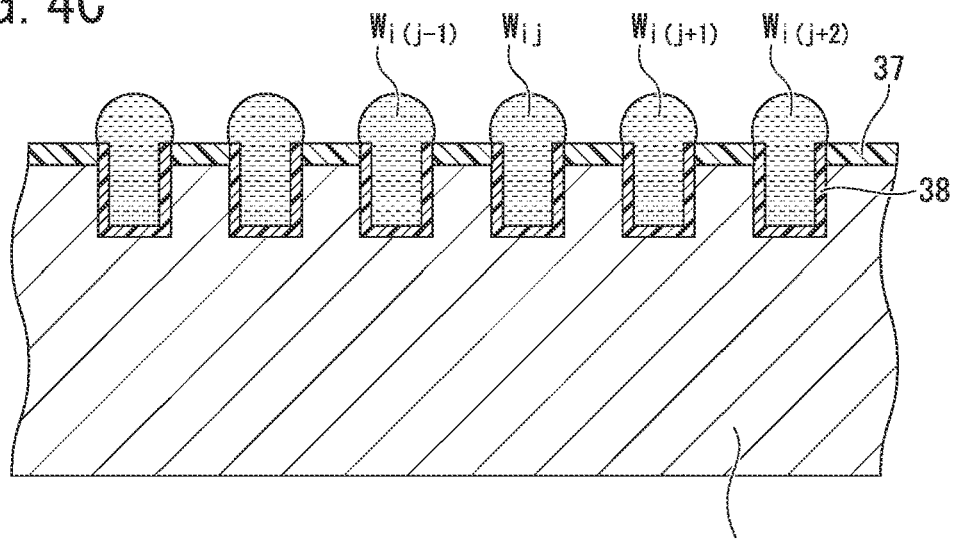
FIG. 4C is a schematic cross-sectional view explaining a situation in which fluid droplets are coated in hydrophilic cells of the transferring unit illustrated in FIG. 4B.

FIG. 4B illustrates an example in which the hydrophilic film 38 is laminated on each of the inner walls of concave cells $39_{i(j-1)}$, $39_{ij}$, $39_{i(j+1)}$, $39_{i(j+2)}$. However, the hydrophilic film 38 may be assigned to a plurality of cells disposed at the same planar level as the hydrophobic area 37. When the hydrophilic film 38 is laminated on the cells disposed at same planar level of the hydrophobic area 37, the plate-shaped substrate (body substrate) having the hydrophobic area 37 can be made of, for example, a plastic substrate. The scheme that the hydrophilic film 38 is disposed at the same planar level of the hydrophobic area 37 can achieve a simpler structure than the electrostatic chuck. FIG. 4C illustrates an example in which fluid droplets $W_{i(j-1)}$, $W_{ij}$, $W_{i(j+1)}$ and $W_{i(j+2)}$ are assigned to each of the hydrophilic films 38, respectively, and the minute elements can be adsorbed and picked up by the counterpart fluid droplets $W_{i(j-1)}$, $W_{ij}$, $W_{i(j+1)}$ and $W_{i(j+2)}$. According to the self-assembled chuck pertaining to the first embodiment, the shape, the position and the area of each of the hydrophilic films 38 are elected and designed such that the patterns of the hydrophilic films 38 can create a matrix, which has a pitch corresponding to the array of the concave cells 22 arranged in the alignment-assisting tray 20a. And the other portions than the areas of the hydrophilic films 38 are assigned to the hydrophobic area 37.

As the first transferring unit 30 and the second transferring unit 40, a high-speed bonder transfer scheme by a pick & place architecture, an elastomer-stamp transfer scheme, a laser-induced transfer scheme with selective lift-off scheme and a roll-to-roll or roll-to-panel transfer scheme using roller can be employed in addition to the electrostatic chuck and the self-assembled chuck using the fluid droplets. By using the elastomer-stamp transfer scheme for the first transferring unit 30, it is possible to thin out, or decimate a very many rectangular elements diced on the entire wafer. That is, the targeted rectangular elements $X_{qpR}$, $X_{qpG}$ and $X_{qpB}$ are collectively and selectively picked up by the convex cells, which are made of material such as poly-di-methyl-siloxane (PDMS) and are allocated at positions of the rectangular elements $X_{qpR}$, $X_{qpG}$ and $X_{qpB}$, from the entire wafer, and thereby, the number of the residual rectangular elements remained on the entire wafer can be decimated. The positions of the picked up rectangular elements $X_{qpR}$, $X_{qpG}$ and $X_{qpB}$ are elected to locations determined by an integral multiple of the pitch of the rectangular elements $X_{qpR}$, $X_{qpG}$ and $X_{qpB}$, the pitch of the rectangular elements $X_{qpR}$, $X_{qpG}$ and $X_{qpB}$ is defined by the positions immediately after all rectangular elements are diced. Thus, in a case that the elastomer-stamp transfer scheme is employed for the first transferring unit 30, and when a great many chips are collectively transported as a batch into the concave cells 22 of the alignment-assisting tray 20a, a miss allocation of chips, such that two or more chips will be allocated in a single concave cell 22 of the alignment-assisting tray 20a, can be prevented. Namely, when the convex cells are arrayed at a pitch, which is determined to be several times to several ten times of the original pitch of the rectangular elements $X_{qpR}$, $X_{qpG}$ and $X_{qpB}$ as diced, large number of chips can be decimated during the picking up process of the targeted rectangular elements $X_{qpR}$, $X_{qpG}$ and $X_{qpB}$ using the first transferring unit 30.

The controlling circuit 60 controls the operations of the first transferring unit 30, the second transferring unit 40 and the driving unit 50. The programs configured to instruct the required operations of the controlling circuit 60 may be stored in the inside of the controlling circuit 60, or may be stored in a storing unit (which is not illustrated) arranged in the inside of the alignment-control apparatus 10. Or alternatively, the miscellaneous programs for instructing the required operations of the controlling circuit 60 may be stored in an instrument other than the alignment-control apparatus 10, or a storing medium disposed outside of the alignment-control apparatus 10. Although a case such that the controlling circuit 60 is installed in the inside of the alignment-control apparatus 10 is represented, the controlling circuit 60 can be disposed outside the alignment-control apparatus 10, and the alignment-control apparatus 10 can be remote controlled from a controlling circuit 60 disposed outside of the alignment-control apparatus 10.

The alignment method pertaining to the first embodiment of the present invention has an objective directed to a batch process, in which a large number of 10,000 to 20,000 diced minute elements or more than 20,000 diced minute elements are collectively aligned simultaneously, with a highly minute-and-precise pitch, and the batch process can achieve an alignment margin of one micrometer or less, associated with the pattern of the mounting board 7. The following process-flow cross-sectional views will mainly addressing and focusing to only triple rectangular elements $X_{qpR}$, $X_{qpG}$ and $X_{qpB}$, and then, the alignment method pertaining to the first embodiment will be explained under an assumption of simplification that the focused triple rectangular elements $X_{qpR}$, $X_{qpG}$ and $X_{qpB}$ are all-embracing minute elements, which are representative minute elements of a great many minute elements. For example, when p=1 to m, q=1 to n and m=n=100 are assumed, the total number of the minute elements becomes 30,000 pieces. Or, when m=n=100 is assumed, the total number of the minute elements is 3,000,000 pieces. In addition, the process-flow cross-sectional views cited in the following explanations are roughly classified into:

(i) a series of process-flow cross-sectional views as illustrated in FIGS. 5A to 5J, each of which illustrates the corresponding step of collectively transporting a great many roughly-aligned minute elements to the concave cells of the alignment-assisting tray 20a;

(ii) a series of process-flow cross-sectional views as illustrated in FIGS. 5K to 5N, each of which illustrates the corresponding step of driving the swing operation of the alignment-assisting tray 20a to collectively transfer and align the great many minute elements in the inside of the alignment-assisting tray 20a, with a highly minute-and precise configuration; and (iii) a series of process-flow cross-sectional views as illustrated in FIGS. 5O to 5R, each of which illustrates the corresponding step of collectively transporting the great many minute elements from the alignment-assisting tray 20a, the great many minute elements are collectively aligned with the highly minute-and-precise configuration, and thereafter, mounting the great many minute elements on a mounting board as a batch.

Figure 5A:
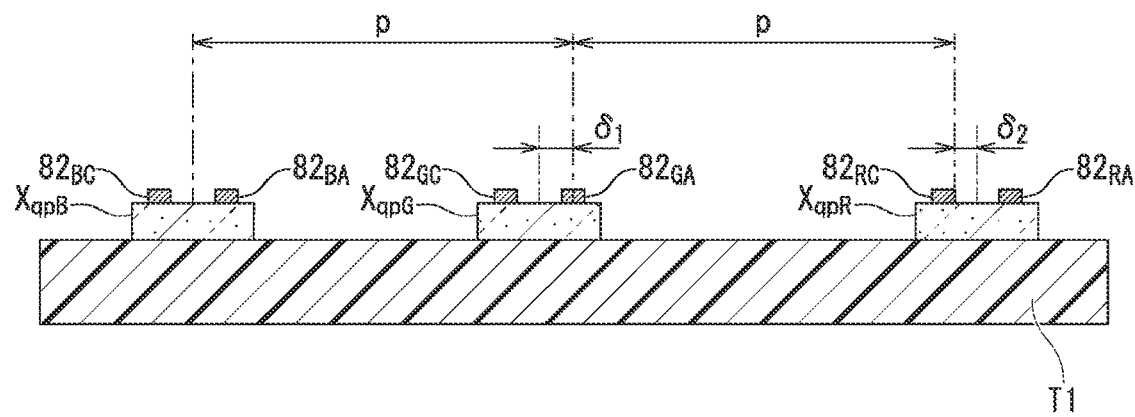
FIG. 5A is a process-flow cross-sectional view explaining a situation of an array of a plurality of rectangular minute elements that are roughly arrayed on a dicing tape at randomly varied pitches, as one process step according to the alignment method pertaining to the first embodiment.

As a precondition, as illustrated in FIG. 5A, the large number of roughly aligned rectangular elements $X_{qpR}$, $X_{qpG}$ and $X_{qpB}$ are assumed to be roughly aligned at a rough targeted-pitch "p" and arranged on a dicing tape T1, which serve as a first base-board. However, at a stage illustrated in FIG. 5A, positional accuracies of the rectangular elements $X_{qpR}$, $X_{qpG}$ and $X_{qpB}$ are not sufficient, and it is assumed to have errors $\sigma_1$ and a $\sigma_2$ with respect to the targeted-pitch "p". The alignment method pertaining to the first embodiment uses an aligning scheme illustrated in FIGS. 5K to 5N, and modifies the errors $\sigma_1$ and a $\sigma_2$, which are occurred at the stage illustrated in FIG. 5A. Namely, according to the aligning scheme illustrated in FIGS. 5K to 5N, the large number of rectangular elements $X_{qpR}$, $X_{qpG}$ and $X_{qpB}$ are scheduled to be collectively aligned as a batch on the mounting board 7 as a second base-board, with a highly-minute configuration. Therefore, the rectangular elements $X_{qpR}$, $X_{qpG}$ and $X_{qpB}$ are scheduled to be arranged with the high precision at a correct targeted-pitch "p", whose accuracy is one micrometer or less, on the mounting board 7.

Figure 5B:
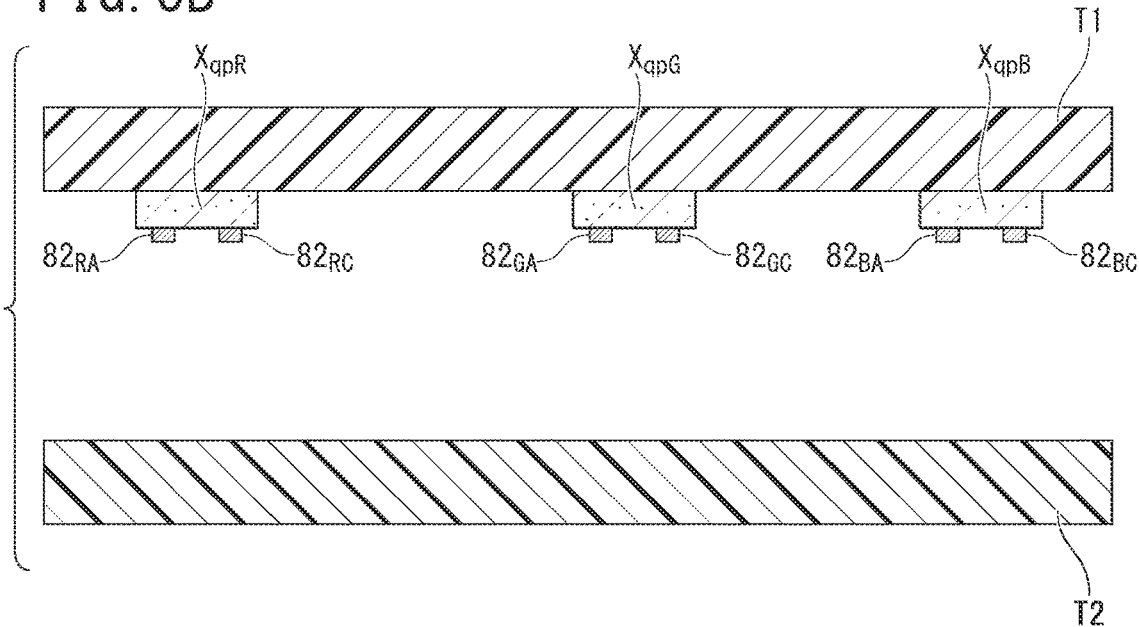
FIG. 5B is a process-flow cross-sectional view explaining a situation in which a plurality of rectangular minute elements adhered on the dicing tape with a flip-chip-arrangement are moved to a position above an adhering tape for flip over, as one process step according to the alignment method pertaining to the first embodiment.
Figure 5C:
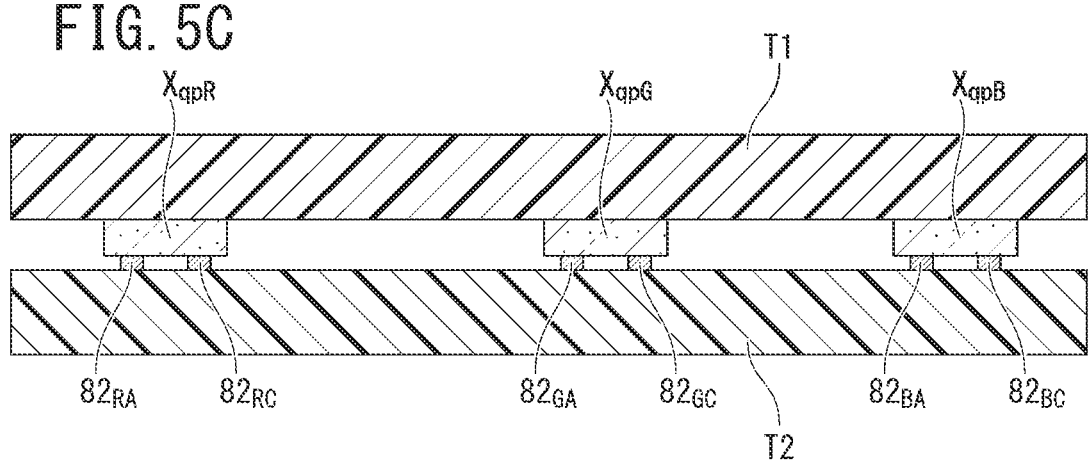
FIG. 5C is a process-flow cross-sectional view explaining a process step at which the plurality of rectangular minute elements is tenaciously sticked in flip-chip-arrangement on the adhering tape for flip over.
Figure 5D:
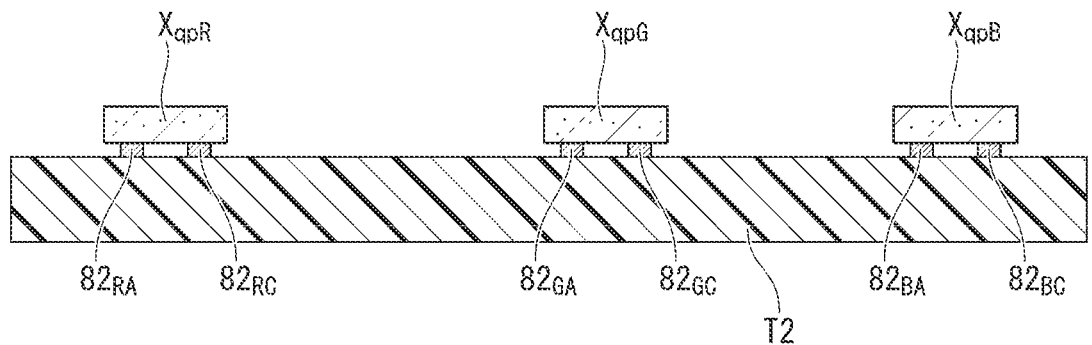
FIG. 5D is a process-flow cross-sectional view explaining an array of the plurality of rectangular minute elements being flip-chip-arranged on the adhering tape for flip over.

At first, as illustrated in FIG. 5A, immediately after being diced, the rectangular elements $X_{qpR}$, $X_{qpG}$ and $X_{qpB}$ are arranged on the dicing tape T1, wherein the rectangular elements $X_{qpR}$, $X_{qpG}$ and $X_{qpB}$ are oriented such way that one of the surfaces of each of the rectangular elements $X_{qpR}$, $X_{qpG}$ and $X_{qpB}$, on which the anode electrodes $82_{RA}$, $82_{GA}$ and $82_{BA}$ and the cathode electrodes $82_{RC}$, $82_{GC}$ and $82_{BC}$ are appeared directing toward upward, respectively, is defined as "the upper side of the rectangular elements $X_{qpR}$, $X_{qpG}$ and $X_{qpB}$". Next, as illustrated in FIG. 5B, the upper and lower sides of the dicing tape T1 are reversed in such a way that a surface on which the rectangular elements $X_{qpR}$, $X_{qpG}$ and $X_{qpB}$ are tenaciously sticked is defined as the lower side of the dicing tape T1. And the flip-chip-mounted rectangular elements $X_{qpR}$, $X_{qpG}$ and $X_{qpB}$ are moved to a position above a different adhering tape T2 for flip over. Next, as illustrated in FIG. 5C, the surfaces of the anode electrodes $82_{RA}$, $82_{GA}$ and $82_{BA}$ and cathode electrodes $82_{RC}$, $82_{GC}$ and $82_{BC}$ of the rectangular elements $X_{qpR}$, $X_{qpG}$ and $X_{qpB}$ are sticked to the adhering tape T2 for flip over. After that, the dicing tape T1 is striped off and separated from the rectangular elements $X_{qpR}$, $X_{qpG}$ and $X_{qpB}$. Then, as illustrated in FIG. 5D, the rectangular elements $X_{qpR}$, $X_{qpG}$ and $X_{qpB}$ are arranged on the adhering tape T2 for flip over, with the orientation that the anode electrodes $82_{RA}$, $82_{GA}$ and $82_{BA}$ and the cathode electrodes $82_{RC}$, $82_{GC}$ and $82_{BC}$ facing toward lower side, or facing toward the side of the adhering tape T2 for flip over.

Figure 5E:
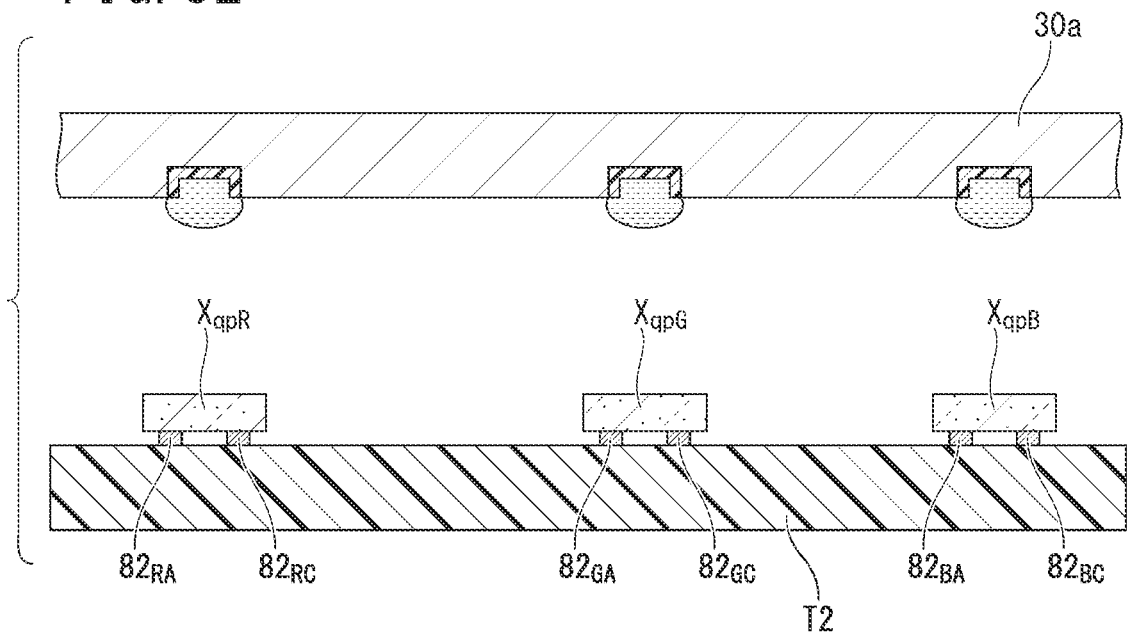
FIG. 5E is a process-flow cross-sectional view illustrating a state in which a first transferring unit is moved to a position above the plurality of rectangular minute elements being sticked on the adhering tape for flip over.
Figure 5F:
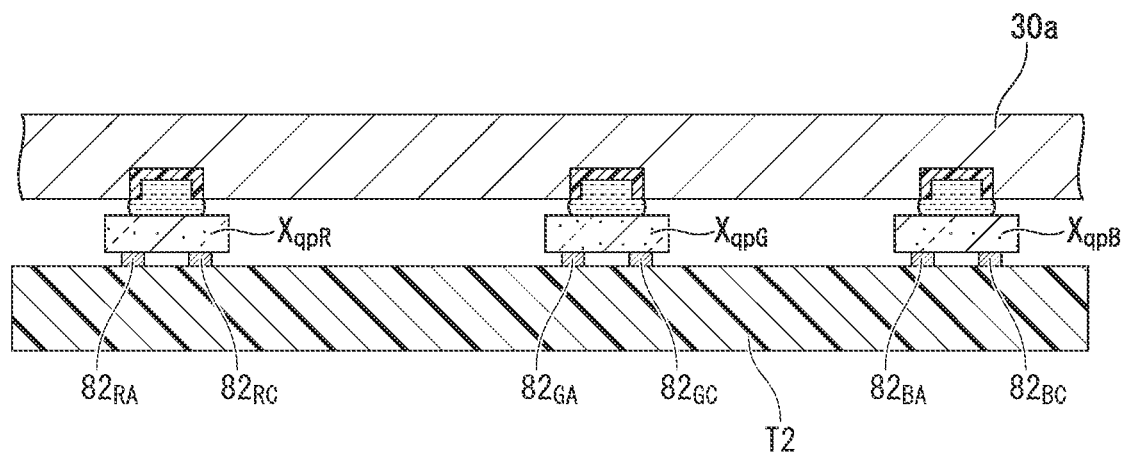
FIG. 5F is a process-flow cross-sectional view explaining a configuration in which the first transferring unit picks up the plurality of rectangular minute elements being sticked on the adhering tape for flip over.
Figure 5G:
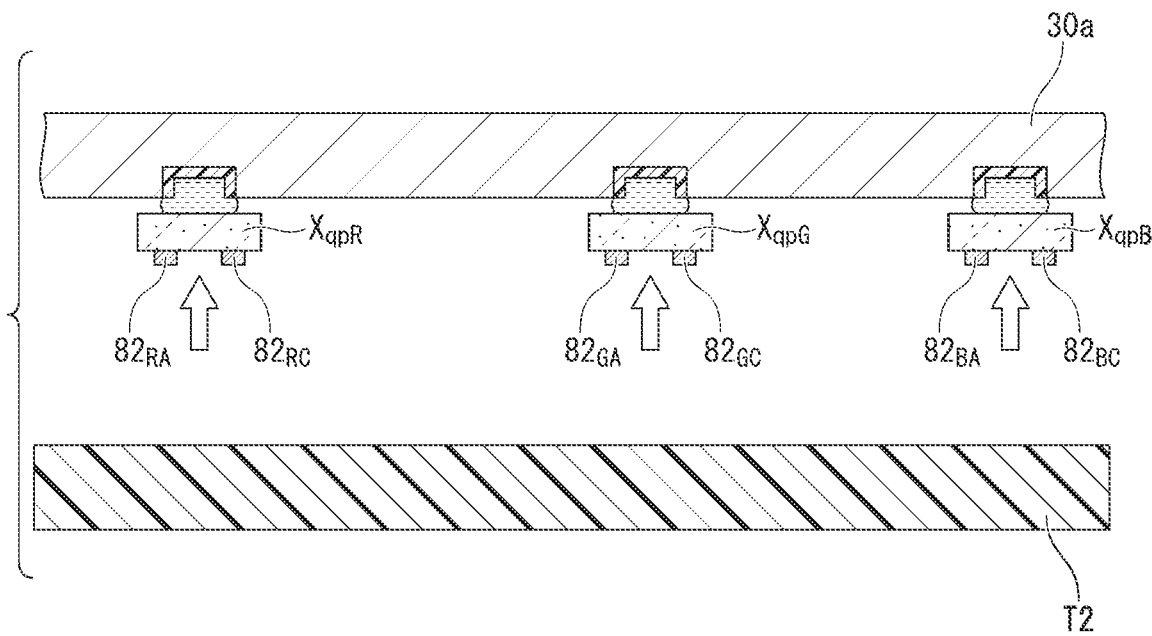
FIG. 5G is a process-flow cross-sectional view explaining a process step at which a horizontal level of the first transferring unit is raised to separate the plurality of rectangular minute elements from the adhering tape for flip over.

Next, as illustrated in FIG. 5E, as the first transferring unit 30, a chuck 30a illustrated in FIGS. 4A and 4B is moved to a position above the rectangular elements $X_{qpR}$, $X_{qpG}$ and $X_{qpB}$ arrayed on the adhering tape T2 for flip over. In addition, since the chuck 30a as the first transferring unit 30 illustrated in FIG. 5E is merely an example, the electrostatic chuck and others may be used instead of the chuck 30a illustrated in FIGS. 4A and 4B. And, the horizontal level of the chuck 30a is lowered toward to the adhering tape T2 for flip over, while at a bottom surface of the chuck 30a, each of fluid droplets is individually and separately coated on each of hydrophilic areas arrayed on the bottom surface of the chuck 30a. Then, as illustrated in FIG. 5F, each of the fluid droplets coated on the hydrophilic areas of the chuck 30a is closely contacted to the surface of the counterpart rectangular elements $X_{qpR}$, $X_{qpG}$ and $X_{qpB}$, which are sticked on the adhering tape T2 for flip over. When each of the fluid droplets coated on the hydrophilic areas of the chuck 30a is closely contacted to the surface of the rectangular elements $X_{qpR}$, $X_{qpG}$ and $X_{qpB}$, each of the rectangular elements $X_{qpR}$, $X_{qpG}$ and $X_{qpB}$ is independently picked up through surface tension of each of the fluid droplets to the chuck 30a. Even if any of the position of the rectangular elements $X_{qpR}$, $X_{qpG}$ and $X_{qpB}$ is slightly miss-aligned from the scheduled position of the fluid droplet coated on the counterpart hydrophilic area, the positions of the rectangular elements $X_{qpR}$, $X_{qpG}$ and $X_{qpB}$ are automatically self-aligned with the positions of the hydrophilic areas, by the actions of the surface tensions, as illustrated in FIG. 5F. And, as illustrated in FIG. 5G, if the horizontal level of the chuck 30a is raised relatively with respect to the adhering tape T2 for flip over, the rectangular elements $X_{qpR}$, $X_{qpG}$ and $X_{qpB}$, which are picked up by the chuck 30a, are respectively striped off and separated from the adhering tape T2 for flip over.

Figure 5H:
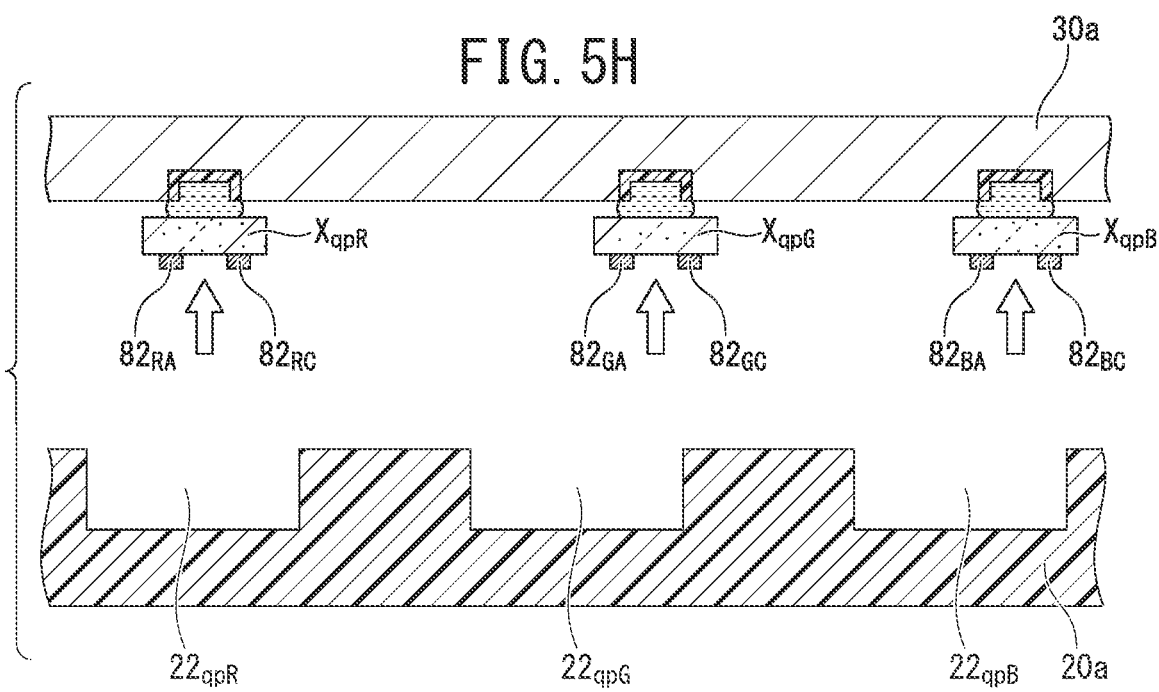
FIG. 5H is a process-flow cross-sectional view illustrating a state in which the first transferring unit, which has picked up the plurality of rectangular minute elements, is moved to a position above the alignment-assisting tray.

After that, as illustrated in FIG. 5H, the chuck 30a is moved to a position above an alignment-assisting tray 20a. And, the horizontal level of the chuck 30a is lowered relatively with respect to the concave cells of the alignment-assisting tray 20a, and the horizontal level of the chuck 30a is ramped down to a level closest to the surface (upper surface) of the alignment-assisting tray 20a. When the chuck 30a is ramped down to the level closest to the surface (upper surface) of the alignment-assisting tray 20a, a laser interferometer or an optical microscope is used to adjust relative positions so that the positions of the plurality of concave cells $22_{(m-2)1R}$, - - -, $22_{(m-1)1R}$, - - -, $22_{m1R}$, $22_{m1G}$, $22_{m1B}$ illustrated in FIGS. 3A and 3B are positionally aligned with the counterpart rectangular elements $X_{qpR}$, $X_{qpG}$ and $X_{qpB}$, which are picked up by the chuck 30a. After when the positions of the concave cells $22_{(m-2)1R}$, - - -, $22_{(m-1)1R}$, - - -, $22_{m1R}$, $22_{m1G}$, $22_{m1B}$ in the alignment-assisting tray 20a are positionally aligned with the counterpart rectangular elements $X_{qpR}$, $X_{qpG}$ and $X_{qpB}$, which are picked up by the chuck 30a, the rectangular elements $X_{qpR}$, $X_{qpG}$ and $X_{qpB}$ are released from the chuck 30a, by evaporating the fluid droplets or the water droplets from the chuck 30a through heating the chuck 30a. When the rectangular elements $X_{qpR}$, $X_{qpG}$ and $X_{qpB}$ are released from the chuck 30a, as illustrated in FIG. 5I, the rectangular elements $X_{qpR}$, $X_{qpG}$ and $X_{qpB}$ are allocated in the inside of the concave cells $22_{qpR}$, $22_{qpG}$ and $22_{qpB}$ of the alignment-assisting tray 20a.

Figure 5I:
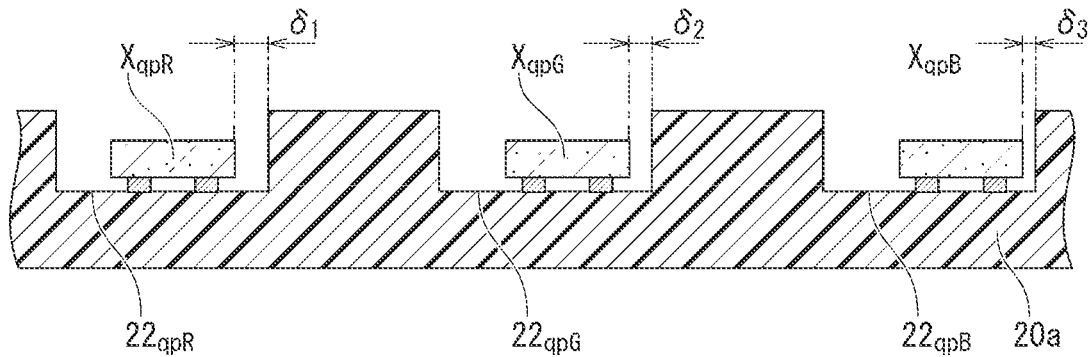
FIG. 5I is a process-flow cross-sectional view illustrating a state in which the first transferring unit roughly allocates the plurality of rectangular minute elements into concave cells of the alignment-assisting tray, respectively.
Figure 5J:
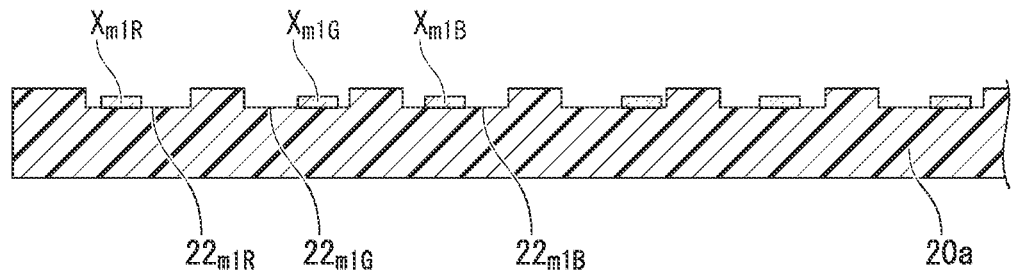
FIG. 5J is a schematic cross-sectional view taken along an X-X line in FIG. 3A, explaining a configuration of the rectangular minute elements, which are roughly allocated in the inside of the concave cells of the alignment-assisting tray, prior to an operation of double-axial rocking-drive.

As illustrated in FIG. 5I, the rectangular elements $X_{qpR}$, $X_{qpG}$ and $X_{qpB}$ are disposed in the inside of the concave cells $22_{qpR}$, $22_{qpG}$ and $22_{qpB}$ with an orientation such that the anode electrodes $82_{RA}$, $82_{GA}$ and $82_{BA}$ and the cathode electrodes $82_{RC}$, $82_{GC}$ and $82_{BC}$ shall lie at lower side (bottom side). Under the condition illustrated in FIG. 5I, a right edge-face of the rectangular element $X_{qpR}$ is separated by a distance $\delta_1$ from a right side-wall of the concave cell $22_{qpR}$. Also, as illustrated in FIG. 5I, a right edge-face of the rectangular element $X_{qpG}$ is separated by a distance $\delta_2$ from a right side-wall of the concave cell $22_{qpG}$, and a right edge-face of the rectangular element $X_{qpB}$ is separated by a distance $\delta_3$ from a right side-wall of the rectangular element $X_{qpB}$. Although FIG. 5I exemplifies a case of $\delta_1 > \delta_2 > \delta_3$, the condition illustrated in FIG. 5I is merely an example. For example, in various situations such as $\delta_2 > \delta_1 > \delta_3$, $\delta_3 > \delta_2 > \delta_1$, or the like, the rectangular elements $X_{qpR}$, $X_{qpG}$ and $X_{qpB}$ can be allocated in the inside of the concave cells $22_{qpR}$, $22_{qpG}$ and $22_{qpB}$ at rough accuracy. Thus, at the stage illustrated in FIG. 5I, variations of positions, which exceed one micrometer, will be generated as the positional accuracy. FIG. 5J illustrates a cross-sectional view taken along X-X direction of FIG. 3A, in which the rectangular elements $X_{m1R}$, $X_{m1G}$ and $X_{m1B}$ are arranged in the inside of the concave cells $22_{m1R}$, $22_{m1G}$ and $22_{m1B}$, at the positional variation exceeding one micrometer. Namely, FIG. 5J illustrates the situations relating to the inner positional accuracy in each of the concave cells $22_{m1R}$, $22_{m1G}$ and $22_{m1B}$, which are disposed at positions near the vertex A of the alignment-assisting tray 20a.

Figure 5K:
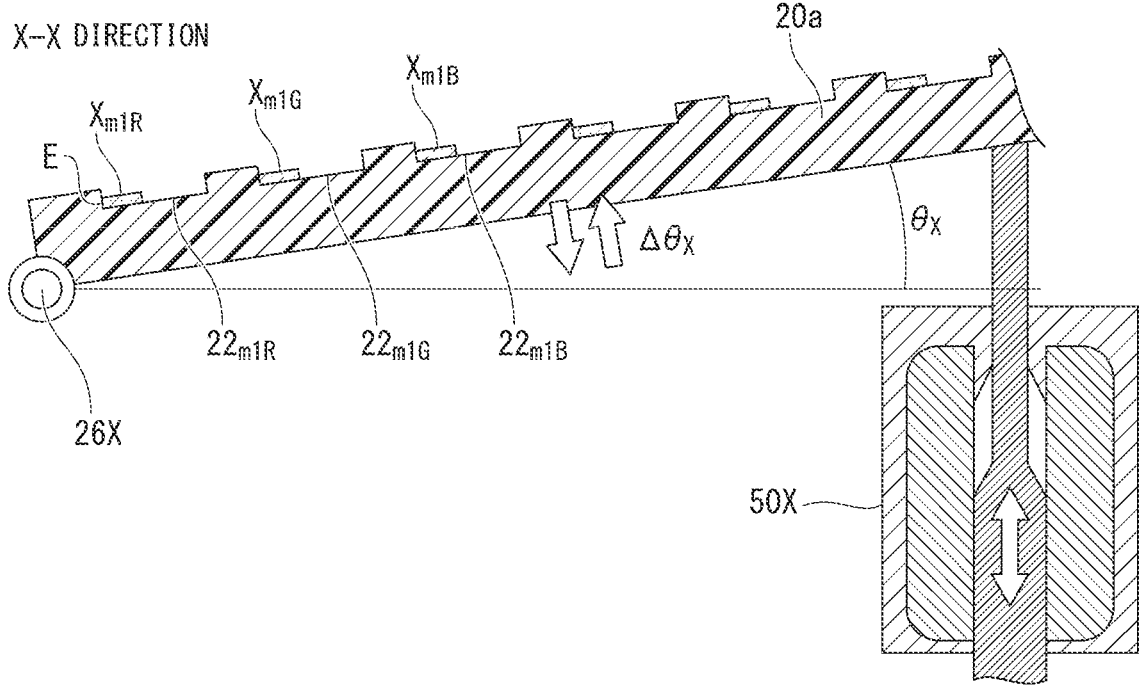
FIG. 5K is a view illustrating a part of the double-axial rocking-drive in a cross-sectional view taken along X-X direction illustrated in FIG. 3A, representing a driving motion of the alignment-assisting tray, interfacing each of the rectangular minute elements with one of the corners in each of the concave cells of the alignment-assisting tray.
Figure 5L:
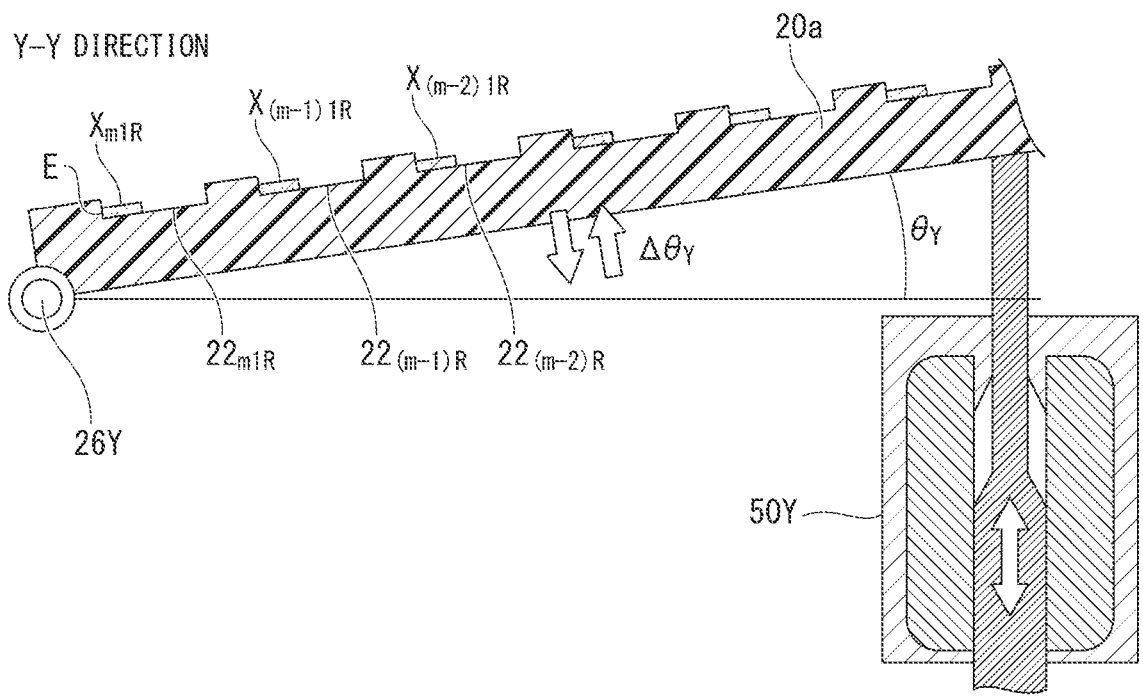
FIG. 5L is a view illustrating another part of the double-axial rocking-drive in a cross-sectional view taken along Y-Y direction illustrated in FIG. 3A, representing a driving motion of the alignment-assisting tray, interfacing each of the rectangular minute elements with one of the corners in each of the concave cells of the alignment-assisting tray.

FIG. 5K is a schematic view illustrating a mechanism in which the alignment-assisting tray 20a is rocking-driven with respect to a pitch axis (transverse axis) 26X, which is disposed at an end portion near the vertex A and orientated along a Y-axis, as a rotational axis. The pitch axis 26X is orientated in a direction to the vertex D from the vertex A illustrated in FIG. 3A. On the other hand, FIG. 5L is a schematic view illustrating a mechanism in which the alignment-assisting tray 20a is rocking-driven with respect to a roll axis (longitudinal axis) 26Y, which is disposed at an end portion near the vertex A and orientated along an X-axis, as a rotational axis. The orientation of the roll axis 26Y lies in a direction along a line running to the vertex B from the vertex A, as illustrated in FIG. 3A. Here, "the pitch axis 26X" and "the roll axis 26Y" are defined by a nomenclature consuetude in technical fields of airplanes, automobiles and others, in which a roll axis is defined along x-axis, a pitch axis is defined along y-axis, and a yaw axis is defined along z-axis, for example. As illustrated in FIG. 5K, always and constantly keeping the horizontal level of the pitch axis 26X as the rotational axis, at lower side, when a pitch-angle rocking-drive unit 50X rock-drives the motion of the alignment-assisting tray 20a, the rectangular elements $X_{m1R}$, $X_{m1G}$ and $X_{m1B}$ are aligned in such a way that each of the MRTBMs, which is defined at one of the convex-ridges in each of the rectangular elements $X_{m1R}$, $X_{m1G}$ and $X_{m1B}$, is displaced to be interfaced with the corresponding interfacing ridge provided at the interfacing corner E defined by vertical sidewall-planes, which intersect each other at 90 degrees, the interfacing corners E are assigned in each of the concave cells $22_{m1R}$, $22_{m1G}$ and $22_{m1B}$.

For example, as illustrated in FIG. 5K, a horizontal level of a side B-C of the alignment-assisting tray 20a, the side B-C is defined along a line toward the vertex C from the vertex B, is raised to incline the alignment-assisting tray 20a, for example, until a pitch angle of the alignment-assisting tray 20a becomes $\theta_X$=40 degrees with respect to a horizontal plane passing through the pitch axis 26X. When the alignment-assisting tray 20a is inclined until the pitch angle becomes $\theta_X$=40 degrees, each of the rectangular elements $X_{m1R}$, $X_{m1G}$ and $X_{m1B}$ illustrated in FIG. 5K is moved along a direction toward the pitch axis 26X, and closely contacted to counterpart sidewalls, which are set parallel to the pitch axis 26X, of each of the concave cells $22_{m1R}$, $22_{m1G}$ and $22_{m1B}$. Moreover, it is allowed to generate a vibrational rocking, for example, between a pitch angle $\theta_X=45$ degrees and a pitch angle $\theta_X=35$ degrees, with an angle $\theta_X=40$ degrees as a center of the vibration. After that, while the inclination of the pitch angle $\theta_X=40$ degrees is kept, as illustrated in FIG. 5L, in such a way that with the roll axis 26Y as a rotational axis, always and constantly keeping a horizontal level of the roll axis 26Y at lower level, a roll-angle rocking-drive unit 50Y rock-drives the motion of the alignment-assisting tray 20a.

For example, as illustrated in FIG. 5L, in such a way that the alignment-assisting tray 20a is inclined, for example, until a roll angle becomes $\theta_Y=40$ degrees with respect to a horizontal plane passing through the roll axis 26Y, a horizontal level of a side D-C, which is oriented toward the vertex C from the vertex D illustrated in FIG. 3A, is raised. When the alignment-assisting tray 20a is inclined until the roll angle becomes $\theta_Y=40$ degrees, keeping the roll axis 26Y at a lower level, each of the rectangular elements $X_{(m-2)1R}$, $X_{(m-1)R}$ and $X_{m1R}$ illustrated in FIG. 5L is moved along a direction toward the roll axis 26Y, and closely contacted to sidewalls parallel to the roll axis 26Y, the sidewalls are assigned to each of the concave cells $22_{(m-2)1R}$, $22_{(m-1)1R}$ and $22_{m1R}$. Moreover, it is allowed to generate a vibrational rocking, for example, between a roll angle $\theta_Y=45$ degrees and a roll angle $\theta_Y=35$ degrees, defining the angle $\theta_Y=40$ degrees as a center of the vibration.

Therefore, from the configuration of the rough arrangement illustrated in FIG. 5J, the double-axial rocking-drive, which uses the pitch axis 26X and the roll axis 26Y, is executed in such a way that the horizontal level of the vertex A is always and constantly kept at lower level. By performing the double-axial rocking-drive, each of the large number of 10,000 to 20,000 pieces, or more than 20,000 pieces of rectangular minute $X_{(m-2)1R}$, $X_{(m-1)1R}$, $X_{m1R}$, $X_{m1G}$, $X_{m1B}$ is aligned in such a way that one of the convex-ridges—the MRTBM—of each of the rectangular elements $X_{(m-2)1R}$, $X_{(m-1)1R}$, $X_{m1R}$, $X_{m1G}$, $X_{m1B}$ is displaced to be interfaced with the corresponding interfacing ridge assigned to the interfacing corner E in each of the concave cells $22_{(m-2)1R}$, $22_{(m-1)1R}$, $22_{m1R}$, $22_{m1G}$, $22_{m1B}$. When the double-axial rocking-drive is performed, the roll rotation with the roll axis 26Y as the rotation axis may be executed first, and the pitch rotation with the pitch axis 26X as the rotation axis may be executed later. Or alternatively, the roll rotation and the pitch rotation may be conducted simultaneously.

Figure 5M:
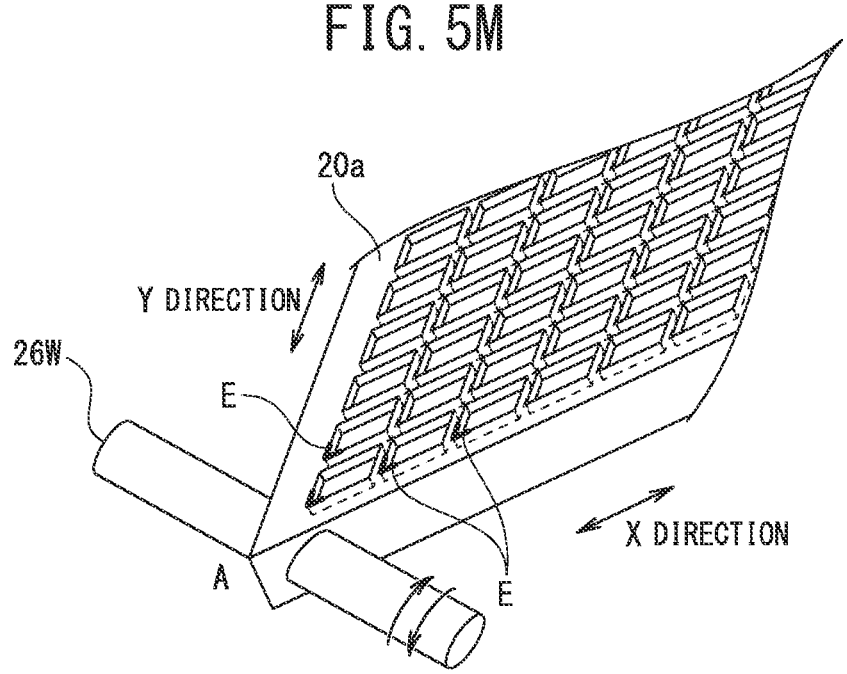
FIG. 5M is a view illustrating an operation of single-axial rocking-drive of the alignment-assisting tray, interfacing each of the rectangular minute elements with the corner of the concave cell of the alignment-assisting tray.

Furthermore, as illustrated in FIG. 5M, a single-axial rocking-drive of the alignment-assisting tray 20a can be conducted by a rocking-drive unit—whose illustration is omitted—. For establishing the single-axial rocking-drive of the alignment-assisting tray 20a, a rotational shaft 26W vertical to a diagonal direction defined in a center of an angle spanning between the X-axis and the Y-axis shall be provided near the vertex A as illustrated in FIG. 5M. And, using the rotational shaft 26W as a rotation axis, always and constantly keeping the horizontal level of the vertex A of the alignment-assisting tray 20a lower than the other vertices B, C and D of the alignment-assisting tray 20a, the single-axial rocking-drive of the alignment-assisting tray 20a can be executed. That is, according to the single-axial rocking-drive, while the rotational shaft 26W is kept parallel to a horizontal plane, and while the rotational shaft 26W is always and constantly kept at lower level, by raising a horizontal level of the diagonal line B-D, which is orientated toward the vertex D from the vertex B, toward upper side, and thereby, inclining the alignment-assisting tray 20a, the MRTBMs assigned to each of the large amount of 10,000 to 20,000 pieces, or more than 20,000 pieces of rectangular minute $X_{qpR}$, $X_{qpG}$ and $X_{qpB}$ are moved to be interfaced with the corresponding interfacing ridges assigned to the interfacing corners E in each of the concave cells $22_{(m-2)1R}$, - - -, $22_{(m-1)1R}$, - - -, $22_{m1R}$, $22_{m1R}$, $22_{m1G}$, $22_{m1B}$. And therefore, it is accordingly possible to achieve the positional arrangement of the great many rectangular elements $X_{qpR}$, $X_{qpG}$ and $X_{qpB}$ with a constant pitch through the single-axial rocking-drive.

Figure 5N:
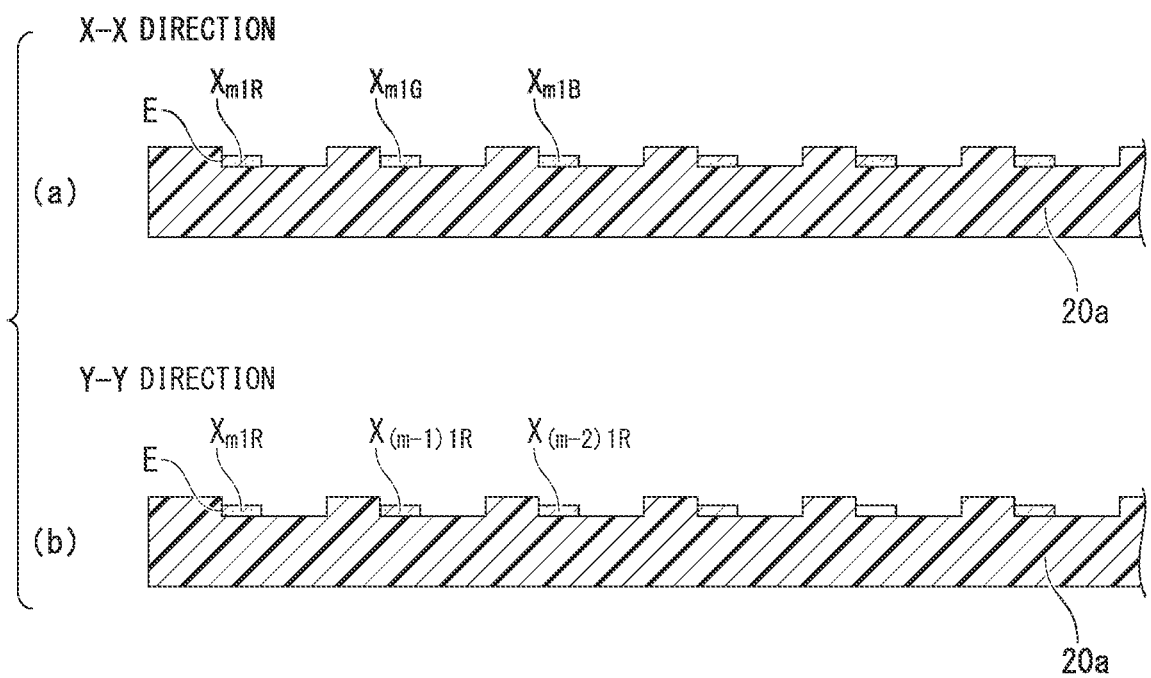
FIG. 5N(a) is a cross-sectional view taken along X-X direction illustrated in FIG. 3A, representing a configuration of the rectangular minute elements being interfaced with one of the corners in each of the concave cells through the operations in FIGS. 5K to 5M.

Although the technical situations and performances are similar for both of the double-axial rocking-drive and the single-axial rock-drive, when the inclinations of the alignment-assisting tray 20a are returned to the horizontal orientation, as illustrated in FIG. 5N(a), with regard to X-X direction, the MRTBMs assigned to each of the rectangular elements $X_{m1R}$, $X_{m1G}$ and $X_{m1B}$ are interfaced with the counterpart interfacing ridges assigned to the interfacing corners E in each of the concave cells $22_{m1R}$, $22_{m1G}$ and $22_{m1B}$. Also, as illustrated in FIG. 5N(b), with regard to Y-Y direction, the MRTBMs assigned to each of the rectangular elements $X_{(m-2)1R}$, $X_{(m-1)1R}$ and $X_{m1R}$ are relocated to be interfaced with the corresponding interfacing ridges assigned to the interfacing corners E in each of the concave cells $22_{(m-2)1R}$, $22_{(m-1)1R}$ and $22_{m1R}$. As illustrated in FIGS. 5K to 5L, by the effect of gravity, the rectangular elements $X_{(m-2)1R}$, - - -, $X_{(m-1)1R}$, - - -, $X_{m1R}$, $X_{m1R}$, $X_{m1G}$, $X_{m1B}$ can be precisely aligned as a batch at identical pitch with the arrangement of the interfacing corners E in each of the concave cells $22_{(m-2)1R}$, - - -, $22_{(m-1)1R}$, - - -, $22_{m1R}$, $22_{m1R}$, $22_{m1G}$, $22_{m1B}$ deployed in the alignment-assisting tray 20a.

Figure 5O:
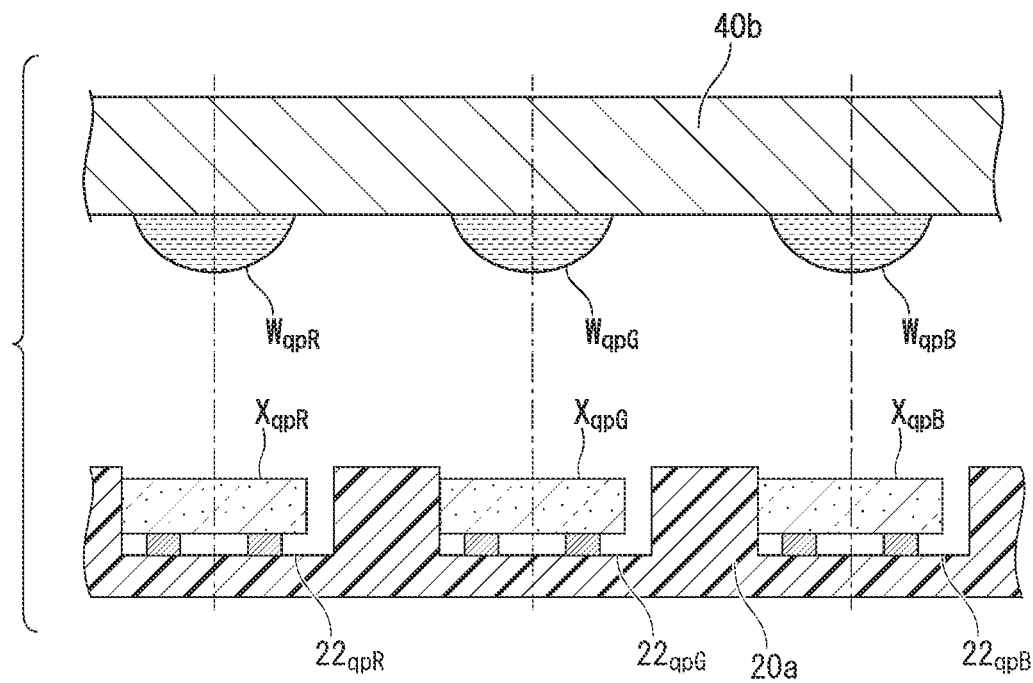
FIG. 5O is a process-flow cross-sectional view illustrating a state in which a second transferring unit is moved to a position above the plurality of rectangular minute elements that are collectively arrayed with a highly minute-and-precise configuration in the alignment-assisting tray.
Figure 5P:
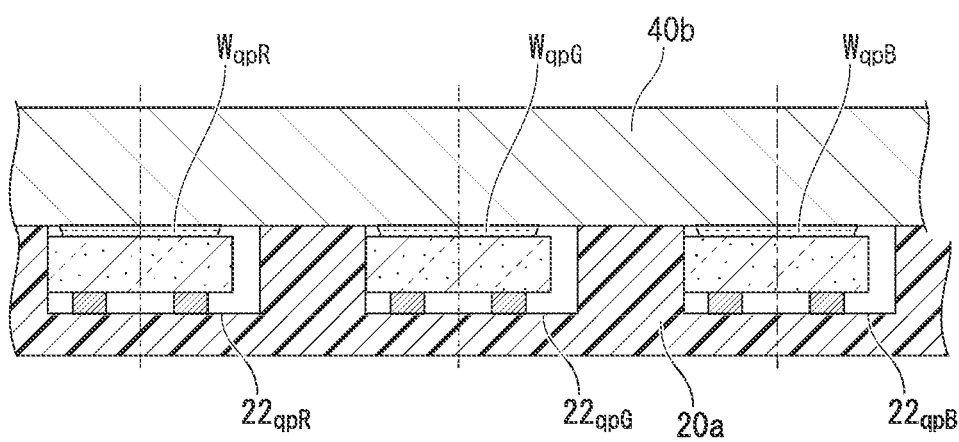
FIG. 5P is a process-flow cross-sectional view explaining a process step at which the second transferring unit picks up the plurality of rectangular minute elements that are collectively arrayed with the highly-minute and precise configuration.

Next, as illustrated in FIG. 5O, a chuck 40b as the second transferring unit 40, the chuck 40b has the structure like the chuck 30a illustrated in FIGS. 4A and 4B, is moved to a position above the rectangular elements $X_{qpR}$, $X_{qpG}$ and $X_{qpB}$, which are stored in the concave cells $22_{qpR}$, $22_{qpG}$ and $22_{qpB}$ deployed in the alignment-assisting tray 20a. Fluid droplets $W_{qpR}$, $W_{qpG}$ and $W_{qpB}$ for picking the rectangular elements $X_{qpR}$, $X_{qpG}$ and $X_{qpB}$, respectively, are adhered to hydrophilic cells of the chuck 40b. And, allocations of the fluid droplets $W_{qpR}$, $W_{qpG}$ and $W_{qpB}$ are designed to be positionally aligned with coordinates of the rectangular elements $X_{qpR}$, $X_{qpG}$ and $X_{qpB}$, respectively. Since the rectangular elements $X_{qpR}$, $X_{qpG}$ and $X_{qpB}$ are arrayed at identical pitch with the arrangement of the interfacing corners E in each of the concave cells $22_{qpR}$, $22_{qpG}$ and $22_{qpB}$, the respective alignment of the allocations of the fluid droplets $W_{qpR}$, $W_{qpG}$ and $W_{qpB}$ with the coordinates of the rectangular elements $X_{qpR}$, $X_{qpG}$ and $X_{qpB}$ can be achieved easily and accurately. After the completion of the respective positional alignment of the fluid droplets $W_{qpR}$, $W_{qpG}$ and $W_{qpB}$ with the coordinates of the rectangular elements $X_{qpR}$, $X_{qpG}$ and $X_{qpB}$, the horizontal level of the chuck 40b is lowered relatively with respect to the top surface of the alignment-assisting tray 20a, as illustrated in FIG. 5P, and the fluid droplets $W_{qpR}$, $W_{qpG}$ and $W_{qpB}$ are closely contacted to the rectangular elements $X_{qpR}$, $X_{qpG}$ and $X_{qpB}$, respectively, and the chuck 40b can accordingly pick up the rectangular elements $X_{qpR}$, $X_{qpG}$ and $X_{qpB}$.

Figure 5Q:
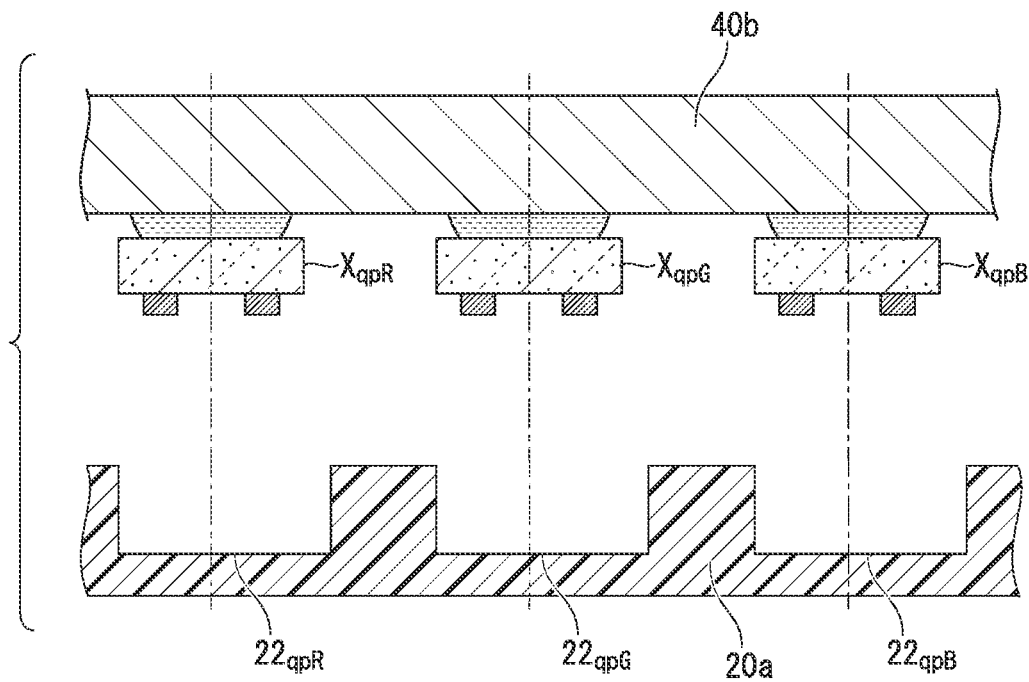
FIG. 5Q is a process-flow cross-sectional view illustrating a state of the plurality of rectangular minute elements being picked up by the second transferring unit, and separated from the alignment-assisting tray.
Figure 5R:
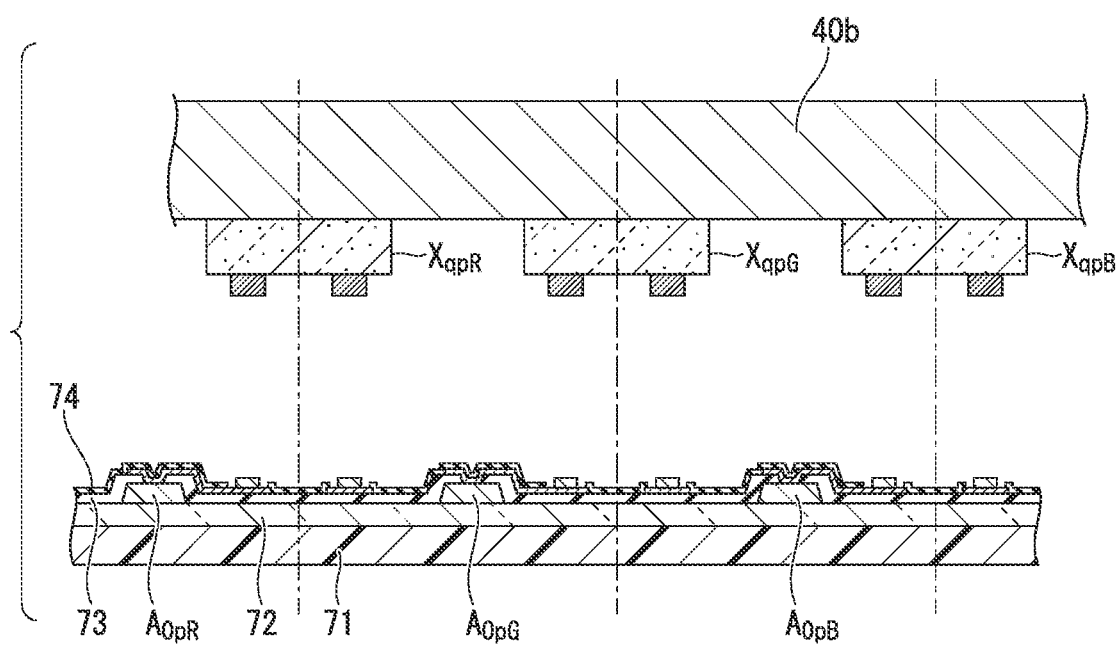
FIG. 5R is a process-flow cross-sectional view illustrating a state of the plurality of rectangular minute elements being held in the second transferring unit, and moved to a position above a mounting board.

After when the chuck 40b picks up the rectangular elements $X_{qpR}$, $X_{qpG}$ and $X_{qpB}$, the horizontal level of the chuck 40b is relatively raised with respect to the top surface of the alignment-assisting tray 20a, and as illustrated in FIG. 5Q, the concave cells $22_{qpR}$, $22_{qpG}$ and $22_{qpB}$, which are deployed in the alignment-assisting tray 20a, become empty. Next, as illustrated in FIG. 5R, the chuck 40b is moved to a position above the mounting board 7 serving as the second base-board. The mounting board 7 as the second base-board may be a target backplane or a re-configuration wafer adapted for manufacturing process of micro-chip display. As explained already with reference to FIGS. 1C and 1D, the anode bump $83_{RA}$ is jointed to the intermediate column wiring $A_{1pR}$ connected to the red column signal-line $A_{0pR}$ in the mounting board 7. Also, the anode bump $83_{RG}$ is jointed to the intermediate column wiring $A_{1pG}$ connected to the green column signal-line $A_{0pG}$, and the cathode bump $83_{RC}$ is jointed to the intermediate row wiring $C_{1qR}$ connected to the column signal-line $C_{0q}$.

According to the process steps illustrated in FIGS. 5K to 5L, because the array of the rectangular elements $X_{qpR}$, $X_{qpG}$ and $X_{qpB}$ is allocated at a precisely defined same pitch, the anode electrode $82_{RA}$ of the rectangular element $X_{qpR}$ can be aligned with a high accuracy of one micrometer or less, facilitating bump-connection of the anode electrode $82_{RA}$ to the anode bump $83_{RA}$. Similarly, the cathode electrode $82_{RC}$ of the rectangular element $X_{qpR}$ is positionally aligned with the high precision, and the bump-connection of the cathode electrode $82_{RC}$ to the cathode bump $83_{RC}$ is facilitated. After the completion of the positional alignment, when the chuck 40b is heated to evaporate the fluid droplets $W_{qpR}$, $W_{qpG}$ and $W_{qpB}$, the rectangular elements $X_{qpR}$, $X_{qpG}$ and $X_{qpB}$ are separated from the chuck 40b, respectively. After the rectangular elements $X_{qpR}$, $X_{qpG}$ and $X_{qpB}$ have been separated from the chuck 40b, the anode electrode $82_{RA}$ of the rectangular element $X_{qpR}$ and the anode bump $83_{RA}$ are bump-connected to each other, and the cathode electrode $82_{RC}$ of the rectangular element $X_{qpR}$ and the cathode bump $83_{RC}$ are bump-connected to each other, by applying supersonic wave or heating to the rectangular element $X_{qpR}$, the anode bump $83_{RA}$ and the cathode bump $83_{RC}$, and others. Simultaneously, the anode electrode $82_{GA}$ of the rectangular element $X_{qpG}$ and anode bump $83_{GA}$ are mutually bump-connected. By the way, for evaporating the fluid droplets $W_{qpR}$, $W_{qpG}$ and $W_{qpB}$, it is possible to use the thermal energy dissipated in the heating process of the bump connection.

Therefore, according to the alignment method pertaining to the first embodiment, a highly-minute work for collectively aligning the large number of 10,000 to 20,000 pieces, or more than 20,000 pieces of rectangular minute $X_{qpR}$, $X_{qpG}$ and $X_{qpB}$ can be conducted easily with the high precision by using the alignment-assisting tray 20a, and the great many rectangular elements are arrayed at the same pitch. Thus, it is possible to establish the highly minute-and-precise assembling technology, in which a procedure for positionally aligning the large number of rectangular elements $X_{qpR}$, $X_{qpG}$ and $X_{qpB}$ to the pattern of the mounting board 7 can be executed with a higher precision. And therefore, the assembling of the hybrid integrated circuit can be achieved through a simple apparatus configuration, without dropping the fabrication yield and the throughput.

Second Embodiment

Although the illustration is omitted, as a rough sketch, an alignment-control apparatus pertaining to a second embodiment of the present invention is almost same as the alignment-control apparatus of the first embodiment. Namely, resembling the structure illustrated in FIG. 2, the alignment-control apparatus pertaining to the second embodiment encompasses an alignment-assisting tray 20b used to collectively align the elements $X_{qpR}$, $X_{qpG}$ and $X_{qpB}$ with the highly-minute scheme, a first transferring unit for collectively transporting the roughly-aligned rectangular elements $X_{qpR}$, $X_{qpG}$ and $X_{qpB}$ to the concave cells of the alignment-assisting tray 20b, a second transferring unit for collectively transporting the elements $X_{qpR}$, $X_{qpG}$ and $X_{qpB}$, which are precisely aligned as a batch with a highly-minute configuration, from the alignment-assisting tray 20b, a driving unit 50 for driving a motion of the alignment-assisting tray 20b to collectively align the elements $X_{qpR}$, $X_{qpG}$ and $X_{qpB}$ with the high-precision pitch and the highly-minute geometry, and a controlling circuit for controlling the operations of the first transferring unit, the second transferring unit and the driving unit 50. However, as to the structure, the alignment-assisting tray 20b pertaining to the second embodiment differs from the alignment-assisting tray 20a of the first embodiment.

Figure 6:
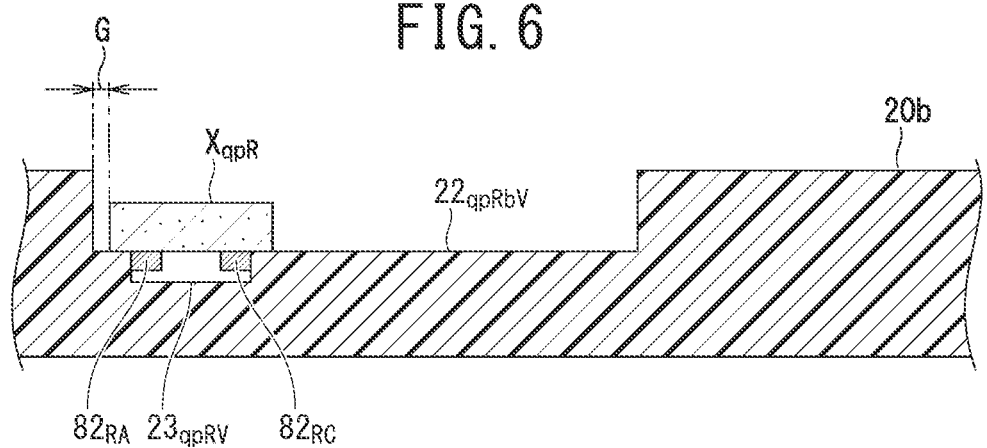
FIG. 6 is a schematic cross-sectional view explaining a rough sketch of a structural feature of an alignment-assisting tray pertaining to a second embodiment of the present invention.

Although the illustration of whole view is omitted, a shape of the alignment-assisting tray 20b pertaining to the second embodiment is a rectangle having quadruple vertices A, B, C and D, like the structure in the perspective view illustrated in FIG. 3A. Moreover, the same feature of the waffle-like structure, such that at and in one of the main-surfaces of the rectangle, rectangular concave cells are cut to be arranged in the shape of matrix illustrated in FIG. 3B is hold for the structure of the alignment-assisting tray 20b pertaining to the second embodiment. However, as illustrated in FIG. 6, a bottom of each of the concave cells $22_{qpRbv}$ further encompasses a rectangular parallelepiped recess $23_{qpRV}$ for positioning one of the convex-ridges of the anode electrode $82_{RA}$ or cathode electrode $82_{RC}$ of the element $X_{qpR}$. A requirement that each of the diagonal lengths of the concave cell $22_{qpRbv}$, which are deployed in the alignment-assisting tray 20b viewed on a planar pattern, shall be designed to have a length longer by 50 percent or more than each of the diagonal lengths of the corresponding elements $X_{qpR}$ in a corresponding direction is same as the first embodiment.

Although a bottom view is omitted, each of the anode electrodes $82_{RA}$ and each of the cathode electrode $82_{RC}$ are thin rectangular parallelepiped patterns, and the patterns are congruent to each other. Each of the anode electrodes $82_{RA}$ and each of the cathode electrode $82_{RC}$ are the electrodes that have quadruple side planes, each of which constructing a convex-ridge defined by adjacent side planes, the adjacent side planes mutually intersect at a right angle. "The convex-ridge" is a protrusion established by side planes, which are adjacent each other, so that a free space can be exist on the outside of the side planes. In FIG. 6, the side planes respectively along shorter sides of the anode electrode $82_{RA}$ and the cathode electrode $82_{RC}$ are assumed to be represented on the cross-sectional view. Thus, the side planes along the longer sides of the rectangle implementing each of the anode electrodes $82_{RA}$ and the cathode electrode $82_{RC}$ shall extend along a direction vertical to a paper surface. Although subscript R of "the element $X_{qpR}$" indicates red, the element $X_{qpR}$ illustrated in FIG. 6 inclusively indicates many chips of the triple color categories, which are composed of the red LED chip $X_{qpR}$, the green LED chip $X_{qpG}$ and the blue LED chip $X_{qpB}$ illustrated in FIGS. 1A to 1D. That is, because there is a presumption that the elements $X_{qpG}$ and the element $X_{qpB}$ and others are existing in addition to the element $X_{qpR}$ illustrated in FIG. 6, the element $X_{qpR}$ is a representative minute chip selected as a representative among 10,000 to 20,000 pieces or more than 20,000 pieces of minute chips covering the triple color categories.

FIG. 6 illustrates a configuration in which one of the side planes along the longer sides of the anode electrode $82_{RA}$—the left side plane of the anode electrode $82_{RA}$ illustrated in FIG. 6—is in contact with a vertical inner-wall located on the left side of the recess $23_{qpRV}$. The recess $23_{qpRV}$ is the shallow rectangular parallelepiped whose planar pattern is rectangular. It is designed that an area of the rectangle as the planar pattern of the recess $23_{qpRV}$ is larger than a counterpart area occupied by the anode electrode $82_{RA}$ and the cathode electrode $82_{RC}$, respectively. Clearance is provided around the anode electrode $82_{RA}$ and the cathode electrode $82_{RC}$, so that the patterns of the anode electrode $82_{RA}$ and the cathode electrode $82_{RC}$ can be installed in the recess $23_{qpRV}$. Due to the geometry of the rectangular parallelepiped, each of the adjacent double inner-walls among the quadruple inner-walls of the recess $23_{qpRV}$ define a concave-ridge. "The concave-ridge" is an intersection line generated by double planes of inner-walls mutually intersecting so that a free space can exist in the inner side of the mutually intersecting inner-walls. Although FIG. 1D has illustrated the anode electrode $82_{RA}$ of the minute element $X_{qpR}$, as a matter of course, anode electrodes and cathode electrodes which are equal in size with identical shape to the anode electrode $82_{RA}$ and the cathode electrode $82_{RC}$, respectively, shall be provided on the bottom surfaces of the green LED chips $X_{qpG}$ and blue LED chips $X_{qpB}$, respectively, whose illustration is omitted. Thus, as to the anode electrodes and the cathode electrodes which are provided on the bottom surfaces of the green LED chips $X_{qpG}$ and the blue LED chips $X_{qpB}$, whose illustration is omitted, required clearances are prepared around the anode electrodes and the cathode electrodes, and the similar recess are allocated to each of the green LED chips $X_{qpG}$ and the blue LED chips $X_{qpB}$.

Regarding the planar pattern, for example, a diagonal length of the rectangle defining the planar pattern of the recess $23_{qpRV}$ is longer by about one micrometer than a corresponding diagonal length, which is measured from a vertex of the anode electrode $82_{RA}$, configured to interface with the concave-ridge defined by the vertical inner-walls of the recess $23_{qpRV}$, to a farthest vertex of the cathode electrode $82_{RC}$. The alignment-assisting tray $20a$ of the first embodiment has the interfacing corner E at a side near to the vertex A of the rectangle, to the interfacing corner E one of the convex-ridges of the rectangular element $X_{qpR}$ is scheduled to be interfaced. The interfacing corner E was assigned as the corner defined by the vertical sidewall-planes extending in the X-axis and Y-axis directions, and the vertical sidewall-planes intersecting with each other at right angle. However, although the fundamental idea of the alignment-assisting tray $20b$ pertaining to the second embodiment lies in the structure analogous to the structure illustrated in FIG. 3B, the alignment-assisting tray $20b$ differs from the first embodiment, in that the convex-ridge of the element $X_{qpR}$ is designed not to be interfaced with the interfacing corner E employed by the first embodiment. Also, a depth of the recess $23_{qpRV}$ is designed to be deeper than a thickness of each of the anode electrodes $82_{RA}$ and the cathode electrode $82_{RC}$.

In a technology for manufacturing minute chips having the anode electrodes $82_{RA}$ and the cathode electrodes $82_{RC}$ such as the elements $X_{qpR}$, there is a problem that chip sizes are varied by several percent due to process variations in dicing process. Due to the problem of variations in the chip sizes, even if a plurality of elements $X_{qpR}$ are tentatively arrayed at the same pitch, the highly minute-and-precise position-alignment between the anode electrode $82_{RA}$ and anode bump $83_{RA}$ of the element $X_{qpR}$ is not insured at the process step illustrated in FIG. 5R. Similarly, the highly minute-and-precise position-alignment between the cathode electrode $82_{RC}$ and the cathode bump $83_{RC}$ are is not insured at the process step illustrated in FIG. 5R due to the variations of the chip sizes. Therefore, according to the alignment-assisting tray $20b$ pertaining to the second embodiment, the highly minute-and-precise position-alignment can be carried out by mating the convex-ridge of the anode electrode $82_{RA}$ or cathode electrode $82_{RC}$ to the concave-ridge of the recess $23_{qpRV}$, by cutting the recess $23_{qpRV}$ at a corresponding position adapted for installing the anode electrode $82_{RA}$ or cathode electrode $82_{RC}$. That is, according to the alignment-assisting tray $20b$ pertaining to the second embodiment, the actual interfacing corner E is allocated at a concave-ridge of the recess $23_{qpRV}$, at the concave-ridge the adjacent inner-walls of the recess $23_{qpRV}$ intersect each other.

In the alignment-assisting tray $20b$ pertaining to the second embodiment, the maximum and minimum values of the variations in a chip size $X_0$ in an X-direction are assumed to be represented by the following equations:

$$X_0 + \Delta X_1 \quad (1a)$$

$$X_0 - \Delta X_2 \quad (1b)$$

$$\Delta X_1 \fallingdotseq \Delta X_2 \quad (1c)$$

In conditions that there are the variations $\Delta X_1$ and $\Delta X_2$ in the chip size $X_0$, when the end plane of the element $X_{qpR}$, the end plane implements a side surface of the element $X_{qpR}$, is brought into contact with the sidewall of the concave cell $22_{qpRbv}$, the highly minute-and-precise position-alignment between the anode electrode $82_{RA}$ and anode bump $83_{RA}$ of the element $X_{qpR}$ and the highly minute-and-precise position-alignment between the cathode electrode $82_{RC}$ and the cathode bump $83_{RC}$ are not insured. Thus, it is necessary to set a gap G that prevents the end plane of the element $X_{qpR}$ from being brought into contacted with the sidewall of the concave cell $22_{qpRbv}$. Under a condition that an end plane of the anode electrode $82_{RA}$ or cathode electrode $82_{RC}$ of the element $X_{qpR}$ is separated by a distance $a_1$ from a chip edge of the element $X_{qpR}$, when the gap G between the vertical inner-wall on the left of the recess $23_{qpRV}$ and the concave cell $22_{qpRbv}$ is prepared according to the following Eq. (2), the end plane of the element $X_{qpR}$ can be prevented from being brought into contact with the sidewall of the concave cell $22_{qpRbv}$, the end plane implements a side surface of the element $X_{qpR}$, even if there are variations $\Delta X_1$ and $\Delta X_2$ in the chip sizes. The situations along Y-direction are also similar. Moreover, the anode and cathode electrodes of the green LED chips $X_{qpG}$ and the blue LED chips $X_{qpB}$ are also similar, although illustrations are omitted.

$$G \sim a_1 + \Delta X_1 / 2 \quad (2)$$

The process steps illustrated in FIGS. 5A to 5J of the alignment method of the first embodiment are equal to the alignment method pertaining to the second embodiment. After the process step illustrated in FIG. 5J in the first embodiment, the alignment method pertaining to the second embodiment rock-drives the alignment-assisting tray $20b$ by using the pitch-angle rocking-drive unit in such a way that a horizontal level of a pitch axis as the rotational shaft is always and constantly kept at lower level, similarly to the configuration illustrated in FIG. 5K. By rock-driving the motions of the alignment-assisting tray $20b$, the plurality of elements $X_{qpR}$ are aligned in such a way that the end planes of each anode electrodes $82_{RA}$ in the elements $X_{qpR}$ are in contact with the vertical inner-walls of the recesses $23_{qpRV}$, which are allocated in each of the concave cells $22_{qpRbv}$. In addition, although FIG. 6 illustrates a configuration that the end plane of the anode electrode $82_{RA}$ in the element $X_{qpR}$ is in contact with the vertical inner-wall of the recess $23_{qpRV}$ in the concave cell $22_{qpRbv}$, the configuration illustrated in FIG. 6 is merely an example. According to designs of the element $X_{qpR}$, if the cathode electrode $82_{RC}$ is located on the left side of the anode electrode $82_{RA}$ as to the configuration illustrated in FIG. 6, as a matter of course, the end plane of the cathode electrode $82_{RC}$ shall be brought into contact with the vertical inner-wall of the recess $23_{qpRV}$.

Anyway, according to the alignment-assisting tray 20b pertaining to the second embodiment, the end planes or the side planes of the plurality of elements $X_{qpR}$, which implement side surfaces of the elements $X_{qpR}$, are not brought into contact with the sidewalls of the recesses $23_{qpRV}$, as illustrated in FIG. 6. For example, similarly to the configuration illustrated in FIG. 5K, the horizontal level of the side B-C, which is oriented along the line toward the vertex C from the vertex B, is raised to incline the alignment-assisting tray 20b, for example, until the pitch angle becomes $\theta_X=40$ degrees with respect to the horizontal plane passing through the pitch axis. When the alignment-assisting tray 20b is inclined until the pitch angle becomes $\theta_X=40$ degrees, the end planes of the anode electrodes $82_{RA}$ in each of the elements $X_{qpR}$ illustrated in FIG. 5K are moved along a direction toward the pitch axis, thereby the end planes the anode electrodes $82_{RA}$ are closely contacted respectively to the vertical inner-walls of the recesses $23_{qpRV}$ allocated in each of the concave cells $22_{qpRbv}$. Moreover, with the angle $\theta_X=40$ degrees as a vibrational rotation center, the inclination may be vibrated, for example, between the pitch angle $\theta_X=45$ degrees and the pitch angle $\theta_X=35$ degrees. After that, while the inclination of the pitch angle $\theta_X=40$ degrees is kept, similarly to the configuration illustrated in FIG. 5L, in such a way that the horizontal level of the roll axis is always and constantly kept at lower level, and employing the roll axis as a rotational axis, the roll-angle rocking-drive unit rock-drives the motion of the alignment-assisting tray 20b.

For example, similarly to the configuration illustrated in FIG. 5L, the horizontal level of the side D-C, which is oriented along the line toward the vertex C from the vertex D, is raised to incline the alignment-assisting tray 20b, for example, until the roll angle becomes $\theta_Y=40$ degrees with respect to the horizontal plane passing through the roll axis. Keeping the horizontal level of the roll axis at lower side, if the alignment-assisting tray 20b is inclined until the roll angle becomes $\theta_Y=40$ degrees, the end planes of the anode electrodes $82_{RA}$ in each of the elements $X_{qpR}$ illustrated in FIG. 5L are moved along a direction toward the roll axis, and therefore, the end planes are closely contacted to the vertical inner-walls of the recesses $23_{qpRV}$ allocated in each of the concave cells $22_{qpR}$. Moreover, with the angle $\theta_Y=40$ degrees as a vibrational rotation center, the inclination may be vibrated, for example, between the roll angle $\theta_Y=45$ degrees and the roll angle $\theta_Y=35$ degrees.

Therefore, from the configuration of the rough arrangement illustrated in FIG. 5J, the double-axial rocking-drive with the pitch axis and the roll axis is performed, while the horizontal level of the vertex A, which is defined in the alignment-assisting tray 20b, is always kept at the lower side. By executing the double-axial rocking-drive, each of the large number of 10,000 to 20,000 pieces or more than 20,000 pieces of elements $X_{qpR}$ is aligned in such a way that each of the end planes of the anode electrodes $82_{RA}$ is interfaced with the counterpart concave-ridge, at which the vertical inner-walls of the recess $23_{qpRV}$ allocated in each of the recesses $23_{qpR}$ intersect each other. When the double-axial rocking-drive is performed, the roll rotation with respect to the roll axis as the center of rotation may be executed first, and the pitch rotation with respect to the pitch axis as the center of rotation may be executed later, or alternatively, the roll and pitch rotations may be conducted simultaneously. Or, similarly to the configuration illustrated in FIG. 5M, the rotational shaft 26W vertical to the diagonal direction, which is oriented along a line defined in an angle between the X-axis and the Y-axis, is provided near the vertex A, and in such a way that with the rotational shaft 26W as the center of rotation, while the horizontal level of the vertex A being kept lower than the other vertices B, C and D, the rocking-drive unit—whose illustration is omitted—may be used to perform the single-axial rocking-drive of the alignment-assisting tray 20b. Therefore, similarly to the configurations illustrated in FIGS. 5K to 5N, by the effect of gravity, the anode electrodes $82_{RA}$ of the elements $X_{qpR}$ can be precisely aligned as a batch. Then, the highly-minute configuration defined by identical pitch is achieved, with the arrangement of the vertical inner-walls of the recesses $23_{qpRV}$ allocated in each of the concave cells $22_{qpR}$, which are deployed in the alignment-assisting tray 20b. The process steps after the elements $X_{qpR}$ have been precisely aligned as a batch with a highly-minute configuration, are substantially equal to the flow of the process steps already explained with reference to FIGS. 5O to 5R in the alignment method of the first embodiment. Thus, the duplicate explanation is omitted.

According to the alignment method pertaining to the second embodiment, the highly minute-and-precise assembling technology for assembling the large number of 10,000 to 20,000 pieces or more than 20,000 pieces of elements $X_{qpR}$, $X_{qpG}$ and $X_{qpB}$ can be achieved, by using the alignment-assisting tray 20b. That is, the large number of elements $X_{qpR}$, $X_{qpG}$ and $X_{qpB}$ can be collectively transported as a batch with a highly minute-and-precise configuration, even if the various values exist in the chip sizes due to the process variation in the dicing. Thus, even if there are the variations in the chip sizes, it is possible to establish the highly minute-and-precise assembling technology, which can perform the positional alignment with the high precision under the simple apparatus configuration. Therefore, the alignment method pertaining to the second embodiment can achieve the batch alignment that is excellent in two-dimensional pitch accuracy and high in spatial definition, without dropping the fabrication yield and the throughput.

Also, according to the alignment-assisting tray, the alignment-control apparatus and the alignment method pertaining to the second embodiment, the elements $X_{qpR}$, $X_{qpG}$ and $X_{qpB}$ can be positionally aligned at once, and the production throughput is not reduced. For example, if the alignment-assisting tray, the alignment-control apparatus and the alignment method pertaining to the second embodiment are combined with a parallel processing scheme, 90 sheets/hour—one sheet/40 seconds—can be achieved as the production throughput. Even if the time loss of ten percent is assumed to be include at each of the process steps in the process flow illustrated in FIGS. 5A to 5O, a production throughput of 70 to 80 sheets/hour has been confirmed with a prototype alignment-control apparatus. By minimizing the time loss at each of the process steps and optimizing the time required for each of the process steps, it is possible to sufficiently make the production throughput of 100 sheets/hour or more than 100 sheets/hour.

The alignment method of the first embodiment has been explained under the presumption that the element $X_{qpR}$ has the shape of the rectangular parallelepiped. However, according to the alignment method pertaining to the second embodiment, the element $X_{qpR}$ may have solid shapes of polygonal prism or cylinder other than the rectangular parallelepiped. According to the alignment method pertaining to the second embodiment, in a case that the element $X_{qpR}$ has the cylindrical shape, even if one of genetrices implementing the side surface of the cylindrical shape will become close to a proximity of the vertical sidewall-plane extending along the X-axis direction, and the other genetrix of the cylindrical shape will become close to a proximity of the vertical sidewall-plane extending along the Y-axis direction, but the genetrices of the cylindrical shape shall never be brought into contact with the vertical sidewall-plane. That is, in a configuration that the element $X_{qpR}$ is cylindrical shape, at the interfacing corner E, the side surface of the cylindrical shape become in proxemic state that is almost inscribed at two locations. However, the side surface is never brought into contact. In the alignment method of the first embodiment, when the element $X_{qpR}$ has the cylindrical shape, the side surface of the cylindrical shape will be inscribed at two locations with the interfacing corner E. However, regarding a central axis of the cylindrical shape, there is rotational degrees of freedom. In the alignment method pertaining to the second embodiment, even in a configuration that the side surface of the cylindrical shape will become close to the interfacing corner E at the two locations, as illustrated in FIG. 6, it is possible to accurately control both of the pattern position of the anode electrode $82_{RA}$ or cathode electrode $82_{RC}$ and the direction of orientation of the anode electrode $82_{RA}$ or cathode electrode $82_{RC}$, by cutting the recess $23_{qpRV}$, which has the vertical inner-walls scheduled to be interfaced with the convex-ridge of the anode electrode $82_{RA}$ or cathode electrode $82_{RC}$ of the element $X_{qpR}$, in and at the bottom of the concave cell $22_{qpRbv}$.

In the alignment method of the first embodiment, as exemplified in FIGS. 3A and 3B, the shapes of the concave cells $22_{(m-2)1R}$, - - - , $22_{(m-1)1R}$, - - - , $22_{m1R}$, $22_{m1G}$, $22_{m1B}$ of the alignment-assisting tray 20a were assumed to be the rectangular parallelepiped, while the inner volumes of the rectangular parallelepiped were assumed to have larger sizes than the rectangular elements $X_{(m-2)1R}$, - - - , $X_{(m-1)1R}$, - - - , $X_{m1R}$, $X_{m1G}$, $X_{m1B}$. However, when the element $X_{qpR}$ has a cylindrical shape, the sidewall of the recess $23_{qpRV}$ may have a cylindrically curved surface. When the element $X_{qpR}$ has solid shapes of polygonal prisms such as a pentagonal or hexagonal prism, the sidewalls of the recess $23_{qpRV}$ may be implemented by the sidewalls of a corresponding polygonal prism, which is homothetic to the solid shape of the element $X_{qpR}$. Also, the condition required in the alignment method of the first embodiment is said of the homothetic non-rectangular prisms, and the sizes of the recesses $23_{qpRV}$ shall be larger than the size of each of various elements $X_{qpR}$ of the non-rectangular prisms.

Variation of Second Embodiment

Figure 7:
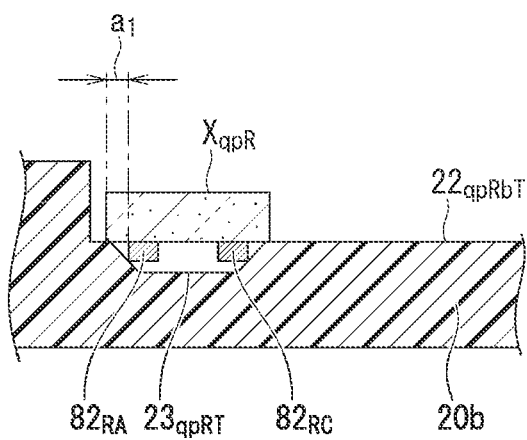
FIG. 7 is a schematic cross-sectional view explaining a rough sketch of a structural feature of an alignment-assisting tray pertaining to a variation of the second embodiment of the present invention.

Although the illustration of overall view is omitted, a fundamental shape of an alignment-assisting tray 20c pertaining to a variation of the second embodiment is a waffle-like structure, in which rectangular concave cells $22_{qpRbT}$ are arranged in a shape of matrix at and in one of main-surfaces of the rectangular alignment-assisting tray 20c having quadruple vertices A, B, C and D, resembling the structure of the perspective view illustrated in FIG. 3A. However, as illustrated in FIG. 7, the alignment-assisting tray 20c pertaining to the variation of the second embodiment further encompasses an inverted truncated pyramidal recess $23_{qpRT}$ for positioning anode electrode $82_{RA}$ or cathode electrode $82_{RC}$ of the element $X_{qpR}$ at the bottom of each of the concave cells $22_{qpRbT}$. Although subscript R of "the element $X_{qpR}$" illustrated in FIG. 7 indicates red, like the explanation that has referred to FIG. 6, the element $X_{qpR}$ merely indicates a representative element, which inclusively encompasses a great many chips including the set of triple color chips that construct each of the pixels, the triple color chips are implemented by the red LED chips $X_{qpR}$, the green LED chips $X_{qpG}$ and the blue LED chips $X_{qpB}$ illustrated in FIGS. 1A to 1D. Therefore, many other chips building up each of the pixels are supposed to be installed in each of the concave cells in the alignment-assisting tray 20c pertaining to the variation of the second embodiment. In addition, each of the anode electrodes $82_{RA}$ and the cathode electrodes $82_{RC}$ has a thin rectangular parallelepiped pattern in plan view, and the rectangular parallelepiped planar patterns are congruent to each other. In FIG. 7, a side plane along the shorter sides of each of the anode electrodes $82_{RA}$ and a side plane along the shorter sides of each of the cathode electrodes $82_{RC}$ are appearing respectively on the cross-sectional view. And, FIG. 7 illustrates a configuration in which one of the edges along the longer sides of the anode electrode $82_{RA}$—the left edge illustrated in FIG. 7—is in contact with an inclined inner-wall (tapered surface) located on the left of the recess $23_{qpRT}$.

The recess $23_{qpRT}$ of the alignment-assisting tray 20c pertaining to the variation of the second embodiment is a thin inverted truncated pyramid in which a planar pattern of a bottom surface is rectangular. In the inverted truncated pyramid, a larger top surface is located on the upper side, and a smaller bottom surface is located on the lower side. A rectangle serving as the top surface of the inverted truncated pyramid is an oblong shape that has a larger occupied area than each of the anode electrodes $82_{RA}$ and the cathode electrode $82_{RC}$. At a horizontal level of a position of the top surface, clearance exists around the anode electrode $82_{RA}$ and the cathode electrode $82_{RC}$. However, it is designed that, as becoming descent along an inclined inner-wall of the inverted truncated pyramid, an edge of a pattern of each of the anode electrodes $82_{RA}$ and the cathode electrode $82_{RC}$ becomes brought into contact with the inclined inner-wall of the inverted truncated pyramid on the way of the inclined inner-wall, and interfaced with the inclined inner-wall.

For example, a diagonal length of a rectangle defined at the top surface of the inverted truncated pyramid is longer by about one micrometer than a diagonal length measured from "a nearest vertex" of the anode electrode $82_{RA}$, the nearest vertex corresponds to one of the vertices of the rectangle of the anode electrode $82_{RA}$ located at a position nearest to the inclined inner-wall at the top surface of the inverted truncated pyramid, to a counterpart farthest vertex of the cathode electrode $82_{RC}$. However, as becoming descent along the inclined inner-wall (tapered surface) of the inverted truncated pyramid, the clearance around the anode electrode $82_{RA}$ and the cathode electrode $82_{RC}$ becomes lost. A depth of the recess $23_{qpRT}$ is also designed to be deeper than a thickness of each of the anode electrodes $82_{RA}$ and the cathode electrodes $82_{RC}$.

Looking like the configuration illustrated in FIG. 5K, regarding the pitch axis serving as the rotational axis, the pitch-angle rocking-drive unit rock-drives the motion of the alignment-assisting tray 20c, while the horizontal level of the pitch axis is always and constantly kept at lower level. By rock-driving the motions of the alignment-assisting tray 20c, a plurality of elements $X_{qpR}$ are aligned so that edges of each of the anode electrodes $82_{RAC}$ or the cathode electrode $82_{RC}$ of the elements $X_{qpR}$ are brought into contact with corresponding inclined sidewalls of the counterpart recesses $23_{qpRT}$ allocated in each of the concave cell $22_{qpRbT}$. For example, similarly to the configuration illustrated in FIG. 5K, the horizontal level of the side B-C, which is oriented along the line toward the vertex C from the vertex B, is raised to incline the alignment-assisting tray 20c, until the pitch angle becomes $\theta_X$=40 degrees with respect to the horizontal plane passing through the pitch axis. When the alignment-assisting tray 20c is inclined until the pitch angle becomes $\theta_X$=40 degrees, the edges of each of the anode electrodes $82_{RA}$ and the cathode electrode $82_{RC}$ of the element $X_{qpR}$ illustrated in FIG. 5K are moved along a direction toward the pitch axis so as to be closely contacted to the inclined sidewalls of the recesses $23_{qpRT}$ allocated in each of the concave cell $22_{qpR}$. Moreover, it is allowed to cause vibrational rocking, for example, between the pitch angle $\theta_X$=45 degrees and the pitch angle $\theta_X$=35 degrees, defining the angle $\theta_X$=40 degrees as a center angle of the vibrational rocking.

After that, while the inclination of the pitch angle $\theta_X$=40 degrees is kept, similarly to the configuration illustrated in FIG. 5L, regarding the roll axis serving as the rotational axis, the roll-angle rocking-drive unit rock-drives the motion of the alignment-assisting tray 20c, while keeping always the horizontal level of the roll axis at lower level constantly. Accordingly, the edges of each of the anode electrodes $82_{RA}$ or the cathode electrodes $82_{RC}$ in the element $X_{qpR}$ are moved to the direction of the roll axis to be closely contacted to the inclined sidewalls of the recesses $23_{qpRT}$ allocated in each of the concave cells $22_{qpR}$. However, according to the concave cells of the alignment-assisting tray 20c pertaining to the variation of the second embodiment, the anode electrodes $82_{RA}$ or the cathode electrodes $82_{RC}$ assigned to the elements $X_{qpR}$ can be interfaced with desirable positions only by the rocking-drive around the pitch angle, due to the geometrical property of the inclined sidewalls of the inverted truncated pyramid. Or, similarly to the configuration illustrated in FIG. 5M, when the rotational shaft 26W vertical to the diagonal direction oriented along a line defined in an angle between the X-axis and the Y-axis is provided near the vertex A, and with respect to the rotational shaft 26W as a rotation axis, the rocking-drive unit—whose illustration is omitted—may drive the motion of the alignment-assisting tray 20c in the single-axial rocking-drive mode, while the horizontal level of the vertex A being kept always lower than the other vertices B, C and D. Therefore, the anode electrodes $82_{RA}$ or cathode electrodes $82_{RC}$ of the elements $X_{qpR}$ can be precisely aligned as a batch by the effect of gravity, at identical pitch defined by the arrangement of the inclined inner-walls of the recesses $23_{qpRT}$ allocated in each of the concave cells $22_{qpR}$, which are cut in the alignment-assisting tray 20c.

Third Embodiment

Figure 8:
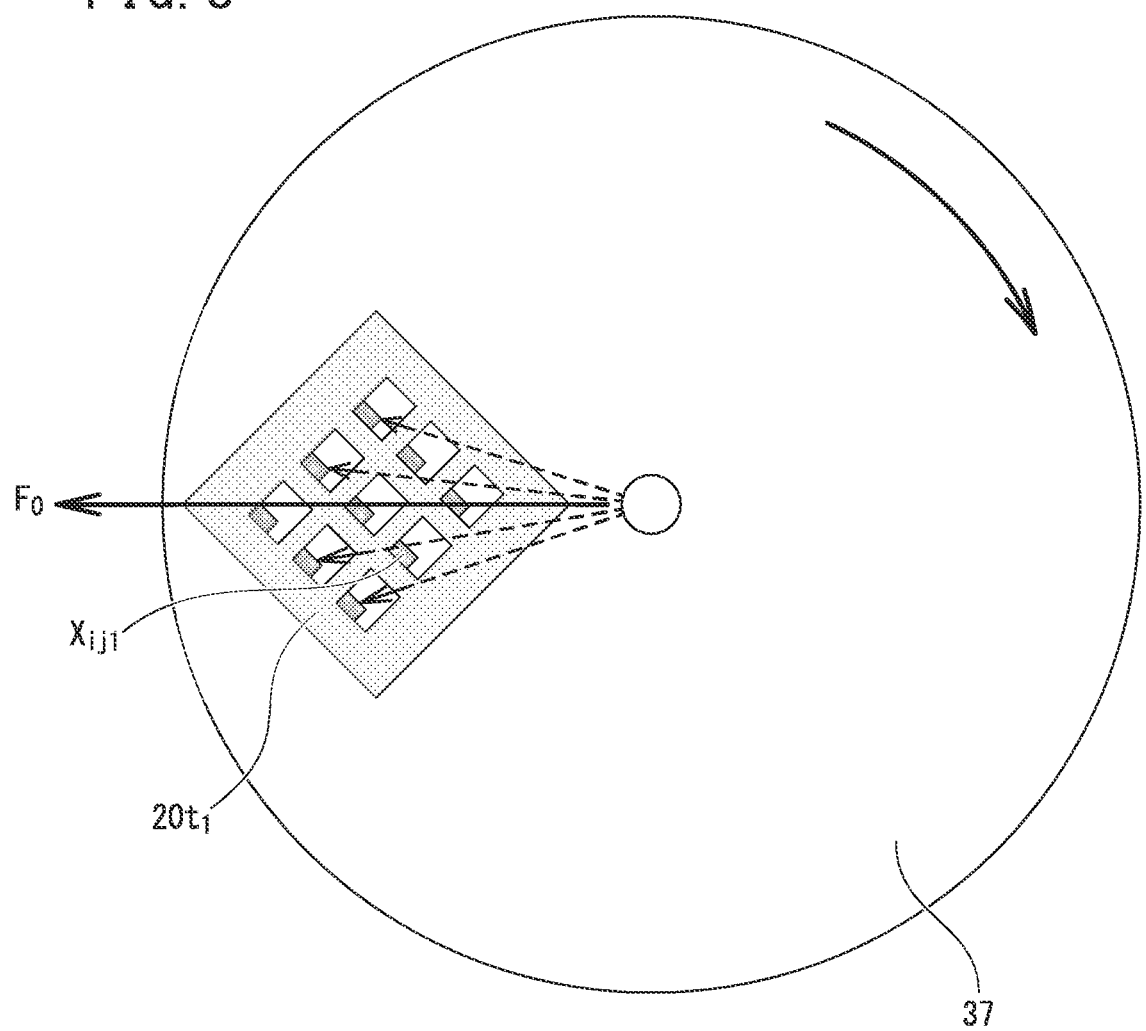
FIG. 8 is a schematic top view explaining a rough sketch of an apparatus employed by an alignment method pertaining to a third embodiment of the present invention.

Although the illustration is omitted in FIG. 8, an alignment-control apparatus pertaining to a third embodiment of the present invention is substantially similar to the alignment-control apparatuses of the first and second embodiments, in that the alignment-control apparatus pertaining to the third embodiment encompasses an alignment-assisting tray $20t_1$, a first transferring unit for collectively transporting many rectangular elements $X_{ij1}$, each of which having a rectangular-parallelepiped-shape and is roughly aligned to the corresponding concave cells of the alignment-assisting tray $20t_1$, a second transferring unit for collectively transporting the many rectangular elements $X_{ij1}$ after being precisely aligned as a batch in a highly-minute configuration by the alignment-assisting tray $20t_1$, a driving unit 50 for executing a rotational drive so that centrifugal forces $F_0$ can be applied to each of the concave cells of the alignment-assisting tray $20t_1$, respectively, and collectively aligning the rectangular elements $X_{ij1}$ in a highly minute-and-precise configuration, in which each of the rectangular elements $X_{ij1}$ are aligned with highly-accurate pitch, and a controlling circuit for controlling the operations of the first transferring unit, the second transferring unit and the driving unit 50, resembling the structure illustrated in FIG. 2 with regard to schematic configuration. However, the alignment-control apparatus pertaining to the third embodiment differs from the alignment-assisting trays 20a of the first and second embodiments in an architecture for moving each of the many rectangular elements $X_{ij1}$ by centrifugal forces $F_0$ toward the interfacing corners E of the alignment-assisting tray $20t_1$, and differs in a disc plate 37 and a driving unit 50 of the disc plate 37 for establishing the architecture which apply the centrifugal forces $F_0$ to the many rectangular elements $X_{ij1}$.

The alignment-assisting tray $20t_1$ pertaining to the third embodiment has the shape of a rectangle having the quadruple vertices A, B, C and D, resembling the structure of the perspective view illustrated in FIG. 3A. In addition, since the assignments of the vertices A, B, C and D are based upon the same nomenclature adapted to FIG. 3A, the labeling of A, B, C and D is omitted in FIG. 8. Also, the structural feature of the waffle shape illustrated in FIG. 3B such that at and in one of the main-surfaces of the rectangle, the rectangular concave cells are cut to be arranged in the shape of matrix is true of alignment-assisting tray $20t_1$ pertaining to the third embodiment, but as illustrated in FIG. 8, a plan view of the arrangement of the rectangular concave cells is simplified to a matrix of three-by-three. In actuality, the arrangement of the rectangular concave cells shall be represented as a matrix of 300×100, or a matrix of 3000×1000, or even more than the matrix of 3000×1000. A rectangular element representatively labelled with a leader line in FIG. 8 inclusively indicates one of the rectangular minute elements, which is elected as a representative among the many rectangular elements of the triple color categories, implemented by the red LED rectangular elements $X_{qpR}$, the green LED rectangular elements $X_{qpG}$ and the blue LED rectangular elements $X_{qpB}$ illustrated in FIGS. 1A to 1D. Then, the inclusive representation of the three-by-three matrix of the rectangular minute elements is the simplification of the arrangement implemented by 30,000 to 3,000,000 pieces, or more than 3,000,000 pieces of rectangular minute elements of the triple color categories in total, and therefore, a part of the arrangement elected as the representative pattern is illustrated. The design conditions required in the first and second embodiments such that each of the diagonal lengths of the concave cells, which are deployed in the alignment-assisting tray 20a, 20b viewed on the planar pattern, shall be longer by 50 percent or more than 50 percent of each of the diagonal lengths of the rectangular elements $X_{ij1}$ measured along the corresponding direction may be said of the design requirement for the alignment-assisting tray $20t_1$.

The process flows illustrated in FIGS. 5A to 5J explained in the alignment method of the first embodiment are identical with the alignment method pertaining to the third embodiment. However, according to the alignment method pertaining to the third embodiment, after a similar process step to the process step illustrated in FIG. 5J of the first embodiment, the alignment-assisting tray $20t_1$ is mounted on the disc plate 37 in such a way that the vertex A shall be located on the outermost circumference, and the vertex C located at a position in a diagonal direction from the vertex A shall be closest to a rotational center of the disc plate 37. An orientation to the vertex A from the vertex C is a radius direction of the disc plate 37. The vertex A of the rectangle defined in FIG. 3A is a point defined along the direction toward a position where the rectangular elements $X_{ij1}$ are moved to be interfaced with the corresponding interfacing corners E, respectively, as illustrated in FIG. 3B. When the alignment-assisting tray $20t_1$ is mounted on the disc plate 37 such that the vertex A shall be located on the outermost circumference and the vertex C shall be located closest to the rotational center of the disc plate 37, the positions of the vertices B and D will be set equidistant from the rotational center, which are about half radius of the disc plate 37. A groove having a same size and a same shape of the alignment-assisting tray $20t_1$ can be dug at and in the top surface of the disc plate 37 so that the alignment-assisting tray $20t_1$ is detachably fitted in the groove with a close tolerance fit, thereby the alignment-assisting tray $20t_1$ is designed not to be shifted by centrifugal force. Or, hooks may be provided at positions corresponding to the vertices A, B, C and D so that the alignment-assisting tray $20t_1$ is fixed by the hooks, thereby preventing the alignment-assisting tray $20t_1$ from being shifted by the centrifugal force. The alignment-assisting tray $20t_1$ may be fixed to the disc plate 37 by an adhering means and others, or the disc plate 37 and the alignment-assisting tray $20t_1$ may be integrally molded. As illustrated in FIG. 8, under a condition that the alignment-assisting tray $20t_1$ is mounted on the disc plate 37 in an orientation such that the vertex A shall be located at the position on the outermost circumference, and then, when the driving unit 50, whose illustration is omitted, rotates the disc plate 37, centrifugal forces $F_0$ toward circumferential directions are applied to each of the rectangular elements $X_{ij1}$. And therefore, the reallocating forces are acted to each of the MRTBMs, which is one of the convex-ridges elected from the quadruple convex-ridges defined by the quadruple side planes of the rectangular element $X_{ij1}$, the quadruple side planes implement a side surface of the element $X_{ij1}$, and each of the MRTBMs moves toward the counterpart interfacing ridge in the interfacing corner E. By the way, each of the concave cells cut in the alignment-assisting tray $20t_1$ establishes a rectangular space, which is defined by the quadruple sidewall-planes, similarly to the first embodiment, such that a couple of sidewall-planes adjacent to each other are orthogonal to each other, and each of the couple of adjacent sidewall-planes implements the quadruple convex-ridges, respectively.

After each of the rectangular elements $X_{ij1}$ is stored in each of the concave cells, the arrangement of the concave cells creating the matrix in the alignment-assisting tray $20t_1$ of waffle shape, the alignment-assisting tray $20t_1$ is mounted on the disc plate 37 so that the position of the vertex A of the alignment-assisting tray $20t_1$ lie on the outmost circumference, and the disc plate 37 is rotated from the rough arranged state illustrated in FIG. 5J. By driving a rotation, configured to give the centrifugal forces to the disc plate 37, each of the large number of 30,000 to 3,000,000 pieces, or more than 3,000,000 pieces of rectangular elements $X_{ij1}$ is moved to be interfaced with the interfacing corners E provided in each of the concave cells, and is aligned to each of the interfacing corners E. Although the effect of gravity has been used in the configurations illustrated in FIGS. 5K to 5N referred in the first embodiment, according to the alignment-control apparatus pertaining to the third embodiment, since the alignment-assisting tray $20t_1$ is rotated to generate the centrifugal forces, which will act on the alignment-assisting tray $20t_1$, the large number of rectangular elements $X_{ij1}$ can be precisely aligned as a batch, at identical pitch defined by the arrangement of the concave cells, which are deployed in the alignment-assisting tray $20t_1$. Because the process steps after the elements $X_{qpR}$ have been precisely aligned as a batch are substantially equal to the flow of the process steps already explained with reference to FIGS. 5O to 5R in the alignment method of the first embodiment, the duplicate explanation is omitted.

According to the alignment method pertaining to the third embodiment, via the highly minute-and-precise assembling technology of the large number of 30,000 to 3,000,000 pieces, or more than 3,000,000 pieces of rectangular elements $X_{ij1}$, the collective displacement of the large number of rectangular elements $X_{ij1}$ can be conducted with the high precision, by rotating the alignment-assisting tray $20t_1$ mounted on the disc plate 37. Thus, it is possible to establish the highly minute-and-precise assembling technology, which can perform the positional alignment with the high precision under the simple apparatus configuration, or alternatively, can execute the batch alignment that is excellent in two-dimensional pitch accuracy and high in spatial definition, without dropping the fabrication yield and the throughput. Also, according to the alignment-control apparatus and the alignment method pertaining to the third embodiment, the rectangular elements $X_{ij1}$ can be positionally aligned at once by using the alignment-assisting tray, and the production throughput is not reduced.

Variation of Third Embodiment

Figure 9:
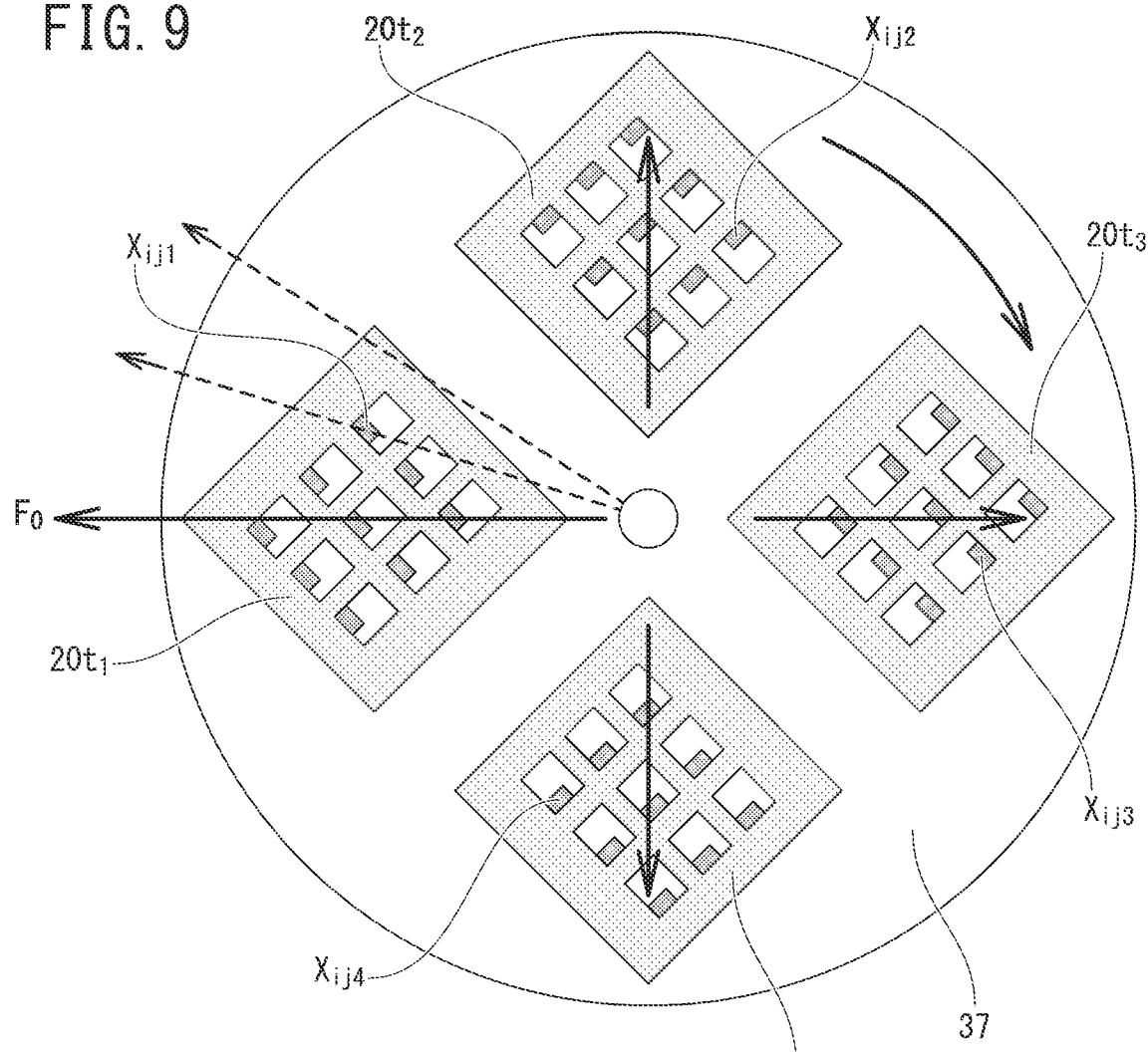
FIG. 9 is a schematic top view explaining a rough sketch of an apparatus employed by an alignment method pertaining to a variation of the third embodiment of the present invention.

Although the illustration is omitted in FIG. 9, resembling the structure illustrated in FIG. 2, an alignment-control apparatus pertaining to a variation of the third embodiment of the present invention encompasses quadruple alignment-assisting trays $20t_1$, $20t_2$, $20t_3$ and $20t_4$, a first transferring unit for collectively transporting rectangular elements $X_{ij1}$, $X_{ij2}$, $X_{ij3}$ and $X_{ij4}$ in turns, each of which having a rectangular-parallelepiped-shape, the rectangular elements $X_{ij1}$, $X_{ij2}$, $X_{ij3}$ and $X_{ij4}$ are roughly aligned, to the concave cells of the alignment-assisting trays $20t_1$, $20t_2$, $20t_3$ and $20t_4$, a second transferring unit for collectively transporting the rectangular elements $X_{ij1}$, $X_{ij2}$, $X_{ij3}$ and $X_{ij4}$ in turns, after being precisely aligned with a highly-minute-configuration as a batch, from the alignment-assisting trays $20t_1$, $20t_2$, $20t_3$ and $20t_4$, a driving unit 50 for driving the rotation of each of the quadruple alignment-assisting trays $20t_1$, $20t_2$, $20t_3$ and $20t_4$ simultaneously so that the centrifugal forces $F_0$ are applied to each of the quadruple alignment-assisting trays $20t_1$, $20t_2$, $20t_3$ and $20t_4$, and that collectively aligning the many rectangular elements $X_{ij1}$, $X_{ij2}$, $X_{ij3}$ and $X_{ij4}$ with highly minute-and-precise pitch, and a controlling circuit for controlling the operations of the first transferring unit, the second transferring unit and the driving unit 50. The feature of alignment-control apparatus pertaining to the variation of the third embodiment inheres in an architecture for providing the centrifugal forces $F_0$ to each of the quadruple alignment-assisting trays $20t_1$, $20t_2$, $20t_3$ and $20t_4$, configured to collectively align the many rectangular elements $X_{ij1}$, $X_{ij2}$, $X_{ij3}$ and $X_{ij4}$ with a highly-minute scheme. That is, the centrifugal forces $F_0$ provided to each of the quadruple alignment-assisting trays $20t_1$, $20t_2$, $20t_3$ and $20t_4$ displace the positions of the MRTBMs, each of the MRTBM is one of the convex-ridges elected as a representative portion among quadruple convex-ridges defined by side planes of each of the many rectangular elements $X_{ij1}$, $X_{ij2}$, $X_{ij3}$ and $X_{ij4}$, toward a corresponding interfacing ridge in an interfacing corner E, which is assigned to a counterpart concave cell cut in each of the alignment-assisting trays $20t_1$, $20t_2$, $20t_3$ and $20t_4$. And therefore, the alignment-control apparatus pertaining to the variation of the third embodiment further encompasses a disc plate 37 and a driving unit 50 of the disc plate 37 for generating the centrifugal forces $F_0$ in the architecture.

Each of the alignment-assisting trays $20t_1$, $20t_2$, $20t_3$ and $20t_4$ pertaining to the variation of the third embodiment has the shape of the rectangle, respectively, which embraces quadruple vertices A, B, C and D, resembling the structure of the perspective view illustrated in FIG. 3A. However, since the assignments of the vertices A, B, C and D are based upon the same nomenclature adapted to FIG. 3A, the labeling of A, B, C and D is omitted in FIG. 9. Also, the structural feature of waffle shape illustrated in FIG. 3B such that at and in one of the main-surfaces of the rectangle, a plurality of rectangular concave cells is cut and arranged in the shape of matrix is hold for the alignment-assisting trays $20t_1$, $20t_2$, $20t_3$ and $20t_4$ pertaining to the variation of the third embodiment, but the arrangement of the rectangular concave cells is schematically simplified as a matrix of three-by-three in the representation illustrated in FIG. 9. Actually, because each of the alignment-assisting trays $20t_1$, $20t_2$, $20t_3$ and $20t_4$ may be a matrix of 300×100, or a matrix of 3000×1000, or even more than the matrix of 3000×1000 as a single alignment-assisting tray, four times of 300×100 to 3000×1000 or more number of rectangular elements $X_{ij1}$, $X_{ij2}$, $X_{ij3}$ and $X_{ij4}$ can be stored in the entire of quadruple alignment-assisting trays $20t_1$, $20t_2$, $20t_3$ and $20t_4$. The rectangular elements $X_{ij1}$, $X_{ij2}$, $X_{ij3}$ and $X_{ij4}$ labelled with leader lines respectively in FIG. 9 inclusively indicate the many rectangular elements of the triple color categories implemented by the red LED rectangular elements $X_{qpR}$, the green LED rectangular elements $X_{qpG}$ and the blue LED rectangular elements $X_{qpB}$, which are illustrated in FIGS. 1A to 1D. However, the inclusive representation of the quadruple pieces of minute elements labeled specifically as $X_{ij1}$, $X_{ij2}$, $X_{ij3}$ and $X_{ij4}$ in FIG. 9 is simplified illustration among 120,000 to 12,000,000 pieces or more than 12,000,000 pieces of rectangular minute elements including the triple color categories in total, which shall be deployed in the quadruple alignment-assisting trays $20t_1$, $20t_2$, $20t_3$ and $20t_4$.

The process flows illustrated in FIGS. 5A to 5J in the alignment method of the first embodiment are identical with the alignment method pertaining to the variation of the third embodiment. However, according to the alignment method pertaining to the variation of the third embodiment after the process step illustrated in FIG. 5J, which has been referred in the first embodiment, as illustrated in FIG. 9, on the disc plate 37, the quadruple alignment-assisting trays $20t_1$, $20t_2$, $20t_3$ and $20t_4$ are evenly mounted on areas assigned to four quadrants so that each of the vertices A is located on the outermost circumference, and each of the vertices C, which is located at a position in the diagonal direction from the counterpart vertex A, is closest to a rotational center of the disc plate 37. An orientation from the vertex C of each of the quadruple alignment-assisting trays $20t_1$, $20t_2$, $20t_3$ and $20t_4$ to each of the vertices A is a radius direction of the disc plate 37. The vertex A defined in FIG. 3A is a point allocated in a direction along which each of the rectangular elements $X_{ij1}$, $X_{ij2}$, $X_{ij3}$ and $X_{ij4}$ is moved to be interfaced with the counterpart interfacing corners E illustrated in FIG. 3B. When the quadruple alignment-assisting trays $20t_1$, $20t_2$, $20t_3$ and $20t_4$ are evenly mounted on the disc plate 37 such that each of the vertices A is located on the outermost circumference and each of the vertices C is located closest to the rotational center of the disc plate 37, each of the vertices B and each of the vertices D will be set equidistant from the rotational center of the disc plate 37. The positions of each of the vertices B and each of the vertices D will be about half radius of the disc plate 37. And then, the alignment-assisting trays $20t_1$, $20t_2$, $20t_3$ and $20t_4$ can be arranged on the four quadrants divided in the disc plate 37, respectively.

On the disc plate 37, a mechanism for preventing the alignment-assisting trays $20t_1$, $20t_2$, $20t_3$ and $20t_4$ from being moved by centrifugal force can be provided. For example, as the mechanism for preventing the displacement of the alignment-assisting trays $20t_1$, $20t_2$, $20t_3$ and $20t_4$, quadruple grooves, each of the grooves having a same size and a same shape for installing the corresponding alignment-assisting tray $20t_1$, $20t_2$, $20t_3$ and $20t_4$, can be dug at and in the top surface of the disc plate 37 so that each of the alignment-assisting trays $20t_1$, $20t_2$, $20t_3$ and $20t_4$ can be detachably fitted in each of the counterpart grooves with a close tolerance fit. Or alternatively, the alignment-assisting trays $20t_1$, $20t_2$, $20t_3$ and $20t_4$ may be fixed to the top surface of the disc plate 37 by an adhering means and others, or the disc plate 37 and the alignment-assisting trays $20t_1$, $20t_2$, $20t_3$ and $20t_4$ may be integrally molded. As illustrated in FIG. 9, in an orientation in which the vertex A is located at a position on the outermost circumference, the alignment-assisting trays $20t_1$, $20t_2$, $20t_3$ and $20t_4$ are mounted on the four quadrants of the disc plate 37, respectively, and when a driving unit 50, whose illustration is omitted, rotates the disc plate 37, the centrifugal forces $F_0$ toward circumferential directions are applied to each of the rectangular elements $X_{ij1}$, $X_{ij2}$, $X_{ij3}$ and $X_{ij4}$, and each of the rectangular elements $X_{ij1}$, $X_{ij2}$, $X_{ij3}$ and $X_{ij4}$ is accordingly moved to the interfacing corners E, which are assigned to each of the alignment-assisting trays $20t_1$, $20t_2$, $20t_3$ and $20t_4$.

Therefore, from the rough arranged state illustrated in FIG. 5J, after each of the rectangular elements $X_{ij1}$, $X_{ij2}$, $X_{ij3}$ and $X_{ij4}$ has been stored in turns in each of the concave cells creating matrices of alignment-assisting trays $20t_1$, $20t_2$, $20t_3$ and $20t_4$ of waffle shape, the alignment-assisting trays $20t_1$, $20t_2$, $20t_3$ and $20t_4$ are evenly mounted on the disc plate 37 so that a position of the vertex A of each of the alignment-assisting trays $20t_1$, $20t_2$, $20t_3$ and $20t_4$ is always located on the outmost circumference, and the disc plate 37 is rotated. By driving the rotation for generating the centrifugal forces to the disc plate 37, each of the large number of 30,000 to 3,000,000 pieces, or more than 3,000,000 pieces of rectangular elements $X_{ij1}$, $X_{ij2}$, $X_{ij3}$ and $X_{ij4}$ is displaced to be interfaced with the interfacing corners E provided in each of the concave cells in each of the alignment-assisting trays $20t_1$, $20t_2$, $20t_3$ and $20t_4$, and therefore, is aligned to the interfacing corners E. In the alignment-control apparatus pertaining to the variation of the third embodiment, since the evenly-arranged quadruple alignment-assisting trays $20t_1$, $20t_2$, $20t_3$ and $20t_4$ are rotated simultaneously so as to make the centrifugal forces act on the alignment-assisting trays $20t_1$, $20t_2$, $20t_3$ and $20t_4$, the large number of rectangular elements $X_{ij1}$, $X_{ij2}$, $X_{ij3}$ and $X_{ij4}$ can be precisely aligned as a batch, at identical pitch defined by the arrangement of the concave cells in each of the alignment-assisting trays $20t_1$, $20t_2$, $20t_3$ and $20t_4$. The process steps after the rectangular elements $X_{ij1}$, $X_{ij2}$, $X_{ij3}$ and $X_{ij4}$ have been precisely aligned as a batch are substantially equal to the flow of the process steps already explained with reference to FIGS. 5O to 5R in the alignment method of the first embodiment, except the process step of collectively transporting the rectangular elements $X_{ij1}$, $X_{ij2}$, $X_{ij3}$ and $X_{ij4}$ in turns from each of the alignment-assisting trays $20t_1$, $20t_2$, $20t_3$ and $20t_4$. Thus, the duplicate explanation is omitted.

According to the alignment method pertaining to the variation of the third embodiment, via the highly minute-and-precise assembling technology of the large number of 120,000 to 12,000,000 pieces or more than 12,000,000 pieces of rectangular elements $X_{ij1}$, $X_{ij2}$, $X_{ij3}$ and $X_{ij4}$, the collective displacement of the large number of rectangular elements $X_{ij1}$, $X_{ij2}$, $X_{ij3}$ and $X_{ij4}$ can be conducted with the high precision, by rotating the quadruple alignment-assisting trays $20t_1$, $20t_2$, $20t_3$ and $20t_4$ mounted on the disc plate 37 simultaneously. Thus, it is possible to establish the highly minute-and-precise assembling technology, which can perform the positional alignment with the high precision, or can execute the batch alignment that is excellent in two-dimensional pitch accuracy and high in spatial definition, at four times of the throughput than the alignment method achieved by the third embodiment.

Fourth Embodiment

Figure 10:
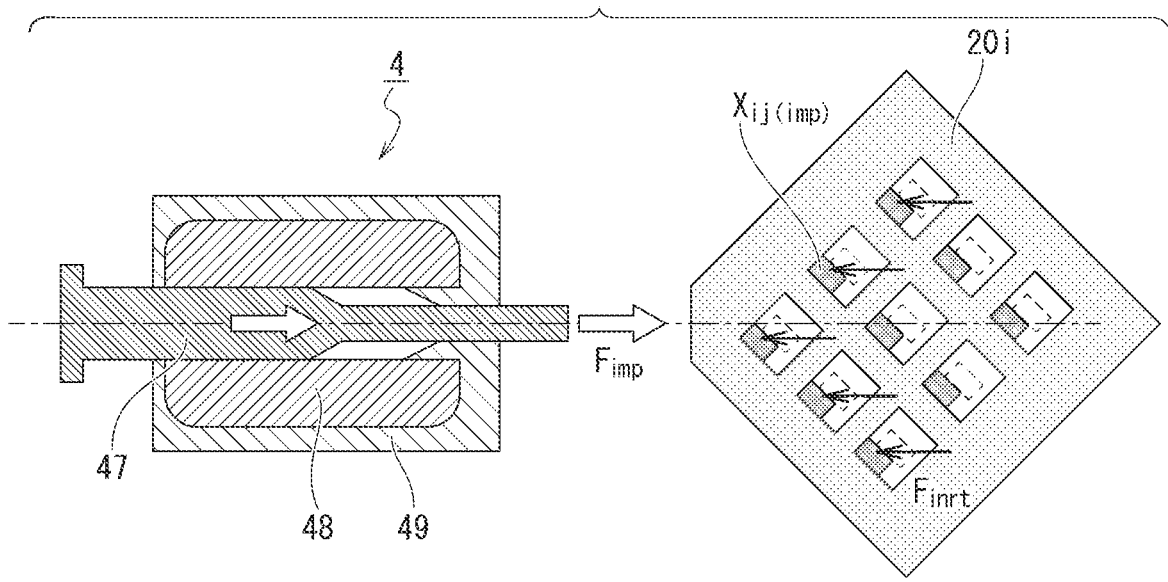
FIG. 10 are schematic top views explaining outlines of an alignment method pertaining to a fourth embodiment of the present invention.

Although the illustration is omitted in FIG. 10, resembling the structure illustrated in FIG. 2, an alignment-control apparatus pertaining to a fourth embodiment of the present invention is almost same as the alignment-control apparatuses of the first to third embodiments in a rough outline of configuration. That is, the features that the alignment-control apparatus pertaining to the fourth embodiment encompasses an alignment-assisting tray 20i, a first transferring unit for collectively transporting roughly-aligned rectangular elements $X_{ij(imp)}$ to the concave cells of the alignment-assisting tray 20i, a second transferring unit for collectively transporting the rectangular elements $X_{ij(imp)}$ from the alignment-assisting tray 20i, after being precisely aligned as a batch with a highly-minute configuration, a driving unit 50 for striking the alignment-assisting tray 20i so that impact forces $F_{imp}$ are applied to the concave cells of the alignment-assisting tray 20i, and causing inertial forces $F_{inrt}$ as a reaction of the impact forces $F_{imp}$ to be generated in each of the many rectangular elements $X_{ij(imp)}$, and reallocating each of the rectangular elements $X_{ij(imp)}$ and collectively aligning the rectangular elements $X_{ij(imp)}$ with a highly minute-and-precise pitch, and a controlling circuit for controlling the operations of the first transferring unit, the second transferring unit and the driving unit 50 is almost same as the alignment-control apparatuses of the first to third embodiments. However, the alignment-control apparatus pertaining to the fourth embodiment differs from the alignment-assisting trays 20a explained in the first to third embodiments, in an architecture for providing the impact forces $F_{imp}$ to the concave cells of the alignment-assisting tray 20i, in order to generate the inertial forces $F_{inrt}$ to reallocate MRTBMs toward corresponding interfacing ridges defined in each of interfacing corners E of the alignment-assisting tray 20i, each of the MRTBMs is one of the convex-ridges elected as a representative portion among quadruple convex-ridges created by quadruple side planes in each of the many rectangular elements $X_{ij(imp)}$. Furthermore, the alignment-control apparatus pertaining to the fourth embodiment differs from the alignment-control apparatuses explained in the first to third embodiments, in a feature that the alignment-control apparatus encompasses an impact force generator (driving unit) 4 for striking the vertex A of the alignment-assisting tray 20i, thereby establishing the architecture for providing the impact forces $F_{imp}$ to the concave cells of the alignment-assisting tray 20i. By the way, similarly to the first embodiment, in each of the concave cells of the alignment-assisting tray 20i, a rectangular space is encapsulated by quadruple sidewall-planes, and a couple of sidewall-planes adjacent to each other among the quadruple sidewall-planes is orthogonal to each other, and the couple of sidewall-planes defines each of the quadruple convex-ridges, respectively. Although the illustration is omitted, a guide or guides along which the alignment-assisting tray 20i can be moved in the same direction as the directions of the impact forces $F_{imp}$ may be provided on a table, which is supposed to mount the alignment-assisting tray 20i.

The impact force generator 4 illustrated in FIG. 10 encompasses a rod-shaped plunger 47 whose diameter of the tip portion is made thinner, an electromagnetic solenoid 48 surrounding a thicker cylindrical portion of the plunger 47, and a housing 49 that encapsulates the electromagnetic solenoid 48. The housing 49 has a through hole by which the plunger 47 can shuttle in and out. And accordingly, the impact force generator 4 implements the driving unit adapted for the alignment-control apparatus pertaining to the fourth embodiment. By supplying a current into the electromagnetic solenoid 48, the plunger 47 is impulsively moved in a right direction with an acceleration $\alpha_1$. Ignoring a frictional force between the alignment-assisting tray 20i and a table, on which the alignment-assisting tray 20i is mounted, the frictional force may be generated during the movement of the alignment-assisting tray 20i, the impact force $F_{imp}$ toward a right direction, which is supposed to be directed to the vertex A of the plunger 47, is represented by Eq. (3), $$F_{imp} = m_1 \alpha_1 \doteq m_2 \alpha_2 \qquad (3)$$

In Eq. (3), a mass of the plunger 47 is $m_1$, and all masses in which masses of the alignment-assisting tray 20i and all the rectangular elements $X_{ij(imp)}$ are summed is $m_2$, and an acceleration of a movement of the alignment-assisting tray 20i is $\alpha_2$.

A shift length $\Delta x$ of the alignment-assisting tray 20i is determined from the law of energy conservation, in which the mass $m_1$ and the mass $m_2$ and the movement distance of the plunger 47 at an instant of striking are considered. The shift length $\Delta x$ of the alignment-assisting tray 20i is preferred to be set to about the dimension of the rectangular elements $X_{ij(imp)}$, or alternatively, the shift length $\Delta x$ is preferred to be set to a value of displacement required for the alignment process of the rectangular elements $X_{ij(imp)}$. When a weight of each of the rectangular elements $X_{ij(imp)}$ is defined as W (kg) and the acceleration of the gravity is defined as g (m/s²), an apparent inertial force $F_{inrt}$ acting in a left direction of a single piece of rectangular element $X_{ij(imp)}$ can be represented by Eq. (4), by ignoring friction force acting on the rectangular element $X_{ij(imp)}$ and others.

$$F_{inrt} \doteq (w/g)\alpha_2 \qquad (4)$$

Although the alignment-assisting tray 20i pertaining to the fourth embodiment has the shape of a rectangle embracing quadruple vertices A, B, C and D, resembling the structure illustrated in FIG. 3A, the structure illustrated in FIG. 10 exemplifies a configuration in which one of the vertices is chamfered to a size having a diameter of a head of the plunger 47, in such a way that the vertex A can be easily hit by the plunger 47. However, the vertex A may implement a convex-ridge, where the side planes intersect each other at a right angle, without chamfering one of the vertices. In addition, since the assignments of the vertices A, B, C and D are based upon the same nomenclature adapted to FIG. 3A, the labeling of A, B, C and D is omitted in FIG. 10. Also, the structural feature of waffle shape illustrated in FIG. 3B such that at and in one of the main-surfaces of the rectangle, the rectangular concave cells are cut to be arranged in the shape of matrix is said of the alignment-assisting tray $20i$ pertaining to the fourth embodiment. However, as illustrated in FIG. 10, the rectangular concave cells are schematically simplified as a matrix of three-by-three. In actuality, the rectangular concave cells shall be deployed as a matrix of 300×100, or a matrix of 3000×1000, or even more than the matrix of 3000×1000. The rectangular element $X_{ij(imp)}$ representatively labelled with a leader line in FIG. 10 inclusively indicate one of the rectangular element elected among the many rectangular elements, which include the triple color categories, the triple color categories are implemented by the red LED rectangular elements $X_{qpR}$, the green LED rectangular elements $X_{qpG}$ and the blue LED rectangular elements $X_{qpB}$ illustrated in FIGS. 1A to 1D. However, the inclusive indication is a simplified sketch in which a single piece of rectangular element is selected and labelled as the representative rectangular minute element, among 30,000 to 3,000,000 pieces, or more than 3,000,000 pieces of rectangular minute elements including the triple color categories in total. The design requirement that each of the diagonal lengths of the concave cells, which are deployed in the alignment-assisting tray $20t_1$ viewed on the planar pattern, shall be longer by 50 percent or more than 50 percent of each of the diagonal lengths of the rectangular elements $X_{ij(imp)}$ measured along the corresponding direction is similar to the first to third embodiments.

Regarding the process flows illustrated in FIGS. 5A to 5J, the alignment method of the first embodiment is hold for the alignment method of the fourth embodiment. As explained in the first embodiment, according to the alignment method pertaining to the fourth embodiment, the rectangular elements $X_{ij(imp)}$ are stored in the inside of the concave cells creating the waffle shape of the alignment-assisting tray $20i$, similarly to the process flows illustrated in FIGS. 5I to 5J. And, as illustrated in FIG. 10, the orientation of the head of the plunger 47 in the impact force generator 4, which serves as the driving unit 50 implementing the alignment-control apparatus pertaining to the fourth embodiment, is made opposite to the vertex A of the alignment-assisting tray $20i$, after the process step which is the similar process step illustrated in FIG. 5J explained in the first embodiment. And, when the vertex A protruding to the left side of the alignment-assisting tray $20i$ is stroked by the head of the plunger 47, and the impact force $F_{imp}$ toward the right direction illustrated in FIG. 10 is applied as impulse, the inertial forces $F_{inrt}$ toward the left direction are made to act on each of the rectangular elements $X_{ij(imp)}$. According to the alignment-assisting tray $20i$ illustrated in FIG. 10, because the interfacing corners E illustrated in FIG. 3B are assigned to the positions directed toward the vertex A in each of the concave cells, when the inertial forces $F_{inrt}$ are applied to the rectangular elements $X_{ij(imp)}$, the MRTBMs assigned to each of the rectangular elements $X_{ij(imp)}$ are displaced toward the counterpart interfacing ridges in the interfacing corners E, which are assigned to each of the concave cells.

Accordingly, when the vertex A, which is assigned to the alignment-assisting tray $20i$, receives an inertial force $F_{inrt}$, the corresponding inertial forces $F_{inrt}$ along a reverse direction of the received inertial force $F_{inrt}$ are accordingly applied to each of the rectangular elements $X_{ij(imp)}$ as illustrated in FIG. 5J, and the MRTBMs assigned to each of the large number of 30,000 to 3,000,000 pieces, or more than 3,000,000 pieces of rectangular elements $X_{ij(imp)}$ are displaced to be interfaced with the corresponding interfacing ridges at the counterpart interfacing corners E provided in each of the concave cells. And therefore, the large number of rectangular elements $X_{ij(imp)}$ are aligned to the interfacing ridges, after the rectangular elements $X_{ij(imp)}$ have been roughly arranged in each of the concave cells, the concave cells are creating the matrix of the alignment-assisting tray $20i$ of waffle shape. Although the effect of gravity has been used in the configurations illustrated in FIGS. 5K to 5N referred in the first embodiment, according to the alignment-control apparatus of the fourth embodiment, the inertial forces $F_{inrt}$ are applied to the concave cells of the alignment-assisting tray $20i$, and the large number of rectangular elements $X_{ij(imp)}$ can be precisely aligned as a batch at identical pitch defined by the arrangement of the concave cells, which are deployed in the alignment-assisting tray $20i$, by striking the alignment-assisting tray $20i$ so that the inertial force $F_{inrt}$ can be applied to the alignment-assisting tray $20i$. The process steps after the rectangular elements $X_{ij(imp)}$ have been precisely aligned as a batch are substantially equal to the flow of the process steps already explained with reference to FIGS. 5O to 5R in the alignment method of the first embodiment. Thus, the duplicate explanation is omitted.

According to the alignment method pertaining to the fourth embodiment, it is possible to establish the highly minute-and-precise assembling technology, which can execute the positional alignment with the high precision under the simple apparatus configuration, or can execute the batch alignment that is excellent in two-dimensional pitch accuracy and high in spatial definition, without dropping the fabrication yield and the throughput, through the highly minute-and-precise assembling technology of the large number of 30,000 to 3,000,000 pieces, or more than 3,000, 000 pieces of rectangular elements $X_{ij(imp)}$. By the highly minute-and-precise assembling technology, the collective reallocations of the large number of rectangular elements $X_{ij(imp)}$ can be conducted with a highly accurate configuration, by giving the inertial forces $F_{inrt}$ to the concave cells of the alignment-assisting tray $20i$ so as to work the inertial forces $F_{inrt}$ on the large number of rectangular elements $X_{ij(imp)}$. Also, according to the alignment-assisting tray, the alignment-control apparatus and the alignment method pertaining to the fourth embodiment, 30,000 to 3,000,000 pieces, or more than 3,000,000 pieces of rectangular elements $X_{ij(imp)}$ can be positionally aligned at once without dropping the throughput.

Other Embodiment

As described above, the first to fourth embodiments of the present invention have been described, but because Specifications and Drawings implement a mere part of the disclosure of the present invention, and it should not be understood that Specifications and Drawings are intended to limit the scope of the present invention. Various alternative embodiments, examples and operational techniques will become apparent to those skilled in the art from the above disclosure. For example, the minute chips being addressed by the present invention are not limited to the LED chips explained in the first to fourth embodiments, and detector chips can be used. Looking like the classification of triple-color set of the red LED chips $X_{qpR}$, the green LED chips $X_{qpG}$ and the blue LED chips $X_{qpB}$, if a single pixel is built by a set of detector chips of various optical characteristics that are different in material, it is possible to manufacture an image sensor which can detect electromagnetic waves spanning from terahertz to ultraviolet band. Also, if micro lenses, micro mirrors or micro optical-filters are arrayed instead of the LED chips, it is possible to implement a micro lens array, a micro mirror array, or a micro filter array.

Figure 11:
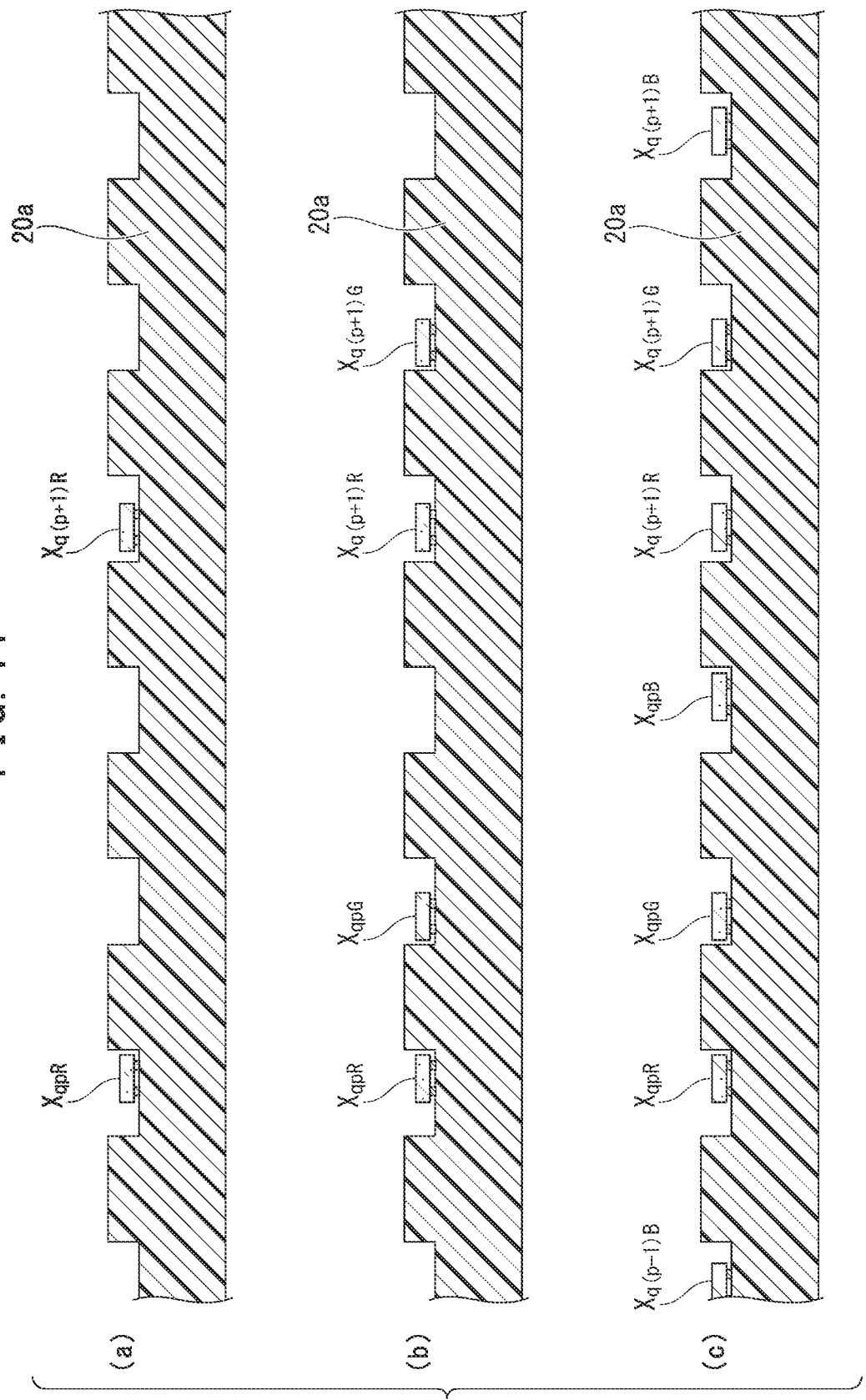
FIG. 11(a) to FIG. 11(c) are a set of process-flow cross-sectional views explaining a plurality of rectangular minute elements of triple color categories are interfaced sequentially in the concave cells of the alignment-assisting tray, such that the rectangular minute elements of different category are stored in a predetermined order, at three stages of (a) to (c), as an example of sequence of steps in a part of an alignment method pertaining to another embodiment.

For example, the red LED chips $X_{qpR}$, the green LED chips $X_{qpG}$ and the blue LED chips $X_{qpB}$ are arranged in the concave cells $22_{qpR}$, $22_{qpG}$ and $22_{qpB}$, respectively, which are deployed in the alignment-assisting tray $20a$ in a batch have been exemplified in the process flows illustrated in FIGS. 5A to 5J, the description is merely the exemplification. Instead of procedures illustrated in FIGS. 5A to 5J, the LED chips may be individually transported to the concave cells 22, which are deployed in the alignment-assisting tray $20a$ in triple divided periods, for example, as a divided period for transferring set of red LED chips $X_{qpR}$ and $X_{q(p+1)R}$ as illustrated in FIG. 11($a$), as another divided period for transferring set of green LED chips $X_{qpG}$ and $X_{q(p+1)G}$ as illustrated in FIG. 11($b$), and as a still another divided period for transferring set of blue LED chips $X_{q(p-1)B}$, $X_{qpB}$ and $X_{q(p+1)B}$ as illustrated in FIG. 11($c$). When the LED chips are separately transported in turns with the triple divided periods, for example, an elastomer-stamp transfer scheme, in which convex portions are implemented by PDMS, can be employed. In the elastomer-stamp transfer scheme, at first, in view of the pitch of the concave cells, which are deployed in the alignment-assisting tray $20a$, the number of red LED chips $X_{qpR}$ is decimated to be thinned out, and the decimated arrangement of the red LED chips $X_{qpR}$ are picked out. After picking out the red LED chips $X_{qpR}$, in view of the pitch of the concave cells, which are deployed in the alignment-assisting tray $20a$, the number of green LED chips $X_{qpG}$ is decimated to be thinned out by the elastomer-stamp transfer scheme, and the decimated arrangement of the green LED chips $X_{qpG}$ are picked out. Moreover, in view of the pitch of the concave cells, which are deployed in the alignment-assisting tray $20a$, the number of blue LED chips $X_{qpB}$ is decimated to be thinned out by the elastomer-stamp transfer scheme and the decimated arrangement of the blue LED chips are $X_{qpB}$ picked out. As mentioned above, it is possible to employ the various pickup schemes in addition to the elastomer-stamp transfer scheme. As to the process steps pertaining to the procedures illustrated in FIGS. 11($a$) to 11($c$), because the set of blue LED chips $X_{q(p-1)B}$ $X_{qpB}$ and $X_{q(p+1)B}$ may be firstly transported and arranged in the concave cells, which are deployed in the alignment-assisting tray $20a$, or alternatively, the set of green LED chips $X_{qpG}$ and $X_{q(p+1)G}$ may be firstly transported and arranged in the concave cells, which are deployed in the alignment-assisting tray $20a$. And therefore, the order of the process steps recited in FIGS. 11($a$) to 11($c$) does not matter.

The current micro-LED display has a problem that light intensities, central wavelengths and emission wavelength bands are varied. Since the characteristics of the LED chips used in the micro-LED display depend on the slight changes in film thicknesses at times of crystal growth, each of the light intensities of the LED chips, each of the central wavelengths and each of the emission wavelength bands are varied. Thus, in the earlier micro-LED display, in order to prevent the variations in color unevenness, the raw LED chips diced from chip areas on a wafer immediately after a manufacturing step is not directly mounted on a mounting board in its raw and original state. On the contrary, the diced LED chips are desired to be mounted on the mounting board after the raw diced LED chips have been shuffled one time, and then, the shuffled LED chips are mounted on the mounting board, and are electrically bonded to electrodes on the mounting board.

By using the alignment-assisting trays of the first to fourth embodiments, because it is possible to pick up the LED chips from any position on a plurality of wafers, by using laser lift-off scheme or Pick & Place scheme, and because it is possible to sequentially store the picked-up LED chips in any concave cells with time-division scheme, the concave cells are deployed in the alignment-assisting tray $20a$ as illustrated in FIG. 11, it is possible to achieve the same technical advantage as the shuffling of the LED chips. That is, variations in the characteristics of a plurality of actual LED chips can be quantified, for example, if each light intensity is quantified by "l", each central wavelength is quantified by "m" and each light-emission wavelength is quantified by "n", l×m×n pieces of "classifications (l, m and n)" of the actual LED chips are created. For example, when the classifications (l, m and n) are 50 pieces, 50 LED chips are sequentially stored as illustrated in FIG. 11, in such a way that with 50 concave cells as one block, all of the 50 LED chips differing from each other in characteristics are stored respectively in 50 concave cells of the one block, it is possible to reduce the variations in the light intensity, the central wavelength and the widths of light-emission wavelength more than the scheme of shuffling. In a configuration that many concave cells are desired to be integrated into a single block, it is preferable to use the technical ideas of the alignment-assisting trays disclosed in the first to fourth embodiments. At a present conventional level of technology, although a batch alignment of ultra-minute elements, each of which has one side length of 30 micrometers or less, is generally considered to be difficult. However, it is possible to collectively align such ultra-minute elements, by using the technical ideas of the alignment-assisting trays disclosed in the first to fourth embodiments. And, it is preferable to reduce the size of the one block, in which many concave cells are integrated, by using the technical ideas of the alignment-assisting trays disclosed in the first to fourth embodiments. Thus, by collectively aligning the ultra-minute elements, each of which has one side length of 30 micrometers or less, it is possible to achieve extremely excellent technical advantages as an ultra-minute precise assembling technology, without color unevenness.

At the beginning of the present Specification, the "minute element" is defined to mean the element embracing a particular function, which has so minute size that it difficult to collectively mount and assemble many elements simultaneously. However, at a constructing procedure of a large display equipment such as an outdoor display equipment, for example, there is a situation that many elements, each of which having a chip diagonal length exceeding 150 micrometers, are scheduled to be collectively mounted simultaneously. Regarding a semiconductor chip, in which a chip diagonal length exceeds 150 micrometers, in a situation in which many elements, whose number is 10,000 to 20,000 pieces or more than 20,000 pieces, are collectively handled to improve a throughput, a size of each semiconductor chip can be construed as "a minute element", with regard to the relative comparison to a size of a large display equipment. Thus, the concept of "the minute element" defined at the beginning of the present Specification can be suitably construed as "the element" in the present invention, even in semiconductor chips used in a technique for mounting, assembling and constructing the large display equipment. In a more comprehensive definition, "the element" in the present invention means an element in a set of physical members, each of physical members has a specific function, and the number of physical members and physical size reach to a level that makes it difficult to collectively handle a great many physical members as a batch. When a large display equipment is assembled, as a result, a huge alignment-assisting tray embracing about the same size as the large display equipment shall be used.

Figure 12:
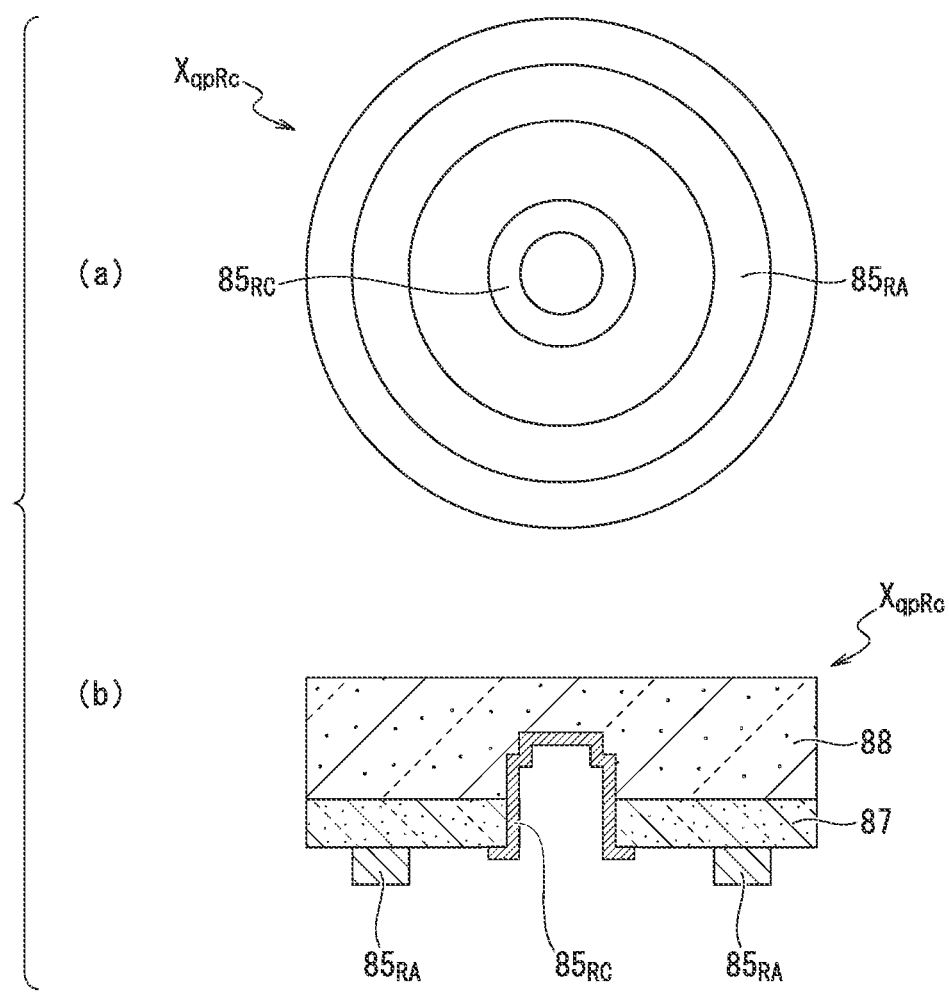
FIG. 12 is a schematic view explaining a conceptual outline of a structure of a circular LED, which has a structure such that electrodes of LED have degrees of freedom under rotational symmetry, suitable for an alignment method pertaining to another embodiment.

According to the alignment method of the second embodiment, it has been explained that, in the presence of the rotational degrees of freedom due to the solid shapes such as a polygonal prism or a cylindrical shape, by cutting the recess $23_{qpRT}$, it is possible to accurately control both pattern position of the anode electrode $82_{RA}$ or cathode electrode $82_{RC}$ and orientation direction of the anode electrode $82_{RA}$ or cathode electrode $82_{RC}$. However, as illustrated in FIG. 12, in a topology of a non-rectangular element $X_{qpRc}$ in which a planar pattern of an anode electrode $85_{RA}$ or cathode electrode $85_{RC}$ is rotationally symmetric, even if the rotational degrees of freedom exist in the non-rectangular element $X_{qpRc}$ having a shape of polygonal prism or cylindrical shape, by interfacing the non-rectangular elements $X_{qpRc}$ with corresponding corners of counterpart concave cells in an alignment-assisting tray 20s as illustrated in FIG. 13(b), it is possible to mount and assemble the non-rectangular element $X_{qpRc}$, by accurately aligning the positions of the non-rectangular elements $X_{qpRc}$ with bumps of a targeted mounting board. Although the illustration is omitted, in a situation that each of the non-rectangular elements is a hexagonal or octagonal prism, if patterns of the anode electrodes and the cathode electrodes are hexagonal or octagonal rotational symmetric, each of the patterns of the anode electrodes and the cathode electrodes is not limited to an annular continuous pattern, and may be a discontinuous periodic pattern. In addition, FIG. 12(b) illustrates a simplified schematic representation of the non-rectangular element $X_{qpRc}$, while FIG. 12(b) is a cross-sectional view taken along a diameter passing through a center of a plan view illustrated in FIG. 12(a). That is, as illustrated in FIG. 12(b), a cylindrical semiconductor substrate of the non-rectangular element $X_{qpRc}$ is simplified as a double-layer structure composed of a layer 87 and a layer 88. However, FIG. 12 is merely a schematic view explaining a conceptual structure as the LED in the shape of the non-rectangular element $X_{qpRc}$. The structure of the semiconductor portion representing the main region of the non-rectangular element $X_{qpRc}$ is really a complex multi-layered cylindrical structure, which may encompass a double hetero-structure implemented by multicomponent compound semiconductor layers, whose compositions and mole fractions differ from each other. However, the illustration of the detailed multi-layered cylindrical structure as well as the insulating film on the semiconductor portion and others are omitted.

FIG. 13(a) illustrates a state in which cylindrical non-rectangular elements $X_{qpRc}$ are roughly arranged in the concave cells cut in the alignment-assisting tray 20s. In FIG. 13(a), the concave cells cut in the alignment-assisting tray 20s are schematically illustrated as a matrix of four by four. In actuality, the arrangement of the concave cells cut in the alignment-assisting tray 20s shall be represented as a matrix of 300×100, or a matrix of 3000×1000, or even more than the matrix of 3000×1000. For example, when the inclination of the alignment-assisting tray 20s is returned to horizontal state as illustrated in FIG. 13(b), after the reallocating forces by the component forces of the gravity, which are ascribable to the double-axial rocking-drive illustrated in FIGS. 5K and 5L, or to the single-axial rocking-drive illustrated in FIG. 5M, are applied to the non-rectangular elements $X_{qpRc}$, each of the MRTBMs assigned to each of the non-rectangular elements $X_{qpRc}$ is interfaced with a corresponding interfacing corner defined in each of the counterpart concave cells. When the shape of the non-rectangular element $X_{qpRc}$ is cylindrical, inside each of the concave cells, which are deployed in the alignment-assisting tray 20s, one of generatrices on the side surface of the non-rectangular element $X_{qpRc}$ is inscribed on a vertical sidewall-plane extending along an X-axis direction of the counterpart concave cell, the concave cells are deployed in the alignment-assisting tray 20s, and the other one of the generatrices is inscribed on another vertical sidewall-plane of the counterpart concave cell, the another vertical sidewall-plane extending along a Y-axis direction. In a state in which the non-rectangular element $X_{qpRc}$ is moved to be interfaced with the interfacing corner, a side surface of the non-rectangular element $X_{qpRc}$ and a couple of vertical sidewall-planes of the counterpart concave cell implement a space, when the non-rectangular element $X_{qpRc}$ is cylindrical. And therefore, "a MRTBM" is defined as a localized portion of the side surface of the non-rectangular element $X_{qpRc}$ exposing to the space encapsulated by the side surface of the non-rectangular element $X_{qpRc}$ and the couple of vertical sidewall-planes of the counterpart concave cell. Namely, the space is surrounded by the two inscribed generatrices and the concave-ridge, being assigned to the interfacing corner. Therefore, in the condition that the non-rectangular element $X_{qpRc}$ is cylindrical or polygonal-prism-shaped, the MRTBM is selected from a localized portion of a side surface, which defines the contour of the solid shape as the non-rectangular element $X_{qpRc}$, wherein the localized portion of the non-rectangular element $X_{qpRc}$ being close to the interfacing ridge.

Even if the effect of the component forces in the gravity is employed as illustrated in FIGS. 5K to 5M, even if the effect of the centrifugal forces explained in the third embodiment is employed, or even if the effect of the impact forces explained in the fourth embodiment is employed, the roughly-aligned non-rectangular elements $X_{qpRc}$ illustrated in FIG. 13(a) can be reallocated as a batch to be precisely aligned at identical pitch defined by the arrangement of the interfacing corners of the concave cells, which are deployed in the alignment-assisting tray 20s. In a case of the non-rectangular element $X_{qpRc}$, if a planar pattern of electrodes, which are scheduled to be connected to the mounting board of the non-rectangular element $X_{qpRc}$, is rotationally symmetric or symmetric close to rotationally symmetric, the non-rectangular element $X_{qpRc}$ may be freely rotated in the alignment-assisting tray 20s. Thus, in a situation that the non-rectangular element $X_{qpRc}$ is used, as illustrated in FIG. 13, if the size of the concave cell, which are deployed in the alignment-assisting tray 20s is made large, it is possible to easily insert the non-rectangular element $X_{qpRc}$. For example, in the first to fourth embodiments, the examples are explained in which each of the diagonal lengths of the concave cells, which are deployed in the alignment-assisting tray viewed on the planar pattern, shall be longer by 50 percent or more than 50 percent of each of the diagonal lengths of the rectangular elements measured along the corresponding direction. However, when the non-rectangular elements $X_{qpRc}$ are used, the diagonal lengths of each of the concave cells may be designed to be longer by 80 percent to 100 percent or more than 100 percent of the diagonal length of the non-rectangular elements $X_{qpRc}$. That is, for the non-rectangular elements $X_{qpRc}$, in a process for storing the many non-rectangular elements $X_{qpRc}$ in each of the counterpart concave cells, which are deployed in the alignment-assisting tray 20s, even if alignment errors with the concave cells are great, because the size of the concave cells is large, the position alignment with the concave cells become possible, and therefore, the employment of the non-rectangular elements $X_{qpRc}$ can achieve an effectiveness of improving the throughput, which is a profitable and advantageous effectiveness compared with the case of the rectangular elements.

Also, the respective technical ideas explained in the first to fourth embodiments can be properly combined with each other as reasonably possible. For example, the structure of the alignment-assisting tray 20c having the inverted truncated pyramidal recess $23_{qpRV}$, explained by referring to FIG. 7 in the variation of the second embodiment, may be used as the alignment-assisting tray $20t_1$ for the third embodiment, or may be used as the alignment-assisting tray 20i for the fourth embodiment. In addition, as a matter of course, the present invention shall include various subject matters in which the respective features explained in the first to fourth embodiments are arbitrarily applied, or alternatively, the present invention shall include various embodiments which are not described here. Therefore, the technical scope of the present invention is determined only by the "technical features specifying the invention" construed from the scope of claims, if the determined technical feature that can be interpreted and construed from the claims is appropriate from the above contents of description.

The present invention is suitable for industrial fields in which a request of collectively handling a large number of 10,000 to 20,000 pieces or more than 20,000 pieces of elements, and accordingly, the present invention is suitable for industrial fields, in which a request is generated for improving a throughput in the handling process of the large number of elements. For example, the present invention is suitable for the manufacturing of next generation displays, such as a large display equipment of an outdoor display equipment, an augmented reality (AR) glass, or a display device for a portable telephone, which requires a highly minute-and-precise assembling technology for mounting a great many LED chips with high precision.

What is claimed is:

1. An alignment-assisting tray comprising a plurality of concave cells for storing a plurality of minute elements, respectively and individually, each of the plurality of minute elements has quadruple flat side planes, in which adjacent side planes of the quadruple flat side planes intersect each other at a right angle,
   wherein the plurality of concave cells are arrayed in accordance with a layout of locations where the plurality of elements are scheduled to be mounted on a mounting board, respectively,
   a space is provided in each of the plurality of concave cells for installing each of the plurality of minute elements, such that each of the plurality of minute elements is surrounded by quadruple sidewall-planes of each of the plurality of concave cells, each of quadruple sidewall-planes is prepared to be mated with a counterpart side surface in one of a corresponding element among the plurality of minute elements, and
   each of the diagonal lengths of the plurality of concave cells viewed on a planar pattern is longer by 50 percent or more than 50 percent of a diagonal length of each of the plurality of minute elements in a corresponding direction of the diagonal lengths of the plurality of concave cells, and
   a set of the flat side planes adjacent to each other implements a moving ridge-to-be-mated in each of the plurality of minute elements, respectively, the moving ridge-to-be-mated is a convex-ridge closest to a counterpart interfacing ridge, the counterpart interfacing ridge is implemented by a specific set of the adjacent quadruple sidewall-planes, the moving ridge-to-be-mated is elected among quadruple convex-ridges in each of the plurality of minute elements, and each of the moving ridge-to-be-mated is scheduled to be moved toward the counterpart interfacing ridge.

2. An alignment-control apparatus, comprising:
   an alignment-assisting tray including a plurality of concave cells for storing a plurality of minute elements, respectively and individually, each of the plurality of minute elements has quadruple flat side planes, in which adjacent side planes of the quadruple flat side planes intersect each other at a right angle, wherein the plurality of concave cells is arrayed in accordance with a layout of locations where the plurality of minute elements are scheduled to be mounted on a mounting board, respectively;
   a first transferring unit for collectively transporting the plurality of elements to the concave cells of the alignment-assisting tray;
   a driving unit for driving a motion of the alignment-assisting tray in such a way that a force for reallocating a moving ridge-to-be-mated of each of the plurality of elements toward an interfacing ridge assigned to each of the plurality of concave cells; and
   a second transferring unit for picking up the plurality of minute elements from the alignment-assisting tray and collectively transporting the plurality of minute elements to an external of the alignment-assisting tray,
   wherein the interfacing ridge is elected from a specific set of adjacent quadruple convex-ridges implemented by sidewall planes the flat side planes of each of the plurality of concave cells, and a moving ridge-to-be-mated is a convex-ridge selected from quadruple convex-ridges, each of the quadruple convex-ridges is created by the set of the flat side planes that are adjacent to one another side planes defining a solid shape of each of the plurality of elements, as a closest convex-ridge to the interfacing ridge,
   each of the diagonal lengths of the plurality of concave cell viewed on a planar pattern is longer by 50 percent or more than 50 percent of each of the diagonal lengths of each of the plurality of minute element in a corresponding direction of the diagonal lengths of the plurality of concave cells.

* * * * *